United States Patent
He et al.

(10) Patent No.: US 10,803,286 B2
(45) Date of Patent: Oct. 13, 2020

(54) UNDER-SCREEN OPTICAL FINGERPRINT SENSOR BASED ON OPTICAL IMAGING WITH AN OPTICAL AXIS OFF-NORMAL TO THE DISPLAY SCREEN SURFACE

(71) Applicant: Shenzhen Goodix Technology Co., Ltd., Shenzhen (CN)

(72) Inventors: Yi He, San Diego, CA (US); Bo Pi, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 72 days.

(21) Appl. No.: 16/190,138

(22) Filed: Nov. 13, 2018

(65) Prior Publication Data

US 2020/0034596 A1    Jan. 30, 2020

Related U.S. Application Data

(60) Provisional application No. 62/703,432, filed on Jul. 25, 2018.

(51) Int. Cl.
*G06K 9/00* (2006.01)
*H01L 27/146* (2006.01)

(52) U.S. Cl.
CPC ....... *G06K 9/0004* (2013.01); *G06K 9/00046* (2013.01); *H01L 27/14627* (2013.01); *H01L 27/14678* (2013.01)

(58) Field of Classification Search
CPC ........ G06F 3/042; G06K 9/0004; G02B 6/005
See application file for complete search history.

(56) References Cited

U.S. PATENT DOCUMENTS

2017/0270342 A1* 9/2017 He ..................... G06F 3/042
2018/0322325 A1* 11/2018 Lee .................... G02B 6/005

FOREIGN PATENT DOCUMENTS

CN     204028936 U    12/2014
CN     106022324 A    10/2016
(Continued)

OTHER PUBLICATIONS

International Search Report dated Oct. 17, 2019 in the corresponding international application (application No. PCT/CN2019/097160).

*Primary Examiner* — Myron Wyche
(74) *Attorney, Agent, or Firm* — Kilpatrick Townsend & Stockton LLP

(57) ABSTRACT

An optical fingerprint sensor module includes a light source configured to provide illumination light directed toward a finger. A portion of the illumination light may be scattered or reflected off of the finger, thereby generating signal light. The optical fingerprint sensor module further includes a photodiode array that has a surface, a member defining a pinhole configured to receive and transmit the signal light, and a lens positioned adjacent the pinhole and configured to focus the signal light transmitted through the pinhole onto the surface of the photodiode array. An optical axis of the lens forms an angle with respect to a normal of the surface of the photodiode array that is between 45 degrees and 135 degrees. The optical fingerprint sensor module further includes electronic circuitries configured to process the electrical signals generated by the photodiode array to produce an image of a fingerprint pattern of the finger.

31 Claims, 37 Drawing Sheets

(56) References Cited

FOREIGN PATENT DOCUMENTS

| | | | |
|---|---|---|---|
| CN | 106228147 | A | 12/2016 |
| CN | 108009500 | A | 5/2018 |
| WO | 2017211152 | A1 | 12/2017 |

* cited by examiner

- 423- Display assembly
- 431- Enhanced cover glass
- 433- LCD display module
- 445, 447- Touching finger
- 613- Illumination light zone
- 615- Effective fingerprint Sensing zone
- 436- Optical sensor light source 524- Bottom layers
431- Cover glass
433- LCD Display module
60- Finger tissues
61- Finger skin ridge
63- Finger skin valley
201, 202- illumination light beams
205, 206- Cover glass reflected light 524- Bottom layers
431- Cover glass
433- Display module
60- Finger tissues
61- Finger skin ridge
63- Finger skin valley
211, 212- Illumination light beams
213, 214- Cover glass total reflected light 423- Display assembly
431- Enhanced cover glass
433- LCD display module
445, 447- Touching finger
613- Illumination light zone
615- Effective sensing zone
617- Spacer
619- Color coating
621- Micro lens
623- Photodiode array 431- Enhanced cover glass
433- LCD display module
435- Circuits
613- Viewing zone
615- Effective sensing zone
618- Spacer with low RI
619- Color coating
621- Micro lens
623- Photodiode array
625- Detection axis 431- Enhanced cover glass
433- LCD display module
433b- LCD display module bottom
435- Circuits
613- Viewing zone
615- Effective sensing zone
618, 618b- Spacer with low RI
618c- Filling material
619, 619b- Color coating
621- Micro lens
623- Photodiode array
625- Detection axis 431- Enhanced cover glass
433- LCD display module
433b- LCD display module bottom
435- Circuits
613- Viewing zone
614- Extra light sources
615- Effective sensing zone
618, 618b- Spacer with low RI
618c- Filling material
619, 619b- Color coating
621- Micro lens
623- Photodiode array
625- Detection axis

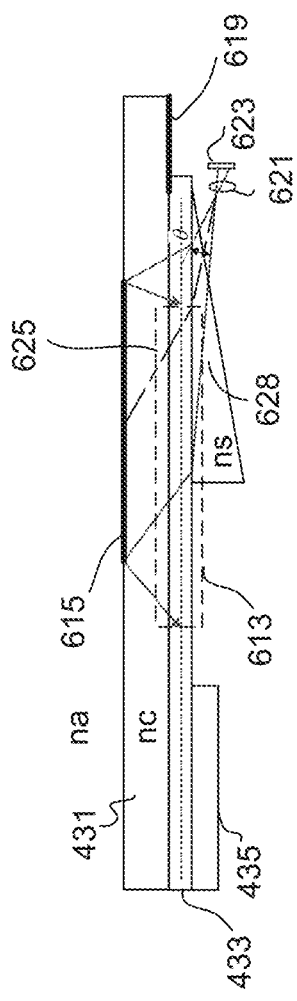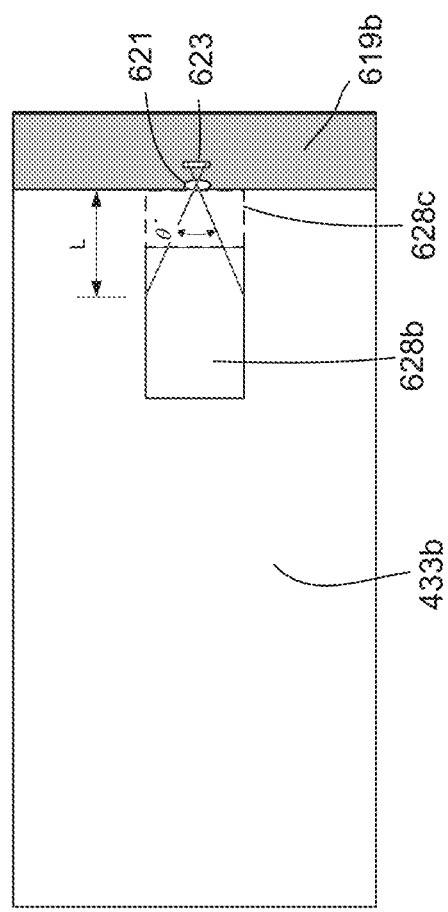
FIG. 10A
FIG. 10B
431- Enhanced cover glass
433- LCD display module
433b- LCD display module bottom
435- Circuits
615- Effective sensing zone
628, 628b- Spacer with low RI
628c- Filling material
619, 619b- Color coating
621- Micro lens
623- Photodiode array
625- Detection axis 4621e- Micro lens
4621f- Pinhole substrate
4621g- Pinhole layer for forming the pinhole 4643
4621h- Spacer
4621i- Additional diffuser
4623e- Photodiode array
4623f- FPC etc.
4623g- Protection material
436a- Extra light sources 4447- Touching finger
4620- Sensor module
4661- Under cover glass light sources
4661a- Incident light beams
4661b- Signal light scattered by finger tissues
436- Extra light sources

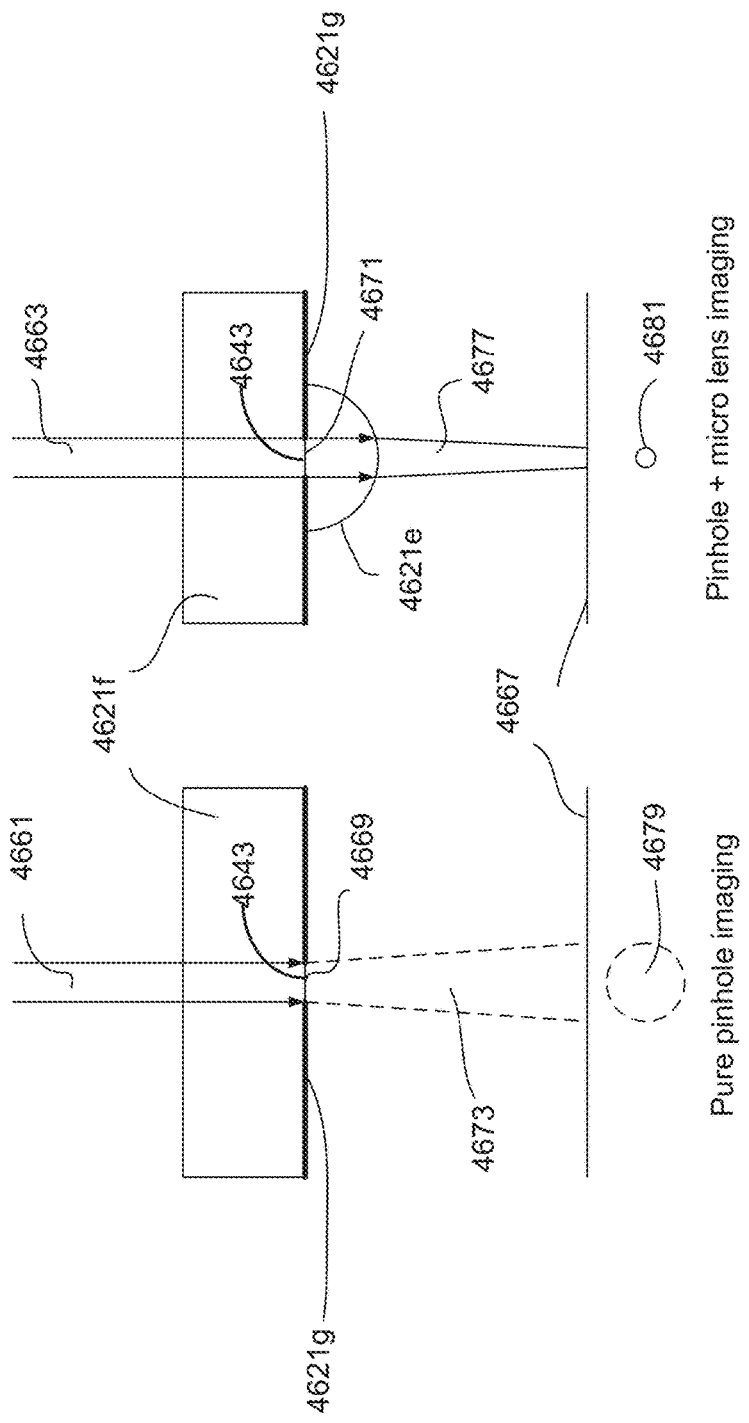

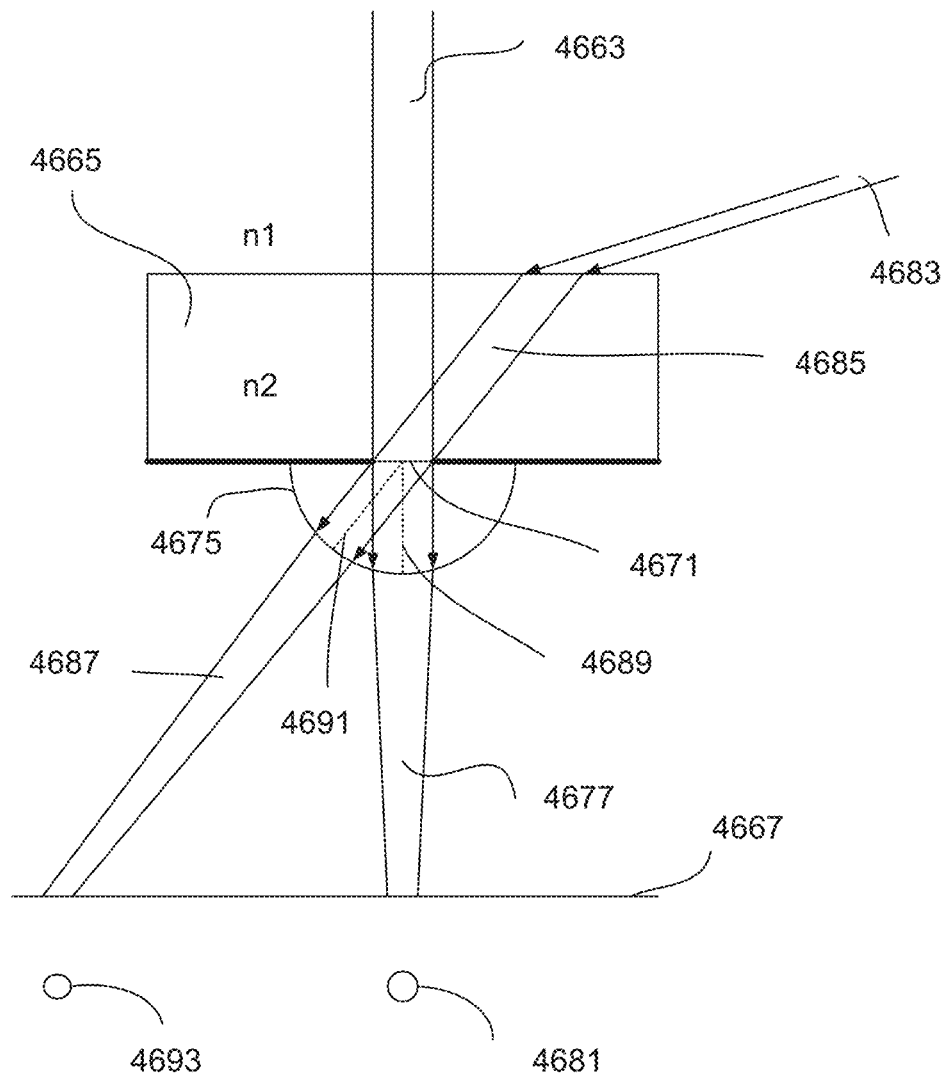

4663- Light beam from an object
4665- Substrate of the pinhole
4667- Image plane
4671- Pinhole
4675- Micro lens
4677- Converging light beam
4681- Image spot of a pinhole + micro lens
4683- Light beam with large incident angle
4685- Refracted light beam of a beam with large incident angle
4687- Converging light beam of a beam with large incident angle
4689, 4691- Axis of the micro lens
4693- Light spot of a light beam with large incident angle
n1- Refractive index of the media above the pinhole substrate
n2- Refractive index of the pinhole substrate

FIG. 22

Transmission modification filter

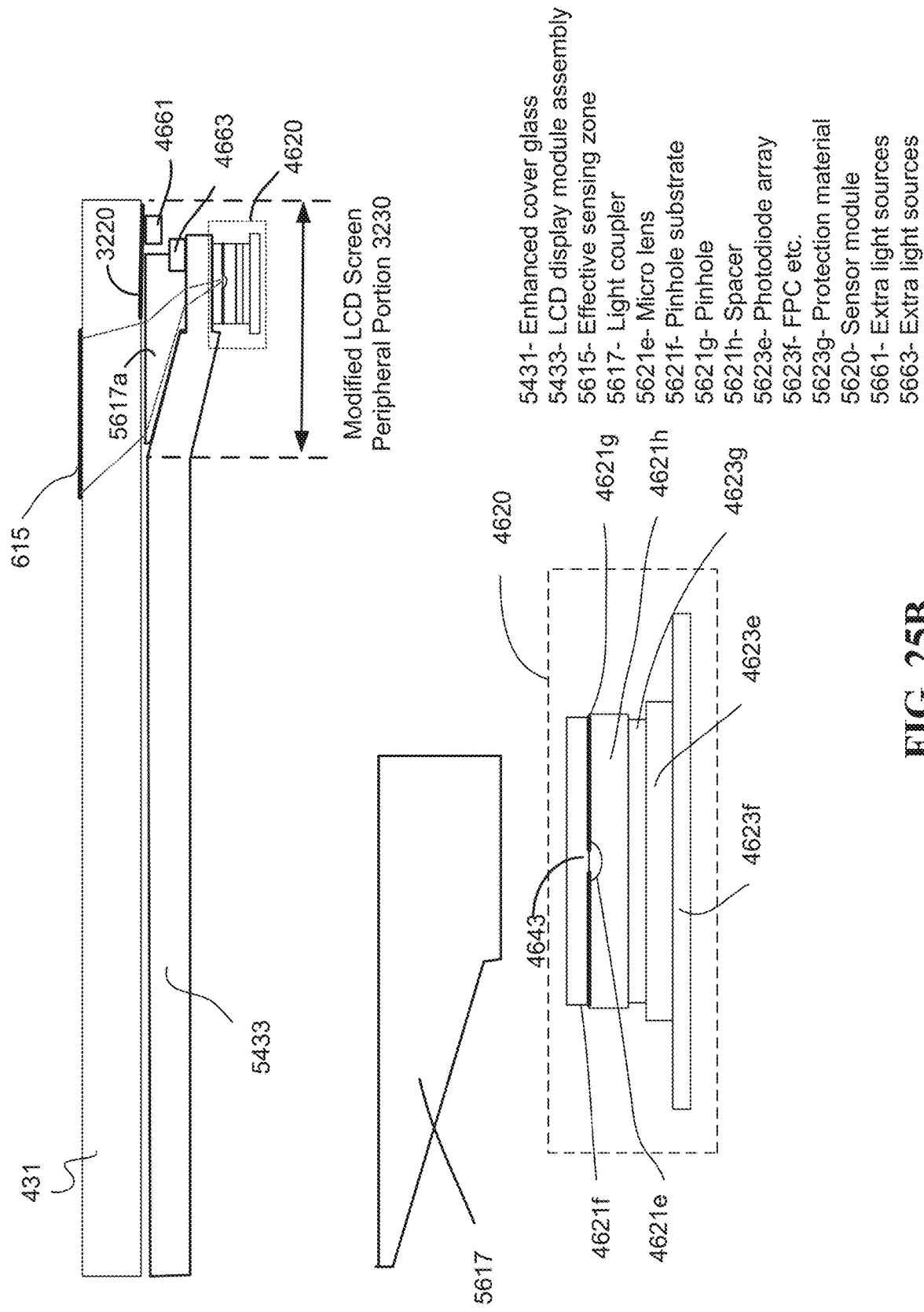

6000- Sensor module
6002- Liquid crystal display (LCD) module
6003- Cover glass
6004- LCD Backlighting assembly
6005- Sensing zone
6006- Opaque zone
6008- Extra light sources
6009- Extra light sources
6010/6012 – Signal light 6000- Optical sensor module
6008- Extra light sources
6009- Extra light sources
6610- Touching finger
6620- Incident light beams
6630- Light from other light sources
6640- Signal light scattered by finger tissues
6650- Signal light scattered by finger tissues

UNDER-SCREEN OPTICAL FINGERPRINT SENSOR BASED ON OPTICAL IMAGING WITH AN OPTICAL AXIS OFF-NORMAL TO THE DISPLAY SCREEN SURFACE

CROSS-REFERENCES TO RELATED APPLICATIONS

This application claims the benefit of U.S. Provisional Patent Application No. 62/703,432, filed on Jul. 25, 2018, the content of which is incorporated by reference in its entirety.

TECHNICAL FIELD

This disclosure relates to sensing of fingerprints and performing one or more sensing operations of other parameter measurements in electronic devices or systems, including portable computing devices such as mobile devices, wearable devices, and larger systems.

BACKGROUND

Various sensors can be implemented in electronic devices or systems to provide certain desired functions. A sensor that enables user authentication is one example of sensors to protect personal data and prevent unauthorized access in various devices and systems including portable or mobile computing devices (e.g., laptops, tablets, smartphones), gaming systems, various databases, information systems or larger computer-controlled systems.

User authentication on an electronic device or system can be carried out through one or multiple forms of biometric identifiers, which can be used alone or in addition to conventional password authentication methods. A popular form of biometric identifiers is a person's fingerprint pattern. A fingerprint sensor can be built into the electronic device to read a user's fingerprint pattern so that the device can only be unlocked by an authorized user of the device through authentication of the authorized user's fingerprint pattern. Another example of sensors for electronic devices or systems is a biomedical sensor that detects a biological property of a user, e.g., a property of a user's blood, the heartbeat, in wearable devices like wrist band devices or watches. In general, different sensors can be provided in electronic devices to achieve different sensing operations and functions.

Fingerprints can be used to authenticate users for accessing electronic devices, computer-controlled systems, electronic databases or information systems, either used as a stand-alone authentication method or in combination with one or more other authentication methods such as a password authentication method. For example, electronic devices including portable or mobile computing devices, such as laptops, tablets, smartphones, and gaming systems can employ user authentication mechanisms to protect personal data and prevent unauthorized access. In another example, a computer or a computer-controlled device or system for an organization or enterprise should be secured to allow only authorized personnel to access in order to protect the information or the use of the device or system for the organization or enterprise. The information stored in portable devices and computer-controlled databases, devices or systems, may be personal in nature, such as personal contacts or phonebook, personal photos, personal health information or other personal information, or confidential information for proprietary use by an organization or enterprise, such as business financial information, employee data, trade secrets and other proprietary information. If the security of the access to the electronic device or system is compromised, these data may be accessed by others, causing loss of privacy of individuals or loss of valuable confidential information. Beyond security of information, securing access to computers and computer-controlled devices or systems also allow safeguard the use of devices or systems that are controlled by computers or computer processors such as computer-controlled automobiles and other systems such as ATMs.

Secured access to a device (e.g., a mobile device) or a system (e.g., an electronic database and a computer-controlled system) can be achieved in different ways such as the use of user passwords. A password, however, may be easily to be spread or obtained and this nature of passwords can reduce the level of the security of passwords. Moreover, since a user needs to remember a password in accessing password-protected electronic devices or systems, in the event that the user forgets the password, the user needs to undertake certain password recovery procedures to get authenticated or otherwise to regain the access to the device or system. Such processes may be burdensome to users and have various practical limitations and inconveniences. The personal fingerprint identification can be utilized to achieve the user authentication for enhancing the data security while mitigating certain undesired effects associated with passwords.

Electronic devices or systems, including portable or mobile computing devices, may employ user authentication through one or multiple forms of biometric identifiers to protect personal or other confidential data and prevent unauthorized access. A biometric identifier can be used alone or in combination with a password authentication method to provide user authentication. One form of biometric identifiers is a person's fingerprint pattern. A fingerprint sensor can be built into an electronic device or an information system to read a user's fingerprint pattern so that the device can only be unlocked by an authorized user of the device through authentication of the authorized user's fingerprint pattern.

SUMMARY

According to some embodiments, an optical fingerprint sensor module includes a light source configured to provide illumination light directed toward a finger. A portion of the illumination light may be scattered or reflected off of the finger, thereby generating signal light. The optical fingerprint sensor module further includes a photodiode array that has a surface, a member defining a pinhole configured to receive and transmit the signal light, and a lens positioned adjacent the pinhole and configured to focus the signal light transmitted through the pinhole onto the surface of the photodiode array. An optical axis of the lens forms an angle with respect to a normal of the surface of the photodiode array that is between 45 degrees and 135 degrees. The photodiode array is configured to convert the signal light incident thereon into electrical signals. The optical fingerprint sensor module further includes electronic circuitries electrically coupled to the photodiode array and configured to process the electrical signals to produce an image of a fingerprint pattern of the finger.

According to some embodiments, an optical fingerprint sensor module includes a light source configured to provide illumination light directed toward a finger. A portion of the illumination light may be scattered or reflected off of the finger, thereby generating signal light. The optical fingerprint sensor module further includes a photodiode array having a surface, a member defining a pinhole, a mirror disposed in front of the pinhole and configured to receive and reflect the signal light toward the pinhole, and a lens positioned adjacent the pinhole and configured to focus the signal light that passes through the pinhole onto the surface of the photodiode array. An optical axis of the lens forms an angle with respect to a normal of the surface of the photodiode array that is between 45 degrees and 135 degrees. The photodiode array is configured to convert the signal light incident thereon into electrical signals. The optical fingerprint sensor module further includes electronic circuitries electrically coupled to the photodiode array and configured to process the electrical signals to produce an image of a fingerprint pattern of the finger.

According to some embodiments, an optical fingerprint sensor module to be disposed under an opaque border of a display screen for detecting a fingerprint pattern of a finger placed adjacent a fingerprint sensing area of the display screen includes a photodiode array having a surface, a pinhole configured to receive and transmit signal light scattered or reflected off of the finger and transmitted through the display screen, and a lens positioned adjacent the pinhole and configured to focus the signal light transmitted through the pinhole onto the surface of the photodiode array. An optical axis of the lens forms an angle with respect to a normal of the surface of the photodiode array that is between 45 degrees and 135 degrees. The optical fingerprint sensor module further includes electronic circuitries electrically coupled to the photodiode array. The photodiode array is configured to convert the signal light incident thereon into electrical signals. The electronic circuitries are configured to process the electrical signals to produce an image of a fingerprint pattern of the finger.

According to some embodiments, an electronic device includes a display screen including a fingerprint sensing area and an opaque border, and a light source configured to provide illumination light directed toward a finger placed adjacent the fingerprint sensing area. A portion of the illumination light may be scattered or reflected by the finger, thereby generating signal light to be transmitted through the display screen. The electronic device further includes an optical fingerprint sensor module positioned below the display screen under the opaque border. The optical fingerprint sensor module includes a photodiode array having a surface, a pinhole configured to receive and transmit the signal light, and a lens positioned adjacent the pinhole and configured to focus the signal light transmitted through the pinhole onto the surface of the photodiode array. An optical axis of the lens forms an angle with respect to a normal of the surface of the photodiode array that is between 45 degrees and 135 degrees. The optical fingerprint sensor module further includes electronic circuitries electrically coupled to the photodiode array. The photodiode array is configured to convert the signal light incident thereon into electrical signals. The electronic circuitries are configured to process the electrical signals to produce an image of a fingerprint pattern of the finger.

According to some embodiments, an electronic device includes a display screen that includes a fingerprint sensing area and an opaque border. The electronic device may further include a light source configured to provide illumination light directed toward a finger placed adjacent the fingerprint sensing area. A portion of the illumination light may be scattered or reflected by the finger, thereby generating signal light to be transmitted through the display screen. The electronic device further includes an optical fingerprint sensor module positioned below the display screen under the opaque border. The optical fingerprint sensor module may include a photodiode array that has a surface substantially parallel to the display screen and disposed adjacent the display screen, a pinhole substrate, and a pinhole formed on the pinhole substrate. The optical fingerprint sensor module may further include a prism positioned in front of the pinhole. The prism has a first surface, a second surface, and a third surface. The first surface may be configured to receive and transmit the signal light transmitted through the display screen. The second surface may be configured to reflect the signal light transmitted through the first surface. The third surface may be configured to transmit and refract the signal light reflected by the second surface toward the pinhole. The optical fingerprint sensor module may further include a lens positioned adjacent the pinhole, and configured to focus the signal light that passes through the pinhole onto the surface of the photodiode array. An optical axis of the lens forms an angle with respect to a normal of the surface of the photodiode array that is between 45 degrees and 135 degrees. The photodiode array is configured to convert the signal light incident thereon into electrical signals. The optical fingerprint sensor module may further include electronic circuitries electrically coupled to the photodiode array and configured to process the electrical signals to produce an image of a fingerprint pattern of the finger.

BRIEF DESCRIPTION OF THE DRAWINGS

FIGS. 6A-6C, 7, 8A-8B, 9, and 10A-10B illustrate example designs of under-screen optical fingerprint sensor modules according to some embodiments.

FIGS. 17-23 illustrate examples and operations of an under-display screen optical fingerprint sensor module based on a pinhole-lens assembly according to some embodiments.

FIGS. 24A-24B, 25A-25C, and 26 illustrate examples of an invisible under-display screen optical fingerprint sensor module using an optical coupler according to some embodiments.

DETAILED DESCRIPTION

Figure 1:
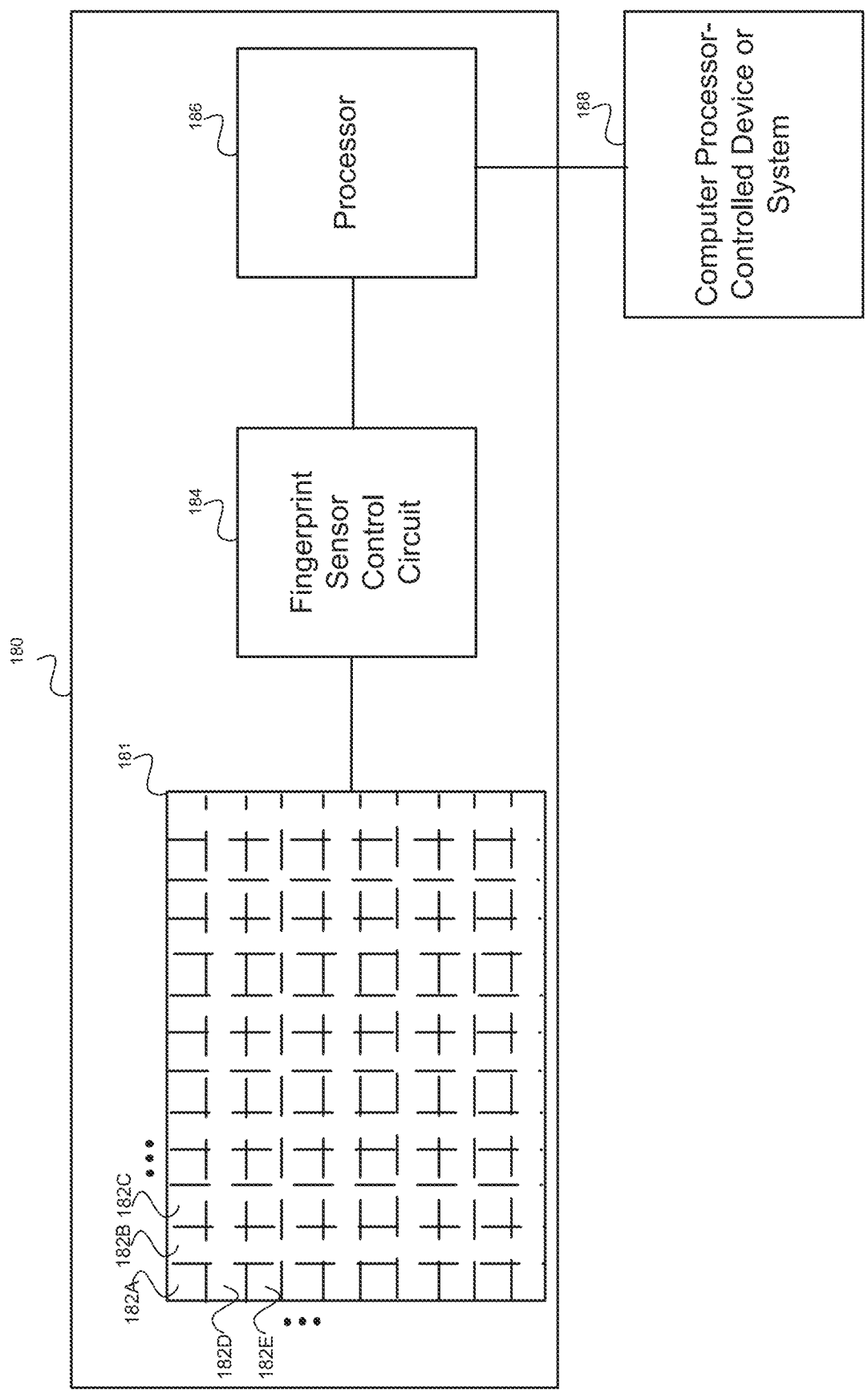
FIG. 1 is a block diagram of an example of a system with a fingerprint sensing module which can be implemented to include an optical fingerprint sensor according to some embodiments.

Electronic devices or systems may be equipped with fingerprint authentication mechanisms to improve the security for accessing the devices. Such electronic devices or system may include, portable or mobile computing devices, e.g., smartphones, tablet computers, wrist-worn devices and other wearable or portable devices, larger electronic devices or systems, e.g., personal computers in portable forms or desktop forms, ATMs, various terminals to various electronic systems, databases, or information systems for commercial or governmental uses, motorized transportation systems including automobiles, boats, trains, aircraft and others.

Fingerprint sensing is useful in mobile applications and other applications that use or require secure access. For example, fingerprint sensing can be used to provide secure access to a mobile device and secure financial transactions including online purchases. It is desirable to include robust and reliable fingerprint sensing suitable for mobile devices and other applications. In mobile, portable or wearable devices, it is desirable for fingerprint sensors to minimize or eliminate the footprint for fingerprint sensing given the limited space on those devices, especially considering the demands for a maximum display area on a given device. Many implementations of capacitive fingerprint sensors must be implemented on the top surface of a device due to the near-field interaction requirement of capacitive sensing.

Optical sensing modules can be designed to mitigate the above and other limitations in the capacitive fingerprint sensors and to achieve additional technical advantages. For example, in implementing an optical fingerprint sensing device, the light carrying fingerprint imagining information can be directed over distance to an optical detector array of optical detectors for detecting the fingerprint without being limited to the near-field sensing in a capacitive sensor. In particular, light carrying fingerprint imagining information can be directed to transmit through the top cover glass commonly used in many display screens such as touch sensing screens and other structures and may be directed through folded or complex optical paths to reach the optical detector array, thus allowing for flexibility in placing an optical fingerprint sensor in a device that is not available for a capacitive fingerprint sensor. Optical fingerprint sensor modules based on the technologies disclosure herein can be an under-screen optical fingerprint sensor module that is placed below a display screen to capture and detect light from a finger placed on or above the top sensing surface of the screen. As disclosed herein, optical sensing can also be used to, in addition to detecting and sensing a fingerprint pattern, optically detect other parameters associated with a user or a user action, such as whether a detected fingerprint is from a finger of a live person and to provide anti-spoofing mechanism, or certain biological parameters of the user.

I. Overview of Under-Display Optical Sensing Modules

The optical sensing technology and examples of implementations described in this disclosure provide an optical fingerprint sensor module that uses, at least in part, the light from a display screen as the illumination probe light to illuminate a fingerprint sensing area on the touch sensing surface of the display screen to perform one or more sensing operations based on optical sensing of such light. A suitable display screen for implementing the disclosed optical sensor technology can be based on various display technologies or configurations, including, a liquid crystal display (LCD) screen using a backlight to provide white light illumination to the LCD pixels and matched optical filters to effectuate colored LCD pixels, or a display screen having light emitting display pixels without using backlight where each individual pixel generates light for forming a display image on the screen such as an organic light emitting diode (OLED) display screens, or electroluminescent display screens. The specific examples provided below are directed to integration of under-screen optical sensing modules with LCD screens and thus contain certain technical details associated with LCD screens although various aspects of the disclosed technology are applicable to OLED screens and other display screens.

A portion of the light produced by a display screen for displaying images necessarily passes through the top surface of the display screen in order to be viewed by a user. A finger in touch with or near the top surface interacts with the light at the top surface to cause the reflected or scattered light at the surface area of the touch to carry spatial image information of the finger. Such reflected or scattered light carrying the spatial image information of the finger returns to the display panel underneath the top surface. In touch sensing display devices, for example, the top surface is the touch sensing interface with the user and this interaction between the light for displaying images and the user finger or hand constantly occurs but such information-carrying light returning back to the display panel is largely wasted and is not used in various touch sensing devices. In various mobile or portable devices with touch sensing displays and fingerprint sensing functions, a fingerprint sensor tends to be a separate device from the display screen, either placed on the same surface of the display screen at a location outside the display screen area such as in some models of Apple iPhones and Samsung smartphones, or placed on the backside of a smartphone, such as some models of smart phones by Huawei, Lenovo, Xiaomi or Google, to avoid taking up valuable space for placing a large display screen on the front side. Those fingerprint sensors are separate devices from the display screens and thus need to be compact to save space for the display screens and other functions while still providing reliable and fast fingerprint sensing with a spatial image resolution above a certain acceptable level. However, the need to be compact and small for designing a fingerprint sensor and the need to provide a high spatial image resolution in capturing a fingerprint pattern are in direct conflict with each other in many fingerprint sensors because a high spatial image resolution in capturing a fingerprint pattern in based on various suitable fingerprint sensing technologies (e.g., capacitive touch sensing or optical imaging) requires a large sensor area with a large number of sensing pixels.

The sensor technology and examples of implementations of the sensor technology described in this disclosure provide an optical fingerprint sensor module that uses, at least in part, the light from a display screen as the illumination probe light to illuminate a fingerprint sensing area on the touch sensing surface of the display screen to perform one or more sensing operations based on optical sensing of such light in some implementations, or designated illumination or probe light for optical sensing from one or more designated illumination light sources separate from the display light for optical sensing in other implementations, or background light for optical sensing in certain implementations.

In the disclosed examples for integrating an optical sensing module to a LCD screen based on the disclosed optical sensor technology, the under LCD optical sensor can be used to detect a portion of the light that is used for displaying images in a LCD screen where such a portion of the light for the display screen may be the scattered light, reflected light or some stray light. For example, in some implementations, the image light of the LCD screen based on backlighting may be reflected or scattered back into the LCD display screen as returned light when encountering an object such as a user finger or palm, or a user pointer device like a stylus. Such returned light can be captured for performing one or more optical sensing operations using the disclosed optical sensor technology. Due to the use of the light from LCD screen for optical sensing, an optical fingerprint sensor module based on the disclosed optical sensor technology is specially designed to be integrated to the LCD display screen in a way that maintains the display operations and functions of the LCD display screen without interference while providing optical sensing operations and functions to enhance overall functionality, device integration and user experience of an electronic device or system such as a smart phone, a tablet, or a mobile/wearable device.

In addition, in various implementations of the disclosed optical sensing technology, one or more designated probe light sources may be provided to produce additional illumination probe light for the optical sensing operations by the under-LCD screen optical sensing module. In such applications, the light from the backlighting of the LCD screen and the probe light from the one or more designated probe light sources collectively form the illumination light for optical sensing operations.

Regarding the additional optical sensing functions beyond fingerprint detection, the optical sensing may be used to measure other parameters. For example, the disclosed optical sensor technology can measure a pattern of a palm of a person given the large touch area available over the entire LCD display screen (in contrast, some designated fingerprint sensors such as the fingerprint senor in the home button of Apple's iPhone/iPad devices have a rather small and designated off-screen fingerprint sensing area that is highly limited in the sensing area size that may not be suitable for sensing large patterns). For yet another example, the disclosed optical sensor technology can be used not only to use optical sensing to capture and detect a pattern of a finger or palm that is associated with a person, but also to use optical sensing or other sensing mechanisms to detect whether the captured or detected pattern of a fingerprint or palm is from a live person's hand by a "live finger" detection mechanism, which may be based on, for example, the different optical absorption behaviors of the blood at different optical wavelengths, the fact that a live person's finger tends to be moving or stretching due to the person's natural movement or motion (either intended or unintended) or pulsing when the blood flows through the person's body in connection with the heartbeat. In one implementation, the optical fingerprint sensor module can detect a change in the returned light from a finger or palm due to the heartbeat/blood flow change and thus to detect whether there is a live heartbeat in the object presented as a finger or palm. The user authentication can be based on the combination of the both the optical sensing of the fingerprint/palm pattern and the positive determination of the presence of a live person to enhance the access control. For yet another example, the optical fingerprint sensor module may include a sensing function for measuring a glucose level or a degree of oxygen saturation based on optical sensing in the returned light from a finger or palm. As yet another example, as a person touches the LCD display screen, a change in the touching force can be reflected in one or more ways, including fingerprint pattern deforming, a change in the contacting area between the finger and the screen surface, fingerprint ridge widening, or a change in the blood flow dynamics. Those and other changes can be measured by optical sensing based on the disclosed optical sensor technology and can be used to calculate the touch force. This touch force sensing can be used to add more functions to the optical fingerprint sensor module beyond the fingerprint sensing.

With respect to useful operations or control features in connection with the touch sensing aspect of the LCD display screen, the disclosed optical sensor technology can provide triggering functions or additional functions based on one or more sensing results from the optical fingerprint sensor module to perform certain operations in connection with the touch sensing control over the LCD display screen. For example, the optical property of a finger skin (e.g., the index of refraction) tends to be different from other artificial objects. Based on this, the optical fingerprint sensor module may be designed to selectively receive and detect returned light that is caused by a finger in touch with the surface of the LCD display screen while returned light caused by other objects would not be detected by the optical fingerprint sensor module. This object-selective optical detection can be used to provide useful user controls by touch sensing, such as waking up the smartphone or device only by a touch via a person's finger or palm while touches by other objects would not cause the device to wake up for energy efficient operations and to prolong the battery use. This operation can be implemented by a control based on the output of the optical fingerprint sensor module to control the waking up circuitry operation of the LCD display screen which, the LCD pixels are put in a "sleep" mode by being turned off (and the LCD backlighting is also turned off) while one or more illumination light sources (e.g., LEDs) for the under- LCD panel optical fingerprint sensor module are turned on in a flash mode to intermittently emit flash light to the screen surface for sensing any touch by a person's finger or palm. Under this design, the optical fingerprint sensor module operates the one or more illumination light sources to produce the "sleep" mode wake-up sensing light flashes so that the optical fingerprint sensor module can detect returned light of such wake-up sensing light caused by the finger touch on the LCD display screen and, upon a positive detection, the LCD backlighting and the LCD display screen are turned on or "woken up". In some implementations, the wake-up sensing light can be in the infrared invisible spectral range so a user will not experience any visual of a flash light. The LCD display screen operation can be controlled to provide an improved fingerprint sensing by eliminating background light for optical sensing of the fingerprint. In one implementation, for example, each display scan frame generates a frame of fingerprint signals. If, two frames of fingerprint signals with the display are generated in one frame when the LCD display screen is turned on and in the other frame when the LCD display screen is turned off, the subtraction between those two frames of signals can be used to reduce the ambient background light influence. By operating the fingerprint sensing frame rate is at one half of the display frame rate in some implementations, the background light noise in fingerprint sensing can be reduced.

An optical fingerprint sensor module based on the disclosed optical sensor technology can be coupled to the backside of the LCD display screen without requiring creation of a designated area on the surface side of the LCD display screen that would occupy a valuable device surface real estate in some electronic devices such as a smartphone, a tablet or a wearable device. This aspect of the disclosed technology can be used to provide certain advantages or benefits in both device designs and product integration or manufacturing.

In some implementations, an optical fingerprint sensor module based on the disclosed optical sensor technology can be configured as a non-invasive module that can be easily integrated to a display screen without requiring changing the design of the LCD display screen for providing a desired optical sensing function such as fingerprint sensing. In this regard, an optical fingerprint sensor module based on the disclosed optical sensor technology can be independent from the design of a particular LCD display screen design due to the nature of the optical fingerprint sensor module: the optical sensing of such an optical fingerprint sensor module is by detecting the light that is emitted by the one or more illumination light sources of the optical fingerprint sensor module and is returned from the top surface of the display area, and the disclosed optical fingerprint sensor module is coupled to the backside of the LCD display screen as a under-screen optical fingerprint sensor module for receiving the returned light from the top surface of the display area and thus does not require a special sensing port or sensing area that is separate from the display screen area. Accordingly, such an under-screen optical fingerprint sensor module can be used to combine with a LCD display screen to provide optical fingerprint sensing and other sensor functions on an LCD display screen without using a specially designed LCD display screen with hardware especially designed for providing such optical sensing. This aspect of the disclosed optical sensor technology enables a wide range of LCD display screens in smartphones, tablets or other electronic devices with enhanced functions from the optical sensing of the disclosed optical sensor technology.

For example, for an existing phone assembly design that does not provide a separate fingerprint sensor as in certain Apple iPhones or Samsung Galaxy smartphones, such an existing phone assembly design can integrate the under-screen optical fingerprint sensor module as disclosed herein without changing the touch sensing-display screen assembly to provide an added on-screen fingerprint sensing function. Because the disclosed optical sensing does not require a separate designated sensing area or port as in the case of certain Apple iPhones/Samsung Galaxy phones with a front fingerprint sensor outside the display screen area, or some smartphones with a designated rear fingerprint sensor on the backside like in some models by Huawei, Xiaomi, Google or Lenovo, the integration of the on-screen fingerprint sensing disclosed herein does not require a substantial change to the existing phone assembly design or the touch sensing display module that has both the touch sensing layers and the display layers. Based on the disclosed optical sensing technology in this document, no external sensing port and no extern hardware button are needed on the exterior of a device are needed for adding the disclosed optical fingerprint sensor module for fingerprint sensing. The added optical fingerprint sensor module and the related circuitry are under the display screen inside the phone housing and the fingerprint sensing can be conveniently performed on the same touch sensing surface for the touch screen.

For another example, due to the above described nature of the optical fingerprint sensor module for fingerprint sensing, a smartphone that integrates such an optical fingerprint sensor module can be updated with improved designs, functions and integration mechanism without affecting or burdening the design or manufacturing of the LCD display screens to provide desired flexibility to device manufacturing and improvements/upgrades in product cycles while maintaining the availability of newer versions of optical sensing functions to smartphones, tablets or other electronic devices using LCD display screens. Specifically, the touch sensing layers or the LCD display layers may be updated in the next product release without adding any significant hardware change for the fingerprint sensing feature using the disclosed under-screen optical fingerprint sensor module. Also, improved on-screen optical sensing for fingerprint sensing or other optical sensing functions by such an optical fingerprint sensor module can be added to a new product release by using a new version of the under-screen optical fingerprint sensor module without requiring significant changes to the phone assembly designs, including adding additional optical sensing functions.

The above and other features of the disclosed optical sensor technology can be implemented to provide a new generation of electronic devices with improved fingerprint sensing and other sensing functions, especially for smartphones, tablets and other electronic devices with LCD display screens to provide various touch sensing operations and functions and to enhance the user experience in such devices. The features for optical fingerprint sensor modules disclosed herein may be applicable to various display panels based on different technologies including both LCD and OLED displays. The specific examples below are directed to LCD display panels and optical fingerprint sensor modules placed under LCD display panels.

In implementations of the disclosed technical features, additional sensing functions or sensing modules, such as a biomedical sensor, e.g., a heartbeat sensor in wearable devices like wrist band devices or watches, may be provided. In general, different sensors can be provided in electronic devices or systems to achieve different sensing operations and functions.

The disclosed technology can be implemented to provide devices, systems, and techniques that perform optical sensing of human fingerprints and authentication for authenticating an access attempt to a locked computer-controlled device such as a mobile device or a computer-controlled system, that is equipped with a fingerprint detection module. The disclosed technology can be used for securing access to various electronic devices and systems, including portable or mobile computing devices such as laptops, tablets, smartphones, and gaming devices, and other electronic devices or systems such as electronic databases, automobiles, bank ATMs, etc.

II. Design Examples of Under-Display Optical Sensing Modules

In the following sections, examples of various designs for an under-screen optical fingerprint sensor module for collecting an optical signal to the optical detectors and providing desired optical imaging such as a sufficient imaging resolution. Specific examples of optical imaging designs for the under-screen optical sensing modules are provided below, including optical imaging designs without an imaging lens, optical imaging designs with at least one imaging lens and optical imaging designs based on combining a pinhole and an imaging lens in a pinhole-lens assembly for improved optical imaging and compact optical fingerprint sensor module packaging.

FIG. 1 is a block diagram of an example of a system 180 with a fingerprint sensing module 180 including a fingerprint sensor 181 which can be implemented to include an optical fingerprint sensor based on the optical sensing of fingerprints as disclosed in this document. The system 180 includes a fingerprint sensor control circuit 184, and a digital processor 186 which may include one or more processors for processing fingerprint patterns and determining whether an input fingerprint pattern is one for an authorized user. The fingerprint sensing system 180 uses the fingerprint sensor 181 to obtain a fingerprint and compares the obtained fingerprint to a stored fingerprint to enable or disable functionality in a device or system 188 that is secured by the fingerprint sensing system 180. In operation, the access to the device 188 is controlled by the fingerprint processing processor 186 based on whether the captured user fingerprint is from an authorized user. As illustrated, the fingerprint sensor 181 may include multiple fingerprint sensing pixels such as pixels 182A-182E that collectively represent at least a portion of a fingerprint. For example, the fingerprint sensing system 180 may be implemented at an ATM as the system 188 to determine the fingerprint of a customer requesting to access funds or other transactions. Based on a comparison of the customer's fingerprint obtained from the fingerprint sensor 181 to one or more stored fingerprints, the fingerprint sensing system 180 may, upon a positive identification, cause the ATM system 188 to grant the requested access to the user account, or, upon a negative identification, may deny the access. For another example, the device or system 188 may be a smartphone or a portable device and the fingerprint sensing system 180 is a module integrated to the device 188. For another example, the device or system 188 may be a gate or secured entrance to a facility or home that uses the fingerprint sensor 181 to grant or deny entrance. For yet another example, the device or system 188 may be an automobile or other vehicle that uses the fingerprint sensor 181 to link to the start of the engine and to identify whether a person is authorized to operate the automobile or vehicle.

Figure 2A:
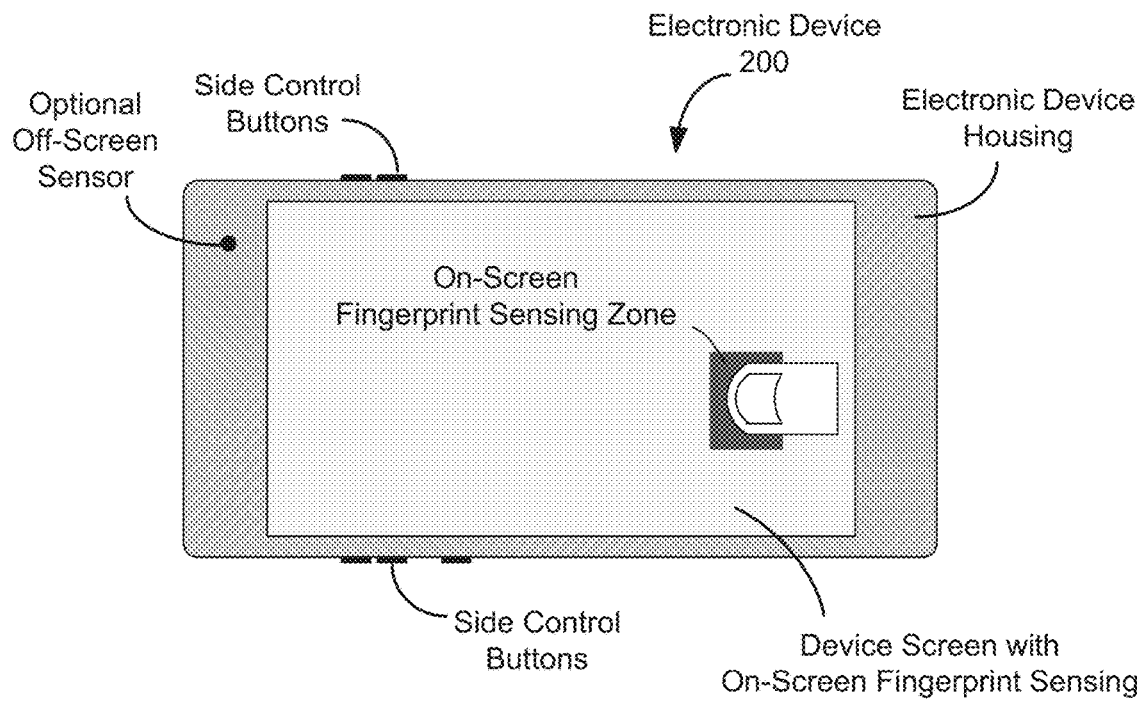
FIGS. 2A and 2B illustrate an exemplary implementation of an electronic device having a touch sensing display screen assembly and an optical fingerprint sensor module positioned underneath the touch sensing display screen assembly according to some embodiments.
Figure 2B:
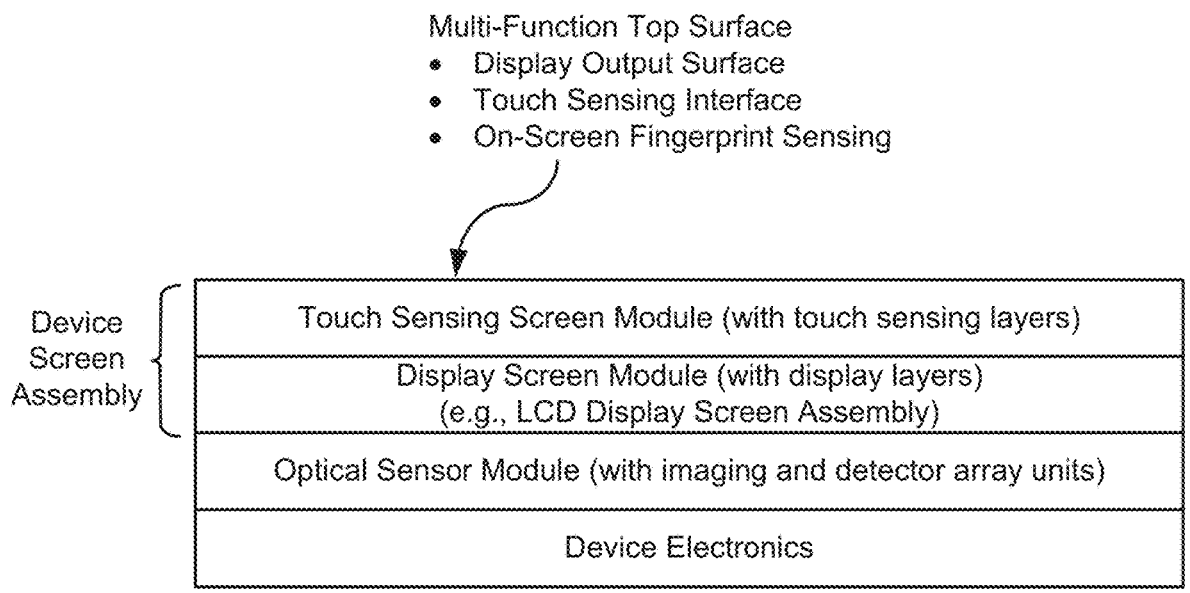

As a specific example, FIGS. 2A and 2B illustrate one exemplary implementation of an electronic device 200 having a touch sensing display screen assembly and an optical fingerprint sensor module positioned underneath the touch sensing display screen assembly. In this particular example, the display technology can be implemented by a LCD display screen with backlight for optically illuminating the LCD pixels or another display screen having light emitting display pixels without using backlight (e.g., an OLED display screen). The electronic device 200 can be a portable device such as a smartphone or a tablet and can be the device 188 as shown in FIG. 1.

FIG. 2A shows the front side of the device 200 which may resemble some features in some existing smartphones or tablets. The device screen is on the front side of the device 200 occupying either entirety, a majority or a significant portion of the front side space and the fingerprint sensing function is provided on the device screen, e.g., one or more sensing areas for receiving a finger on the device screen. As an example, FIG. 2A shows a fingerprint sensing zone in the device screen for a finger to touch which may be illuminated as a visibly identifiable zone or area for a user to place a finger for fingerprint sensing. Such a fingerprint sensing zone can function like the rest of the device screen for displaying images. As illustrated, the device housing of the device 200 may have, in various implementations, side facets that support side control buttons that are common in various smartphones on the market today. Also, one or more optional sensors may be provided on the front side of the device 200 outside the device screen as illustrated by one example on the left upper corner of the device housing in FIG. 2A.

FIG. 2B shows an example of the structural construction of the modules in the device 200 relevant to the optical fingerprint sensing disclosed in this document. The device screen assembly shown in FIG. 2B includes, e.g., the touch sensing screen module with touch sensing layers on the top, and a display screen module with display layers located underneath the touch sensing screen module. An optical fingerprint sensor module is coupled to, and located underneath, the display screen assembly module to receive and capture the returned light from the top surface of the touch sensing screen module and to guide and image the returned light onto an optical sensor array of optical sensing pixels or photodetectors which convert the optical image in the returned light into pixel signals for further processing. Underneath the optical fingerprint sensor module is the device electronics structure containing certain electronic circuits for the optical fingerprint sensor module and other parts in the device 200. The device electronics may be arranged inside the device housing and may include a part that is under the optical fingerprint sensor module as shown in FIG. 2B.

In implementations, the top surface of the device screen assembly can be a surface of an optically transparent layer serving as a user touch sensing surface to provide multiple functions, such as (1) a display output surface through which the light carrying the display images passes through to reach a viewer's eyes, (2) a touch sensing interface to receive a user's touches for the touch sensing operations by the touch sensing screen module, and (3) an optical interface for on-screen fingerprint sensing (and possibly one or more other optical sensing functions). This optically transparent layer can be a rigid layer such as a glass or crystal layer or a flexible layer.

One example of a display screen is an LCD display having LCD layers and a thin film transistor (TFT) structure or substrate. A LCD display panel is a multi-layer liquid crystal display (LCD) module that includes LCD display backlighting light sources (e.g., LED lights) emitting LCD illumination light for LCD pixels, a light waveguide layer to guide the backlighting light, and LCD structure layers which can include, e.g., a layer of liquid crystal (LC) cells, LCD electrodes, transparent conductive ITO layer, an optical polarizer layer, a color filter layer, and a touch sensing layer. The LCD module also includes a backlighting diffuser underneath the LCD structure layers and above the light waveguide layer to spatially spread the backlighting light for illuminating the LCD display pixels, and an optical reflector film layer underneath the light waveguide layer to recycle backlighting light towards the LCD structure layers for improved light use efficiency and the display brightness. For optical sensing, one or more separate illumination light sources are provided and are operated independently from the backlighting light sources of the LCD display module.

Referring to FIG. 2B, the optical fingerprint sensor module in this example is placed under the LCD display panel to capture the returned light from the top touch sensing surface and to acquire high resolution images of fingerprint patterns when user's finger is in touch with a sensing area on the top surface. In other implementations, the disclosed under-screen optical fingerprint sensor module for fingerprint sensing may be implemented on a device without the touch sensing feature.

Figure 3A:
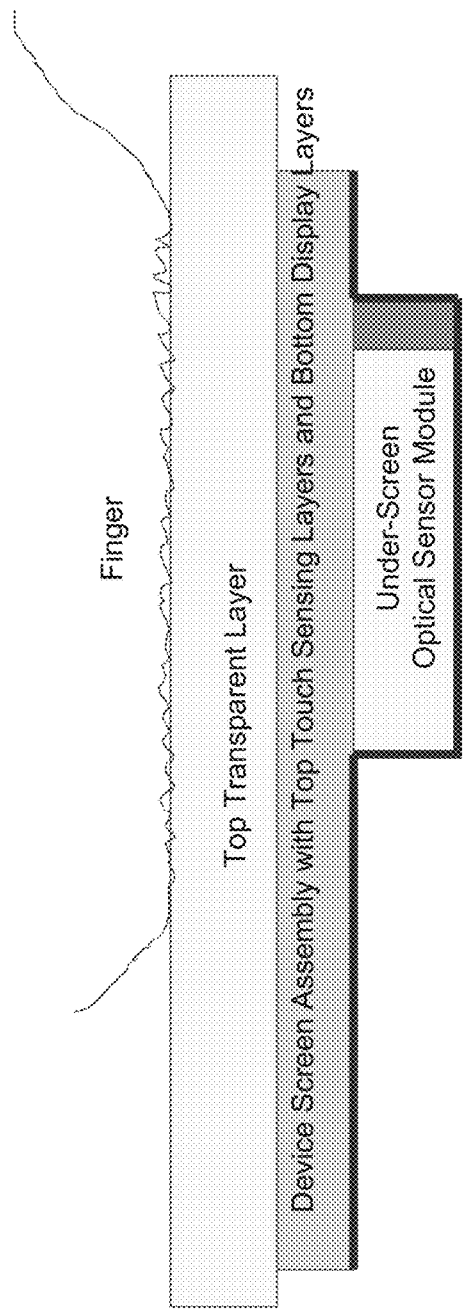
FIGS. 3A and 3B illustrate an example of a device that implements the optical fingerprint sensor module illustrated in FIGS. 2A and 2B according to some embodiments.
Figure 3B:
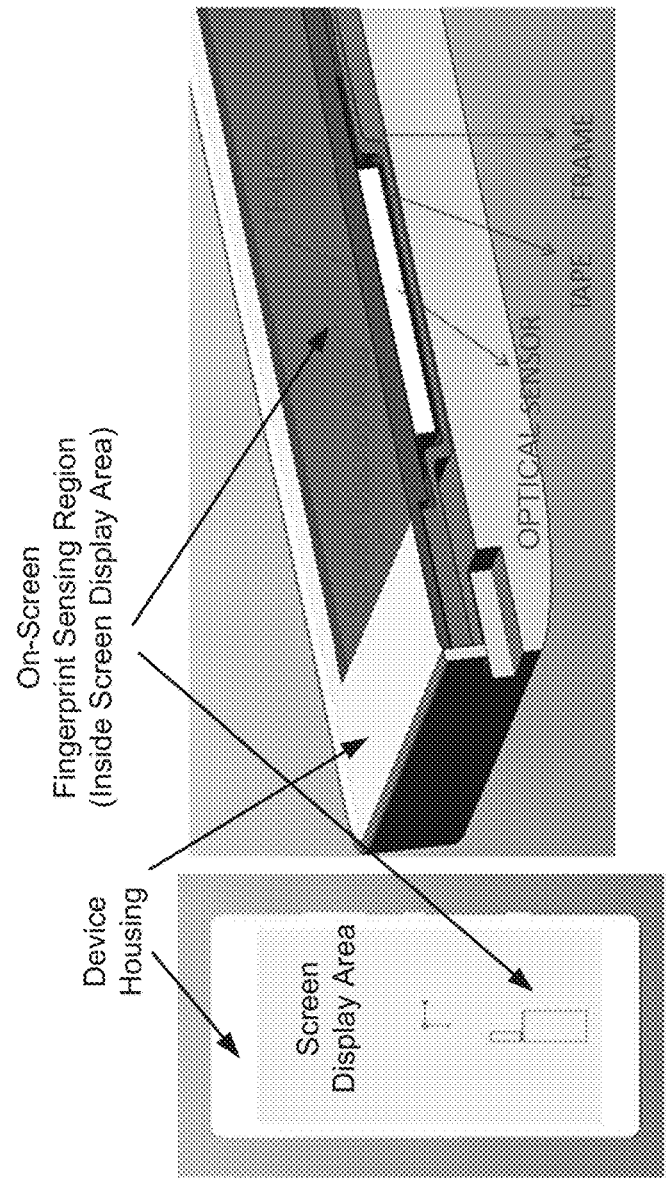

FIGS. 3A and 3B illustrate an example of a device that implements the optical fingerprint sensor module in FIGS. 2A and 2B. FIG. 3A shows a cross sectional view of a portion of the device containing the under-screen optical fingerprint sensor module. FIG. 3B shows, on the left, a view of the front side of the device with the touch sensing display indicating a fingerprint sensing area on the lower part of the display screen, and on the right, a perspective view of a part of the device containing the optical fingerprint sensor module that is under the device display screen assembly. FIG. 3B also shows an example of the layout of the flexible tape with circuit elements.

In the design examples in FIGS. 2A-2B, and 3A-3B, the optical fingerprint sensor design is different from some other fingerprint sensor designs using a separate fingerprint sensor structure from the display screen with a physical demarcation between the display screen and the fingerprint sensor (e.g., a button like structure in an opening of the top glass cover in some mobile phone designs) on the surface of the mobile device. In the illustrated designs here, the optical fingerprint sensor for detecting fingerprint sensing and other optical signals are located under the top cover glass or layer (e.g., FIG. 3A) so that the top surface of the cover glass serves as the top surface of the mobile device as a contiguous and uniform glass surface across both the display screen layers and the optical detector sensor that are vertically stacked and vertically overlap. This design example for integrating optical fingerprint sensing and the touch sensitive display screen under a common and uniform surface provides benefits, including improved device integration, enhanced device packaging, enhanced device resistance to exterior elements, failure and wear and tear, and enhanced user experience over the ownership period of the device.

Referring back to FIGS. 2A and 2B, the illustrated under-screen optical fingerprint sensor module for on-screen fingerprint sensing may be implemented in various configurations.

In one implementation, a device based on the above design can be structured to include a device screen a that provides touch sensing operations and includes a LCD display panel structure for forming a display image, a top transparent layer formed over the device screen as an interface for being touched by a user for the touch sensing operations and for transmitting the light from the display structure to display images to a user, and an optical fingerprint sensor module located below the display panel structure to receive light that returns from the top transparent layer to detect a fingerprint.

This device and other devices disclosed herein can be further configured to include various features.

For example, a device electronic control module can be included in the device to grant a user's access to the device if a detected fingerprint matches a fingerprint an authorized user. In addition, the optical fingerprint sensor module is configured to, in addition to detecting fingerprints, also detect a biometric parameter different form a fingerprint by optical sensing to indicate whether a touch at the top transparent layer associated with a detected fingerprint is from a live person, and the device electronic control module is configured to grant a user's access to the device if both (1) a detected fingerprint matches a fingerprint an authorized user and (2) the detected biometric parameter indicates the detected fingerprint is from a live person. The biometric parameter can include, e.g., whether the finger contains a blood flow, or a heartbeat of a person.

For example, the device can include a device electronic control module coupled to the display panel structure to supply power to the light emitting display pixels and to control image display by the display panel structure, and, in a fingerprint sensing operation, the device electronic control module operates to turn off the light emitting display pixels in one frame to and turn on the light emitting display pixels in a next frame to allow the optical sensor array to capture two fingerprint images with and without the illumination by the light emitting display pixels to reduce background light in fingerprint sensing.

For another example, a device electronic control module may be coupled to the display panel structure to supply power to the LCD display panel and to turn off power to the backlighting of the LCD display panel in a sleep mode, and the device electronic control module may be configured to wake up the display panel structure from the sleep mode when the optical fingerprint sensor module detects the presence of a person's skin at the designated fingerprint sensing region of the top transparent layer. More specifically, in some implementations, the device electronic control module can be configured to operate one or more illumination light sources in the optical fingerprint sensor module to intermittently emit light, while turning off power to the LCD display panel (in the sleep mode), to direct the intermittently emitted illumination light to the designated fingerprint sensing region of the top transparent layer for monitoring whether there is a person's skin in contact with the designated fingerprint sensing region for waking up the device from the sleep mode.

For another example, the device can include a device electronic control module coupled to the optical fingerprint sensor module to receive information on multiple detected fingerprints obtained from sensing a touch of a finger and the device electronic control module is operated to measure a change in the multiple detected fingerprints and determines a touch force that causes the measured change. For instance, the change may include a change in the fingerprint image due to the touch force, a change in the touch area due to the touch force, or a change in spacing of fingerprint ridges.

For another example, the top transparent layer can include a designated fingerprint sensing region for a user to touch with a finger for fingerprint sensing and the optical fingerprint sensor module below the display panel structure can include a transparent block in contact with the display panel substrate to receive light that is emitted from the display panel structure and returned from the top transparent layer, an optical sensor array that receives the light and an optical imaging module that images the received light in the transparent block onto the optical sensor array. The optical fingerprint sensor module can be positioned relative to the designated fingerprint sensing region and structured to selectively receive returned light via total internal reflection at the top surface of the top transparent layer when in contact with a person's skin while not receiving the returned light from the designated fingerprint sensing region in absence of a contact by a person's skin.

For yet another example, the optical fingerprint sensor module can be structured to include an optical wedge located below the display panel structure to modify a total reflection condition on a bottom surface of the display panel structure that interfaces with the optical wedge to permit extraction of light out of the display panel structure through the bottom surface, an optical sensor array that receives the light from the optical wedge extracted from the display panel structure, and an optical imaging module located between the optical wedge and the optical sensor array to image the light from the optical wedge onto the optical sensor array.

Specific examples of under-screen optical fingerprint sensor modules for on-screen fingerprint sensing are provided below.

Figure 4A:
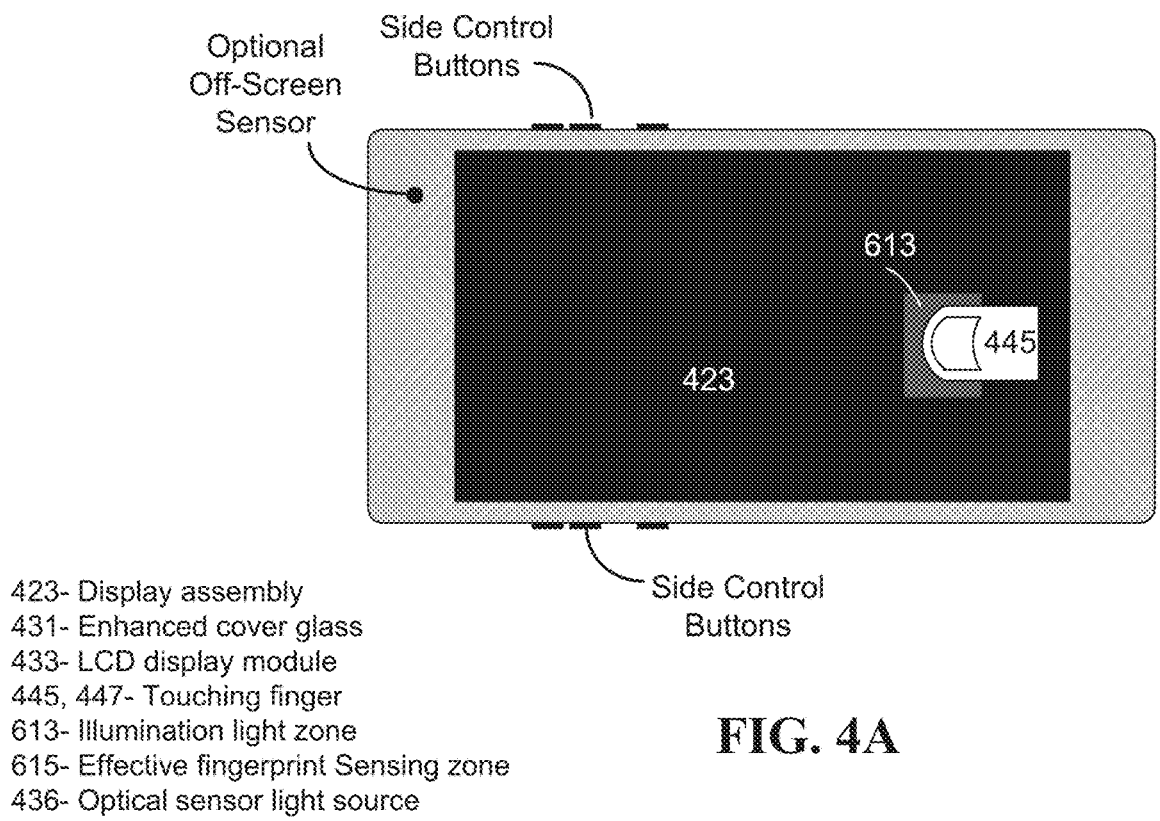
FIGS. 4A and 4B show an exemplary implementation of an optical fingerprint sensor module under the display screen assembly for implementing the design illustrated in FIGS. 2A and 2B according to some embodiments.
Figure 4B:
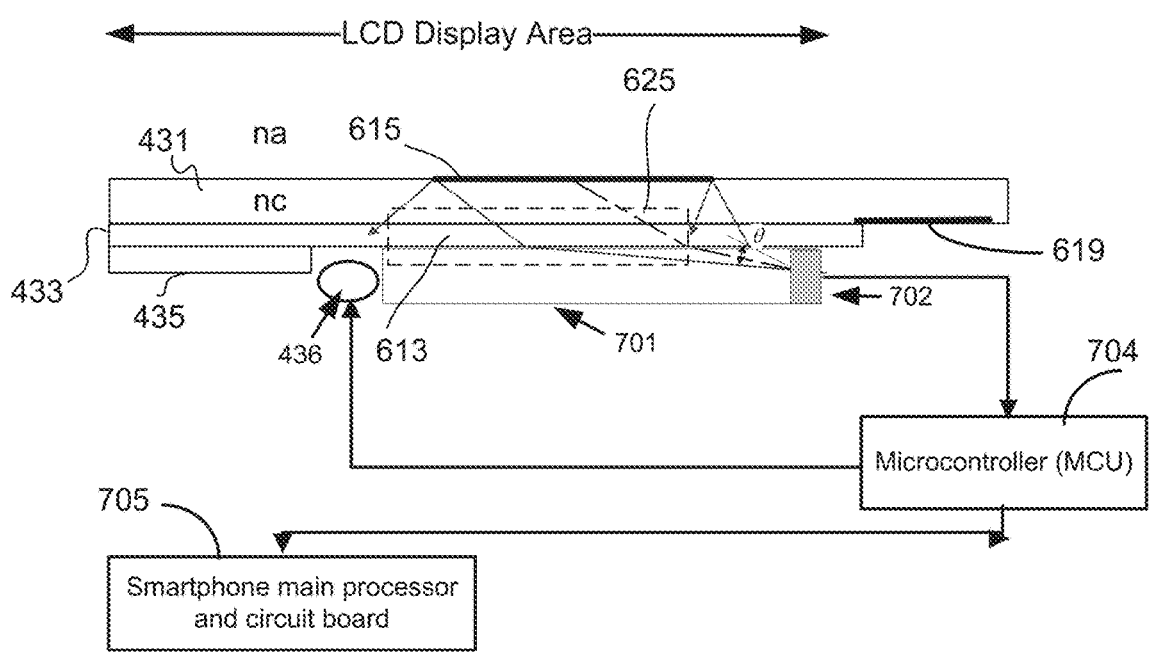

FIGS. 4A and 4B show an example of one implementation of an optical fingerprint sensor module under the display screen assembly for implementing the design in FIGS. 2A and 2B. The device illustrated in FIGS. 4A-4B includes a display assembly 423 with a top transparent layer 431 formed over the device screen assembly 423 as an interface for being touched by a user for the touch sensing operations and for transmitting the light from the display structure to display images to a user. This top transparent layer 431 can be a cover glass or a crystal material in some implementations. The device screen assembly 423 can include a LCD display module 433 under the top transparent layer 431. The LCD display layers allow partial optical transmission so light from the top surface can partially transmit through the LCD display layers to reach the under-LCD optical fingerprint sensor module. For example, LCD display layers include electrodes and wiring structure optically acting as an array of holes and light scattering objects. A device circuit module 435 may be provided under the LCD display panel to control operations of the device and perform functions for the user to operate the device.

The optical fingerprint sensor module 702 in this particular implementation example is placed under LCD display module 433. One or more illumination light sources, e.g., an illumination light source 436 under the LCD display module 433 or/and another one or more illumination light sources located under the top cover glass 431, are provided for providing the illumination light or probe light for the optical sensing by the optical fingerprint sensor module 702 and can be controlled to emit light to at least partially pass through the LCD display module 433 to illuminate the fingerprint sensing zone 615 on the top transparent layer 431 within the device screen area for a user to place a finger therein for fingerprint identification. The illumination light from the one or more illumination light sources 436 can be directed to the fingerprint sensing area 615 on the top surface as if such illumination light is from a fingerprint illumination light zone 613. Another one or more illumination light sources may be located under the top cover glass 431 and may be placed adjacent to the fingerprint sensing area 615 on the top surface to direct produced illumination light to reach the top cover glass 433 without passing through the LCD display module 433. In some designs, one or more illumination light sources may be located above the bottom surface of the top cover glass 431 to direct produced illumination light to reach the fingerprint sensing region above the top surface of the top cover glass 433 without necessarily passing through the top cover glass 431, e.g., directing illuminating the finger above the top cover glass 431.

As illustrated in FIG. 4A, a finger 445 is placed in the illuminated fingerprint sensing zone 615 as the effective sensing zone for fingerprint sensing. A portion of the reflected or scattered light in the zone 615 is directed into the optical fingerprint sensor module underneath the LCD display module 433 and a photodetector sensing array inside the optical fingerprint sensor module receives such light and captures the fingerprint pattern information carried by the received light. The one or more illumination light sources 436 are separate from the backlighting sources for the LCD display module and are operated independently from the backlighting light sources of the LCD display module.

In this design of using one or more illumination light sources 436 to provide the illumination light for optical fingerprint sensing, each illumination light source 436 maybe controlled in some implementations to turn on intermittently with a relatively low cycle to reduce the power used for the optical sensing operations. The fingerprint sensing operation can be implemented in a two-step process in some implementations: first, the one or more illumination light sources 436 are turned on in a flashing mode without turning on the LCD display panel to use the flashing light to sense whether a finger touches the sensing zone 615 and, once a touch in the zone 615 is detected, the optical sensing module is operated to perform the fingerprint sensing based on optical sensing and the LCD display panel may be turned on.

In the example in FIG. 4B, the under-screen optical fingerprint sensor module includes a transparent block 701 that is coupled to the display panel to receive the returned light from the top surface of the device assembly, and an optical imaging block 702 that performs the optical imaging and imaging capturing. Light from the one or more illumination light sources 436, after reaching the cover top surface, e.g., the cover top surface at the sensing area 615 where a user finger touches or is located without touching the cover top surface, is reflected or scattered back from the cover top surface in a design in which the illumination light source 436 is located to direct the illumination light to first transmit through the top cover glass 431 to reach the finger. When fingerprint ridges in contact of the cover top surface in the sensing area 615, the light reflection under the fingerprint ridges is different, due to the presence of the skin or tissue of the finger in contact at that location, from the light reflection at another location under the fingerprint valley, where the skin or tissue of the finger is absent. This difference in light reflection conditions at the locations of the ridges and valleys in the touched finger area on the cover top surface forms an image representing an image or spatial distribution of the ridges and valleys of the touched section of the finger. The reflection light is directed back towards the LCD display module 433, and, after passing through the small holes of the LCD display module 433, reaches the interface with the low index optically transparent block 701 of the optical fingerprint sensor module. The low index optically transparent block 701 is constructed to have a refractive index less than a refractive index of the LCD display panel so that the returned light can be extracted out of the LCD display panel into the optically transparent block 701. Once the returned light is received inside the optically transparent block 701, such received light enters the optical imaging unit as part of the imaging sensing block 702 and is imaged onto the photodetector sensing array or optical sensing array inside the block 702. The light reflection differences between fingerprint ridges and valleys create the contrast of the fingerprint image. As shown in FIG. 4B, a control circuit 704 (e.g., a microcontroller or MCU) is coupled to the imaging sensing block 702 and to other circuitry such as the device main processor 705 on a main circuit board.

In this particular example, the optical light path design is structured so that the illumination light enters the cover top surface within the total reflection angles on the top surface between the substrate and air interface and, therefore, the reflected light is collected most effectively by the imaging optics and imaging sensor array in the block 702. In this design, the image of the fingerprint ridge/valley area exhibits a maximum contrast due to the total internal reflection condition at each finger valley location where the finger tissue does not touch the top cover surface of the top cover glass 431. Some implementations of such an imaging system may have undesired optical distortions that would adversely affect the fingerprint sensing. Accordingly, the acquired image may be further corrected by a distortion correction during the imaging reconstruction in processing the output signals of the optical sensor array in the block 702 based on the optical distortion profile along the light paths of the returned light at the optical sensor array. The distortion correction coefficients can be generated by images captured at each photodetector pixel by scanning a test image pattern one line pixel at a time, through the whole sensing area in both X direction lines and Y direction lines. This correction process can also use images from tuning each individual pixel on one at a time, and scanning through the whole image area of the photodetector array. This correction coefficients only need to be generated one time after assembly of the sensor.

The background light from environment (e.g., sunlight or room illumination light) may enter the image sensor through the LCD panel top surface, and through holes in the LCD display assembly 433. Such background light can create a background baseline in the interested images from a finger and thus may undesirably degrade the contrast of a captured image. Different methods can be used to reduce this undesired baseline intensity caused by the background light. One example is to tune on and off the illumination light source 436 at a certain illumination modulation frequency f and the image sensor accordingly acquires the received images at the same illumination modulation frequency by phase synchronizing the light source driving pulse and image sensor frame. Under this operation, only one of the image phases contain light from the light source. In implementing this technique, the imaging capturing can be timed to capture images with the illumination light on at even (or odd) frames while turning off the illumination light at odd (or even) frames and, accordingly, subtracting even and odd frames can be used to obtain an image which is mostly formed by light emitted from the modulated illumination light source with significantly reduced background light. Based on this design, each display scan frame generates a frame of fingerprint signals and two sequential frames of signals are obtained by turning on the illumination light in one frame and off in the other frame. The subtraction of adjacent frames can be used to minimize or substantially reduce the ambient background light influence. In implementations, the fingerprint sensing frame rate can be one half of the display frame rate.

In the example shown in FIG. 4B, a portion of the light from the one or more illumination light sources 436 may also go through the cover top surface and enter the finger tissues. This part of the illumination light is scattered around and a part of this scattered light may be eventually collected by the imaging sensor array in the optical fingerprint sensor module 702. The light intensity of this scattered light is a result of interacting with the inner tissues of the finger and thus depends on the finger's skin color, the blood concentration in the finger tissue or the inner finger tissues. Such information of the finger is carried by this scattered light on the finger, is useful for fingerprint sensing, and can be detected as part of the fingerprint sensing operation. For example, the intensity of a region of user's finger image can be integrated in detection for measuring or observing in increase or decrease in the blood concentration that is associated with or depends on the phase of the user's heart-beat. This signature can be used to determine the user's heart beat rate, to determine if the user's finger is a live finger, or to provide a spoof device with a fabricated fingerprint pattern. Additional examples of using information in light carrying information on the inner tissues of a finger are provided in later sections of this patent document.

The one or more illumination light sources 436 in FIG. 4B can be designed to emit illumination light of different colors or wavelengths in some designs and the optical fingerprint sensor module can capture returned light from a person's finger at the different colors or wavelengths. By recording the corresponding measured intensity of the returned light at the different colors or wavelengths, information associated with the user's skin color, the blood flow or inner tissue structures inside the finger can be measured or determined. As an example, when a user registers a finger for fingerprint authentication operation, the optical fingerprint sensor can be operated to measure the intensity of the scatter light from the finger at two different colors or illumination light wavelengths associated with light color A and light color B, as intensities Ia and Ib, respectively. The ratio of Ia/Ib could be recorded to compare with later measurement when the user's finger is placed on the sensing area on the top sensing surface to measure the fingerprint. This method can be used as part of the device's anti spoofing system to reject a spoof device that is fabricated with a fingerprint emulating or being identical to a user's fingerprint but may not match user's skin color or other biological information of the user.

The one or more illumination light sources 436 can be controlled by the same electronics 704 (e.g., MCU) for controlling the image sensor array in the block 702. The one or more illumination light sources 436 can be pulsed for a short time (e.g., at a low duty cycle) to emit light intermittently and to provide pulse light for image sensing. The image sensor array can be operated to monitor the light pattern at the same pulse duty cycle. If there is a human finger touching the sensing area 615 on the screen, the image that is captured at the imaging sensing array in the block 702 can be used to detect the touching event. The control electronics or MCU 704 connected to the image sensor array in the block 702 can be operated to determine if the touch is by a human finger touch. If it is confirmed that it is a human finger touch event, the MCU 704 can be operated to wake up the smartphone system, turn on the one or more illumination light sources 436 for performing the optical fingerprint sensing), and use the normal mode to acquire a full fingerprint image. The image sensor array in the block 702 sends the acquired fingerprint image to the smartphone main processor 705 which can be operated to match the captured fingerprint image to the registered fingerprint database. If there is a match, the smartphone unlocks the phone to allow a user to access the phone and start the normal operation. If the captured image is not matched, the smartphone produces a feedback to user that the authentication is failed and maintains the locking status of the phone. The user may try to go through the fingerprint sensing again, or may input a passcode as an alternative way to unlock the phone.

In the example illustrated in FIGS. 4A and 4B, the under-screen optical fingerprint sensor module uses the optically transparent block 701 and the imaging sensing block 702 with the photodetector sensing array to optically image the fingerprint pattern of a touching finger in contact with the top surface of the display screen onto the photodetector sensing array. The optical imaging axis or detection axis 625 from the sensing zone 615 to the photodetector array in the block 702 is illustrated in FIG. 4B for the illustrated example. The optically transparent block 701 and the front end of the imaging sensing block 702 before the photodetector sensing array forma a bulk imaging module to achieve proper imaging for the optical fingerprint sensing. Due to the optical distortions in this imaging process, a distortion correction can be used to achieve the desired imaging operation.

Figure 5A:
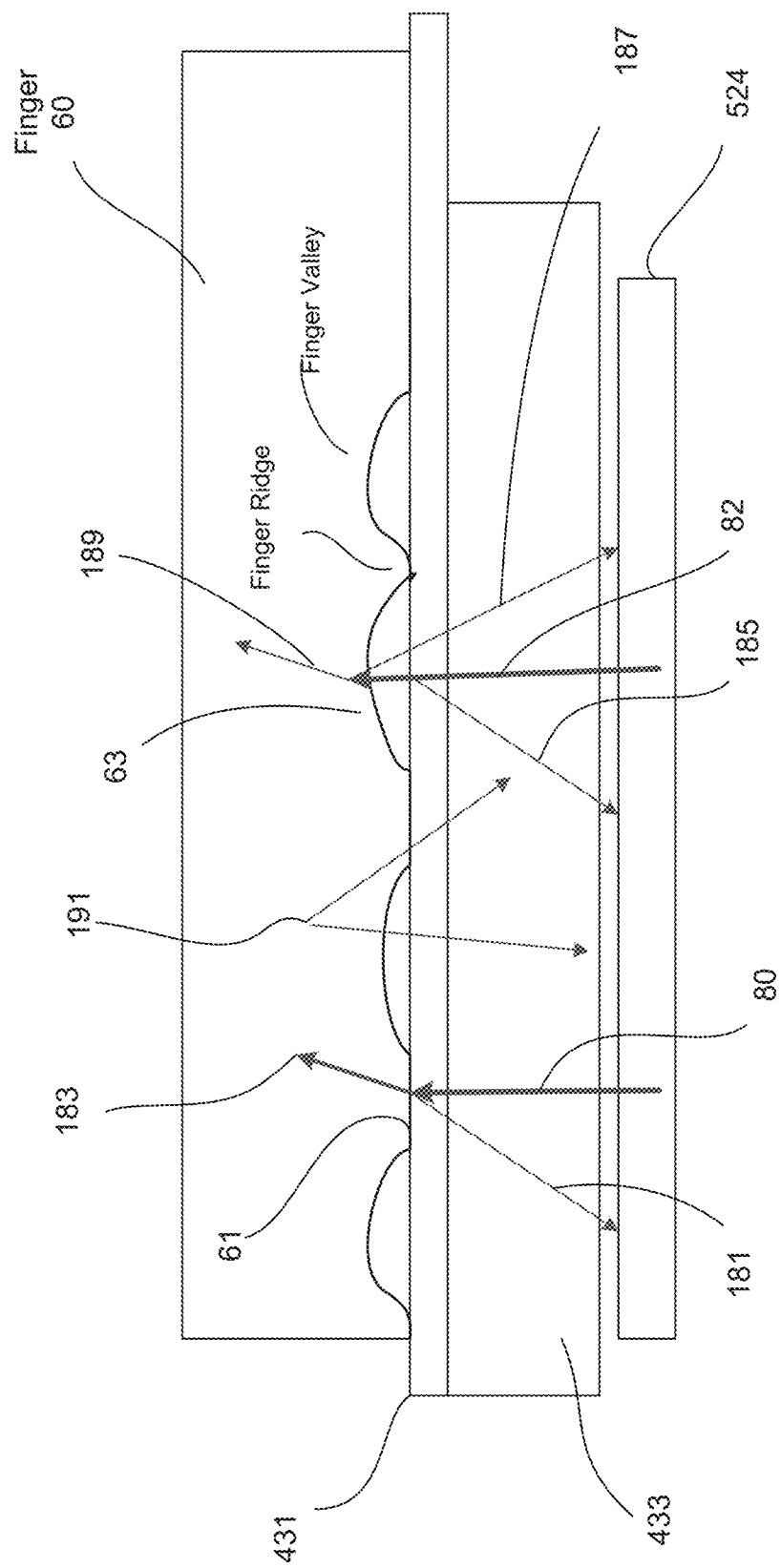
FIGS. 5A-5C illustrate signal generation for the returned light from the sensing zone on the top sensing surface under two different optical conditions to facilitate the understanding of the operation of an under-screen optical fingerprint sensor module according to some embodiments.
Figure 5B:
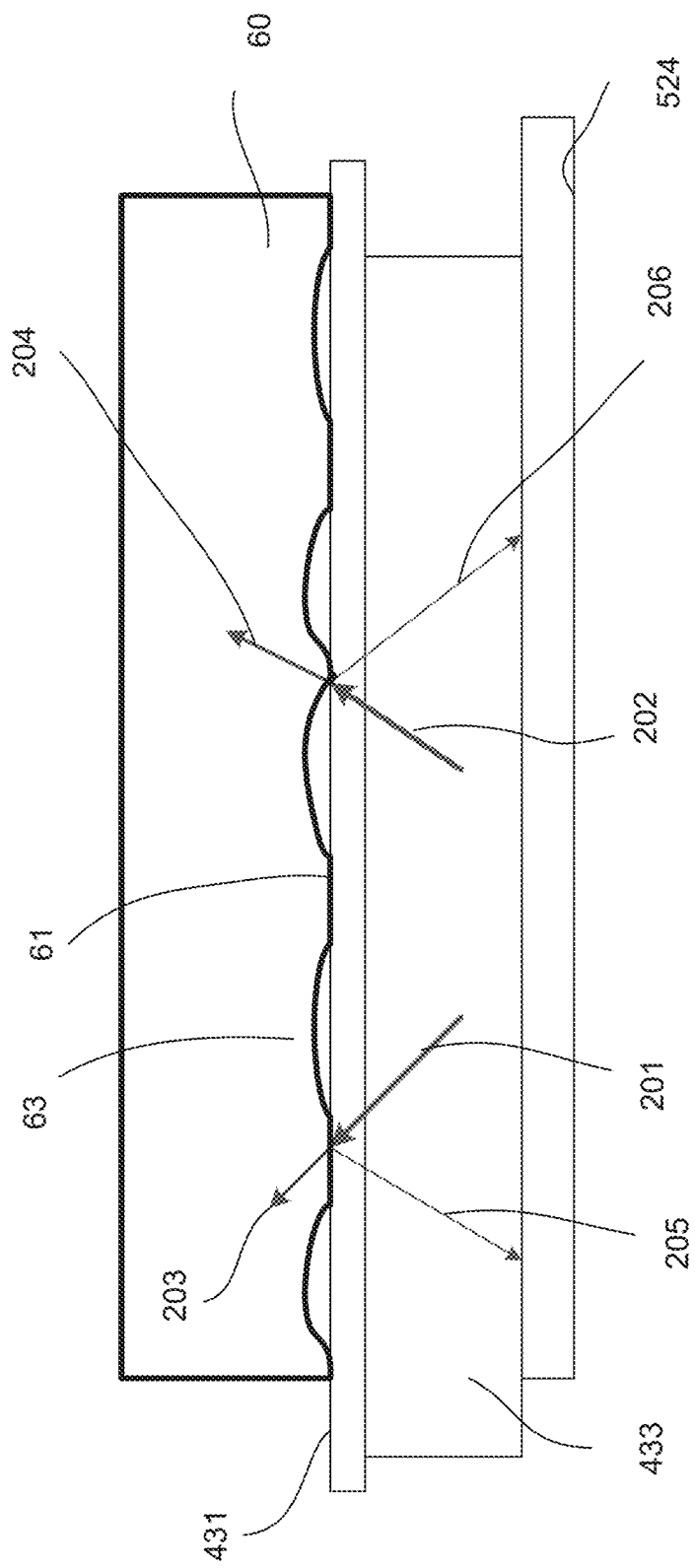
Figure 5C:
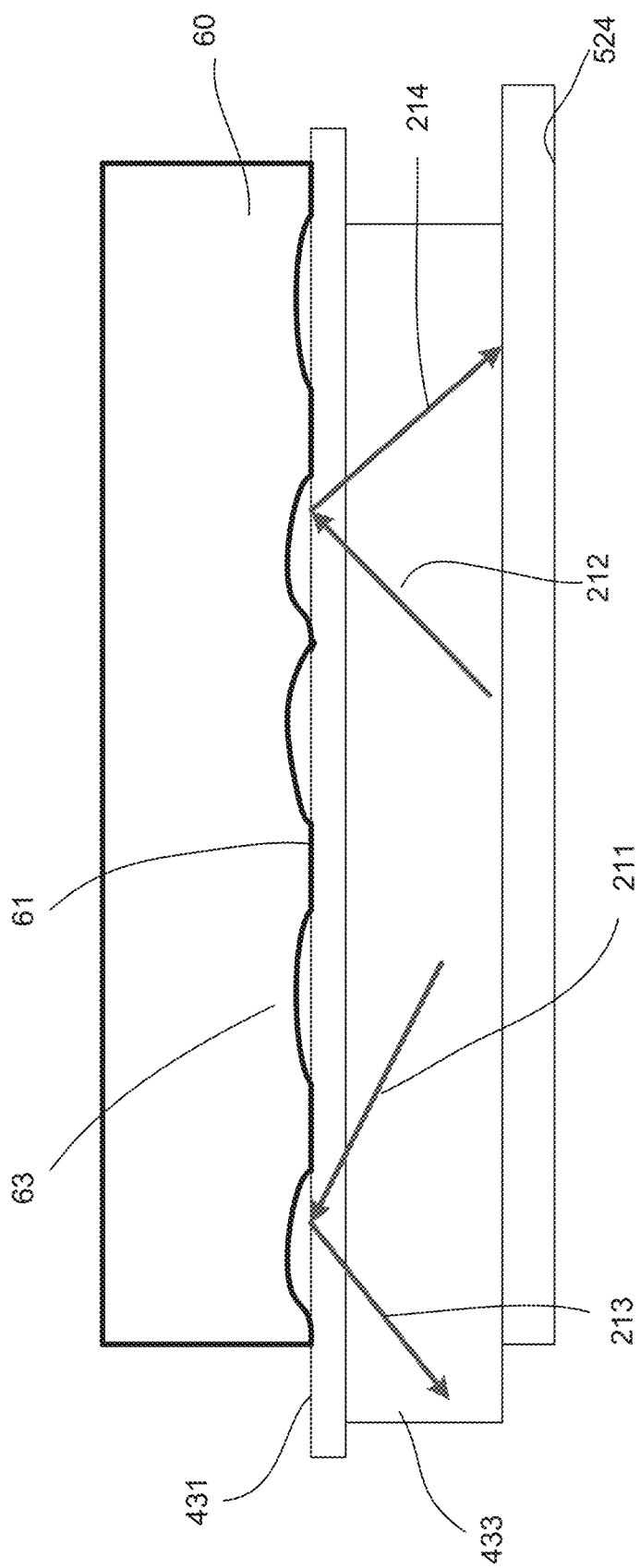

In the optical sensing by the under-screen optical fingerprint sensor module in FIGS. 4A and 4B and other designs disclosed herein, the optical signal from the sensing zone 615 on the top transparent layer 431 to the under-screen optical fingerprint sensor module include different light components. FIGS. 5A-5C illustrate signal generation for the returned light from the sensing zone 615 under different optical conditions to facilitate the understanding of the operation of the under-screen optical fingerprint sensor module. The light that enters into the finger, either from the illumination light source or from other light sources (e.g., background light) can generate internally scattered light in tissues below the finger surface, such as the scattered light 191 in FIGS. 5A-5C. Such internally scattered light in tissues below the finger surface can propagate through the internal tissues of the finger and subsequently transmits through the finger skin to enter the top transparent layer 431 carrying certain information is not carried by light that is scattered, refracted or reflected by the finger surface, e.g., information on finger skin color, the blood concentration or flow characteristics inside the finger, or an optical transmissive pattern of the finger that contains both (1) a two-dimensional spatial pattern of external ridges and valleys of a fingerprint (2) an internal fingerprint pattern associated with internal finger tissue structures that give rise to the external ridges and valleys of a finger.

FIG. 5A shows an example of how illumination light from the one or more illumination light sources 436 propagates through the OLED display module 433, after transmitting through the top transparent layer 431, and generates different returned light signals including light signals that carry fingerprint pattern information to the under-screen optical fingerprint sensor module. For simplicity, two illumination rays 80 and 82 at two different locations are directed to the top transparent layer 431 without experiencing total reflection at the interfaces of the top transparent layer 431. Specifically, the illumination light rays 80 and 82 are perpendicular or nearly perpendicular to the top layer 431. A finger 60 is in contact with the sensing zone 615 on the e top transparent layer 431. As illustrated, the illumination light beam 80 reaches to a finger ridge in contact with the top transparent layer 431 after transmitting through the top transparent layer 431 to generate the light beam 183 in the finger tissue and another light beam 181 back towards the LCD display module 433. The illumination light beam 82 reaches to a finger valley located above the top transparent layer 431 after transmitting through the top transparent layer 431 to generate the reflected light beam 185 from the interface with the top transparent layer 431 back towards the LCD display module 433, a second light beam 189 that enters the finger tissue and a third light beam 187 reflected by the finger valley.

In the example in FIG. 5A, it is assumed that the finger skin's equivalent index of refraction is about 1.44 at 550 nm and the cover glass index of refraction is about 1.51 for the top transparent layer 431. The finger ridge-cover glass interface reflects part of the beam 80 as reflected light 181 to bottom layers 524 below the LCD display module 433. The reflectance can be low, e.g., about 0.1% in some LCD panels. The majority of the light beam 80 becomes the beam 183 that transmits into the finger tissue 60 which causes scattering of the light 183 to produce the returned scattered light 191 towards the LCD display module 433 and the bottom layers 524. The scattering of the transmitted light beam 189 from the LCD pixel 73 in the finger tissue also contributes to the returned scattered light 191.

The beam 82 at the finger skin valley location 63 is reflected by the cover glass surface. In some designs, for example, the reflection may be about 3.5% as the reflected light 185 towards bottom layers 524, and the finger valley surface may reflect about 3.3% of the incident light power (light 187) to bottom layers 524 so that the total reflection may be about 6.8%. The majority light 189 is transmitted into the finger tissues 60. Part of the light power in the transmitted light 189 in the figure tissue is scattered by the tissue to contribute to the scattered light 191 towards and into the bottom layers 524.

Therefore, in the example in FIG. 5A, the light reflections from various interface or surfaces at finger valleys and finger ridges of a touching finger are different and the reflection ratio difference carries the fingerprint map information and can be measured to extract the fingerprint pattern of the portion that is in contact with the top transparent layer 431 and is illuminated the OLED light.

FIGS. 5B and 5C illustrate optical paths of two additional types of illumination light rays at the top surface under different conditions and at different positions relative to valleys or ridges of a finger, including under a total reflection condition at the interface with the top transparent layer 431. The illustrated illumination light rays generate different returned light signals including light signals that carry fingerprint pattern information to the under-screen optical fingerprint sensor module. It is assumed that the cover glass 431 and the LCD display module 433 are glued together without any air gap in between so that illumination light with a large incident angle to the cover glass 431 will be totally reflected at the cover glass-air interface. FIGS. 5A, 5B and 5C illustrate examples of three different groups divergent light beams: (1) central beams 82 with small incident angles to the cover glass 431 without the total reflection (FIG. 5A), (2) high contrast beams 201, 202, 211, 212 that are totally reflected at the cover glass 431 when nothing touches the cover glass surface and can be coupled into finger tissues when a finger touches the cover glass 431 (FIGS. 5B and 5C), and (3) escaping beams having very large incident angles that are totally reflected at the cover glass 431 even at a location where the finger issue is in contact.

For the central light beams 82, the cover glass surface in some designs may reflect about 0.1%~3.5% to light beam 185 that is transmitted into bottom layers 524, the finger skin may reflect about 0.1%~3.3% to light beam 187 that is also transmitted into bottom layers 524. The reflection difference is dependent on whether the light beams 82 meet with finger skin ridge 61 or valley 63. The rest light beam 189 is coupled into the finger tissues 60.

For high contrast light beams 201 and 202 meeting the local totally internal reflection condition, the cover glass surface reflects nearly 100% to light beams 205 and 206 respectively if nothing touches the cover glass surface. When the finger skin ridges touch the cover glass surface and at light beams 201 and 202 positions, most of the light power may be coupled into the finger tissues 60 by light beams 203 and 204.

For high contrast light beams 211 and 212 meeting the local totally internal reflection condition, the cover glass surface reflects nearly 100% to light beams 213 and 214 respectively if nothing touches the cover glass surface. When the finger touches the cover glass surface and the finger skin valleys happen to be at light beams 211 and 212 positions, no light power is coupled into finger tissues 60.

As illustrated in FIG. 5A, a portion of the illumination light that is coupled into finger tissues 60 tends to experience random scattering by the inner finger tissues to form low-contrast light 191 and part of such low-contrast light 191 can pass through the LCD display module 433 to reach to the optical fingerprint sensor module. This portion of light captured by optical fingerprint sensor module contains additional information on the finger skin color, blood characteristics and the finger inner tissue structures associated with the fingerprint. Additional features for using internally scattered light in tissues below the finger surface in optical sensing will be explained in later part of this patent document, such as obtaining an optical transmissive pattern of the finger that contains both (1) a two-dimensional spatial pattern of external ridges and valleys of a fingerprint (2) an internal fingerprint pattern associated with internal finger tissue structures that give rise to the external ridges and valleys of a finger.

Therefore, in high contrast light beams illuminated area, finger skin ridges and valleys cause different optical reflections and the reflection difference pattern carries the fingerprint pattern information. The high contrast fingerprint signals can be achieved by comparing the difference.

The disclosed under-screen optical sensing technology can be in various configurations to optically capture fingerprints based on the design illustrated in FIGS. 2A and 2B.

For example, the specific implementation in FIG. 4B based on optical imaging by using a bulk imaging module in the optical sensing module can be implemented in various configurations. FIGS. 6A-6C, 7, 8A-8B, 9, 10A-10B, 11, and 12 illustrate examples of various implementations and additional features and operations of the under-screen optical fingerprint sensor module designs for optical fingerprint sensing.

Figure 6A:
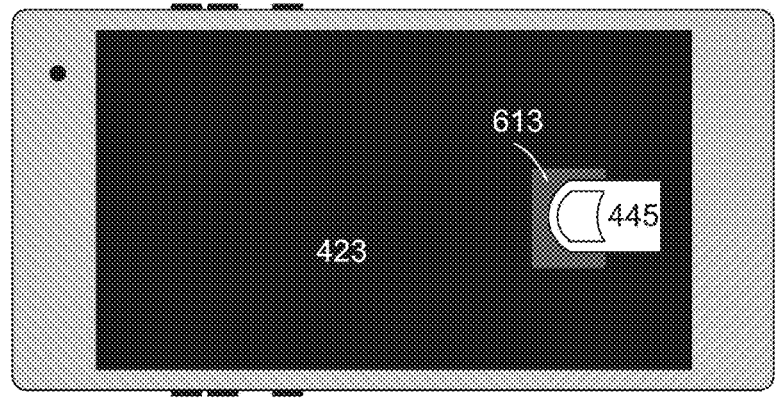
Figure 6B:
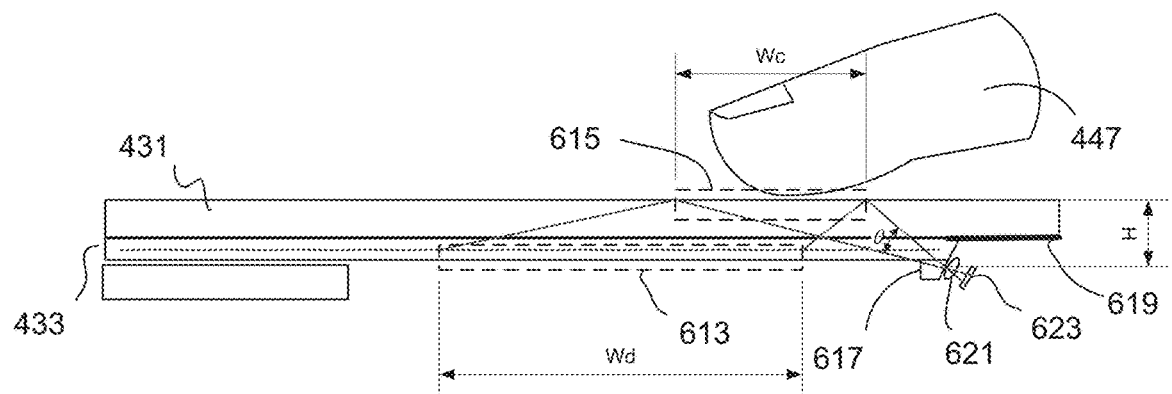
Figure 6C:
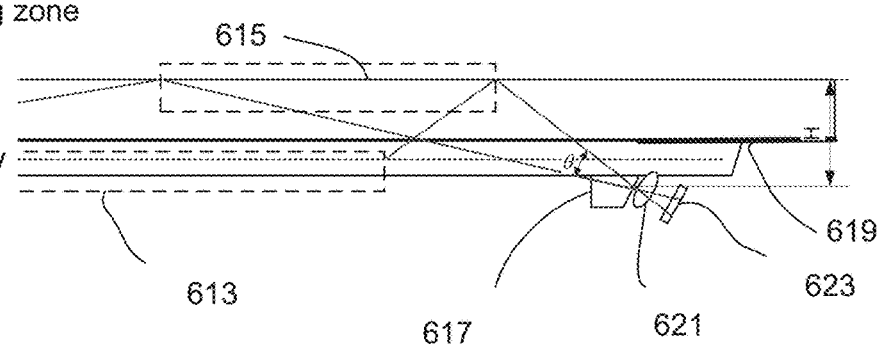

FIGS. 6A-6C show an example of an under-screen optical fingerprint sensor module based on optical imaging via a lens for capturing a fingerprint from a finger 445 pressing on the display cover glass 423. FIG. 6C is an enlarged view of the optical fingerprint sensor module part shown in FIG. 6B. The under-screen optical fingerprint sensor module as shown in FIG. 6B is placed under the LCD display module 433 includes an optically transparent spacer 617 that is engaged to the bottom surface of the LCD display module 433 to receive the returned light from the sensing zone 615 on the top surface of the top transparent layer 431, an imaging lens 621 that is located between and spacer 617 and the photodetector array 623 to image the received returned light from the sensing zone 615 onto the photodetector array 623. Different from FIG. 4B showing an example of an optical projection imaging system without a lens, the example of the imaging design in FIG. 6B used the imaging lens 621 to capture the fingerprint image at the photodetector array 623 and enables an image reduction by the design of the imaging lens 621. Similar to the imaging system in the example in FIG. 4B to some extent, this imaging system in FIG. 6B for the optical fingerprint sensor module can experience image distortions and a suitable optical correction calibration can be used to reduce such distortions, e.g., the distortion correction methods described for the system in FIG. 4B.

Similar to the assumptions in FIGS. 5A-5C, it is assumed that the finger skin's equivalent index of refraction to be about 1.44 at 550 nm and a bare cover glass index of refraction to be about 1.51 for the cover glass 423. When the OLED display module 433 is glued onto the cover glass 431 without any air gap, the total inner reflection happens in large angles at or larger than the critical incident angle for the interface. The total reflection incident angle is about 41.8° if nothing is in contact with the cover glass top surface, and the total reflection angle is about 73.7° if the finger skin touches the cover glass top surface. The corresponding total reflection angle difference is about 31.9°.

In this design, the micro lens 621 and the photodiode array 623 define a viewing angle θ for capturing the image of a contact finger in the sensing zone 615. This viewing angle can be aligned properly by controlling the physical parameters or configurations in order to detect a desired part of the cover glass surface in the sensing zone 615. For example, the viewing angle may be aligned to detect the total inner reflection of the LCD display assembly. Specifically, the viewing angle θ is aligned to sense the effective sensing zone 615 on the cover glass surface. The effective sensing cover glass surface 615 may be viewed as a mirror so that the photodetector array effectively detects an image of the fingerprint illumination light zone 613 in the LCD display that is projected by the sensing cover glass surface 615 onto the photodetector array. The photodiode/photodetector array 623 can receive the image of the zone 613 that is reflected by the sensing cover glass surface 615. When a finger touches the sensing zone 615, some of the light can be coupled into the fingerprint's ridges and this will cause the photodetector array to receive light from the location of the ridges to appear as a darker image of the fingerprint. Because the geometrics of the optical detection path are known, the fingerprint image distortion caused in the optical path in the optical fingerprint sensor module can be corrected.

Consider, as a specific example, that the distance H in FIG. 6B from the detection module central axis to the cover glass top surface is 2 mm. This design can directly cover 5 mm of an effective sensing zone 615 with a width Wc on the cover glass. Adjusting the spacer 617 thickness can adjust the detector position parameter H, and the effective sensing zone width Wc can be optimized. Because H includes the thickness of the cover glass 431 and the display module 433, the application design should take these layers into account. The spacer 617, the micro lens 621, and the photodiode array 623 can be integrated under the color coating 619 on the bottom surface of the top transparent layer 431.

Figure 7:
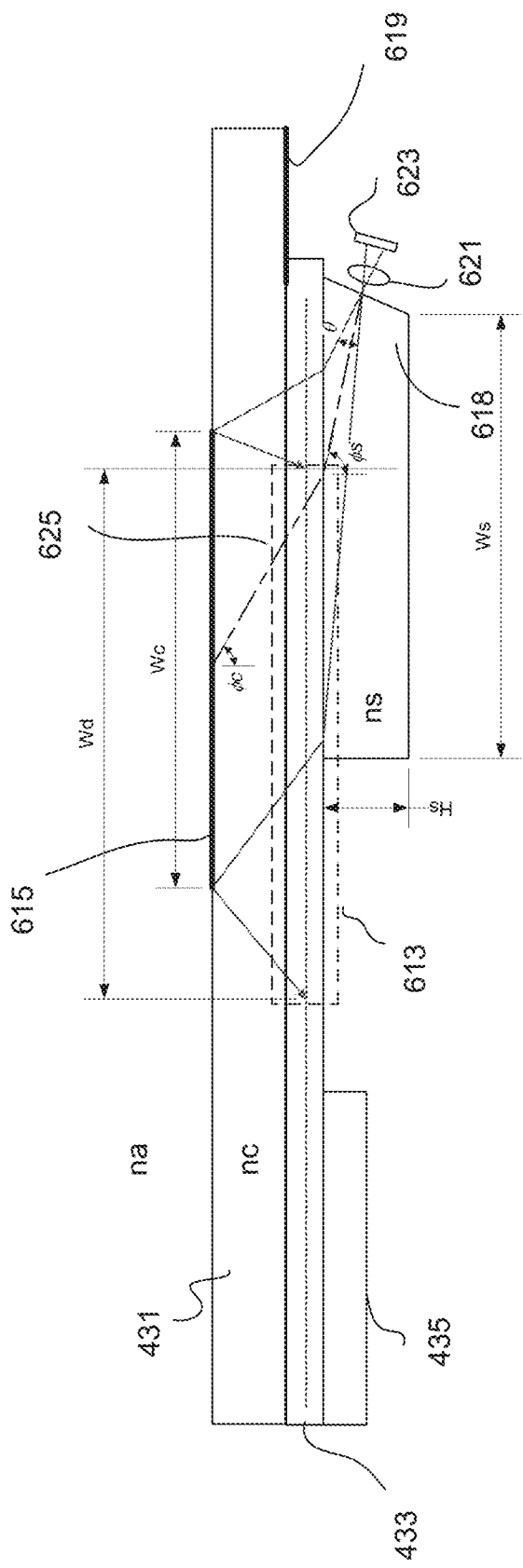

FIG. 7 shows an example of further design considerations of the optical imaging design for the optical fingerprint sensor module shown in FIGS. 6A-6C by using a special spacer 618 to replace the spacer 617 in FIGS. 6B-6C to increase the size of the sensing area 615. The spacer 618 is designed with a width Ws and thickness is Hs to have a low refraction index (RI) ns, and is placed under the LCD display module 433, e.g., being attached (e.g., glued) to the bottom surface the LCD display module 433. The end facet of the spacer 618 is an angled or slanted facet that interfaces with the micro lens 621. This relative position of the spacer and the lens is different from FIGS. 6B-6C where the lens is placed underneath the spacer 617. The micro lens 621 and a photodiode array 623 are assembled into the optical detection module with a detection angle width θ. The detection axis 625 is bent due to optical refraction at the interface between the spacer 618 and display module 433 and at the interface between the cover glass 431 and the air. The local incident angle φ1 and φ2 are decided by the refractive indices RIs, ns, nc, and na of the materials for the components.

If nc is greater than ns, φ1 is greater than φ2. Thus, the refraction enlarges the sensing width Wc. For example, assuming the finger skin's equivalent RI is about 1.44 at 550 nm and the cover glass index RI is about 1.51, the total reflection incident angle is estimated to be about 41.8° if nothing touches the cover glass top surface, and the total reflection angle is about 73.7° if the finger skin touches the cover glass top surface. The corresponding total reflection angle difference is about 31.9°. If the spacer 618 is made of same material of the cover glass, and the distance from the detection module center to the cover glass top surface is 2 mm, if detection angle width is θ=31.9°, the effective sensing area width Wc is about 5 mm. The corresponding central axis's local incident angle is φ1=φ2=57.75°. If the material for the special spacer 618 has a refractive index ns about 1.4, and Hs is 1.2 mm and the detection module is tilted at φ1=70°. The effective sensing area width is increased to be greater than 6.5 mm. Under those parameters, the detection angle width in the cover glass is reduced to 19°. Therefore, the imaging system for the optical fingerprint sensor module can be designed to desirably enlarge the size of the sensing area 615 on the top transparent layer 431.

the refractive index RI of the special spacer 618 is designed to be sufficiently low (e.g., to use $MgF_2$, $CaF_2$, or even air to form the spacer), the width Wc of the effective sensing area 615 is no longer limited by the thickness of the cover glass 431 and the display module 433. This property provides desired design flexibility. In principle, if the detection module has a sufficient resolution, the effective sensing area may even be increased to cover the entire display screen.

Since the disclosed optical sensor technology can be used to provide a large sensing area for capturing a pattern, the disclosed under-screen optical fingerprint sensor modules may be used to capture and detect not only a pattern of a finger but a larger size patter such a person's palm that is associated with a person for user authentication.

Figure 8A:
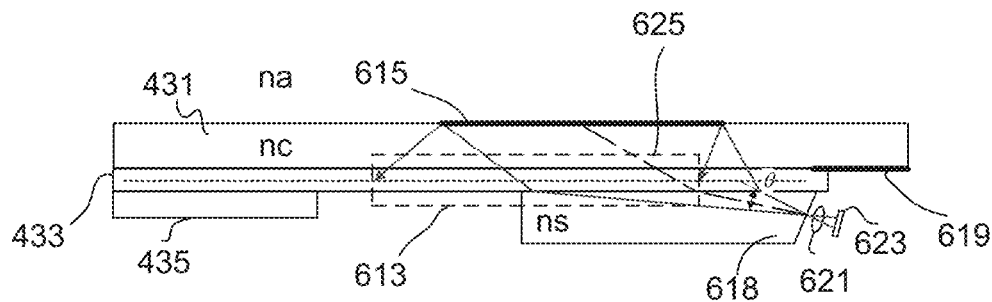
Figure 8B:
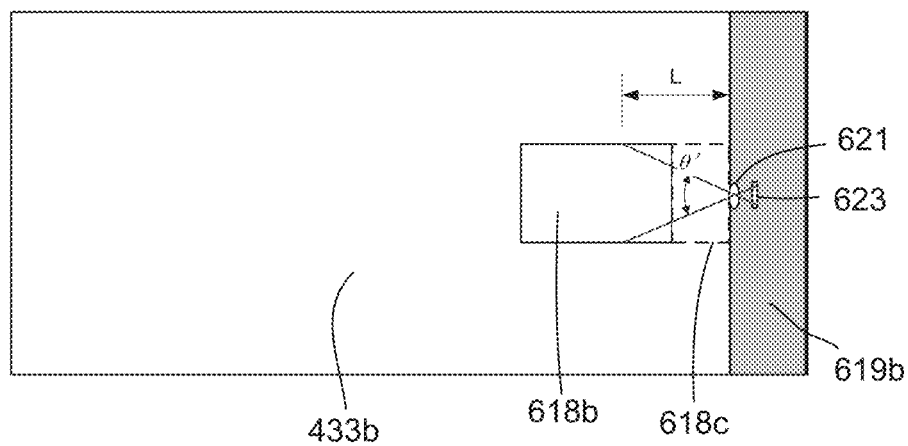

FIGS. 8A-8B show an example of further design considerations of the optical imaging design for the optical fingerprint sensor module shown in FIG. 7 by setting the detection angle θ' of the photodetector array relative in the display screen surface and the distance L between the lens 621 and the spacer 618. FIG. 8A shows a cross-sectional view along the direction perpendicular to the display screen surface, and FIG. 8B shows a view of the device from either the bottom or top of the displace screen. A filling material 618c can be used to fill the space between the lens 621 and the photodetector array 623. For example, the filling material 618c can be same material of the special spacer 618 or another different material. In some designs, the filling material 618c may the air space.

Figure 9:
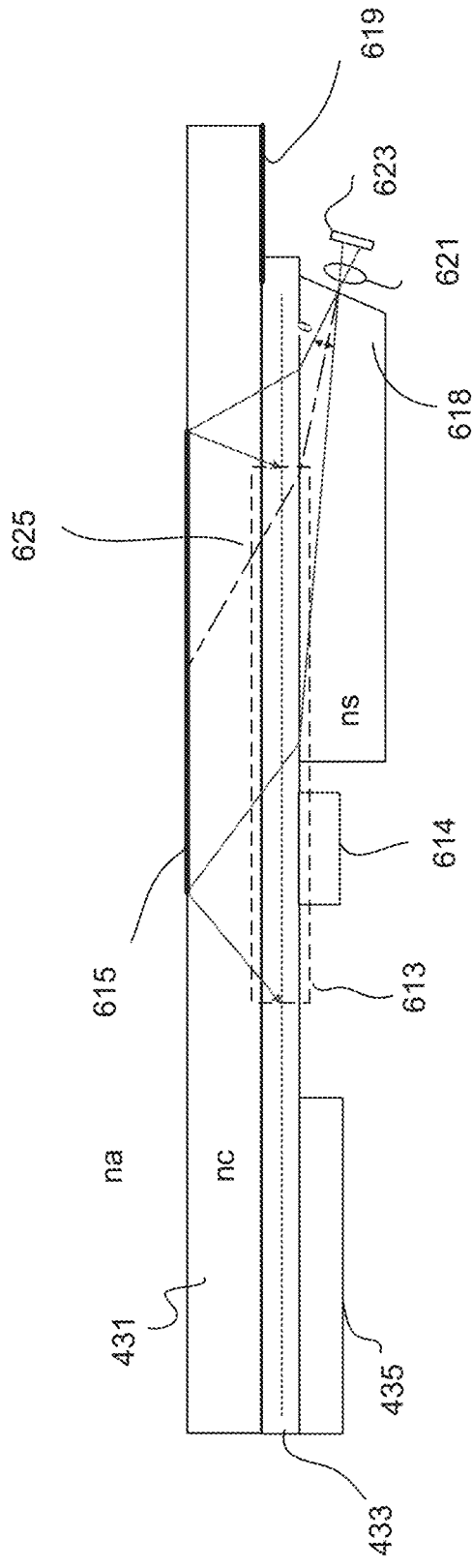

FIG. 9 shows another example of an under-screen optical fingerprint sensor module based on the design in FIG. 7 where one or more illumination light sources 614 are provided to illuminate the top surface sensing zone 615 for optical fingerprint sensing. The illumination light sources 614 may be of an expanded type, or be a collimated type so that all the points within the effective sensing zone 615 is illuminated. The illumination light sources 614 may be a single element light source or an array of light sources.

FIGS. 10A-10B show an example of an under-screen optical fingerprint sensor module that uses an optical coupler 628 shaped as a thin wedge to improve the optical detection at the optical sensor array 623. FIG. 10A shows a cross section of the device structure with an under-screen optical fingerprint sensor module for fingerprint sensing and FIG. 10B shows a top view of the device screen. The optical wedge 628 (with a refractive index ns) is located below the display panel structure to modify a total reflection condition on a bottom surface of the display panel structure that interfaces with the optical wedge 628 to permit extraction of light out of the display panel structure through the bottom surface. The optical sensor array 623 receives the light from the optical wedge 628 extracted from the display panel structure and the optical imaging module 621 is located between the optical wedge 628 and the optical sensor array 623 to image the light from the optical wedge 628 onto the optical sensor array 623. In the illustrated example, the optical wedge 628 includes a slanted optical wedge surface facing the optical imaging module and the optical sensing array 623. Also, as shown, there is a free space between the optical wedge 628 and the optical imaging module 621.

If the light is totally reflected at the sensing surface of the cover glass 431, the reflectance is 100%, of the highest efficiency. However, the light will also be totally reflected at the LCD bottom surface 433b if it is parallel to the cover glass surfaces. The wedge coupler 628 is used to modify the local surface angle so that the light can be coupled out for the detection at the optical sensor array 623. The micro holes in the LCD display module 433 provide the desired light propagation path for light to transmit through the LCD display module 433 for the under-screen optical sensing. The actual light transmission efficiency may gradually be reduced if the light transmission angle becomes too large or when the TFT layer becomes too thick. When the angle is close to the total reflection angle, namely about 41.8° when the cover glass refractive index is 1.5, the fingerprint image looks good. Accordingly, the wedge angle of the wedge coupler 628 may be adjusted to be of a couple of degrees so that the detection efficiency can be increased or optimized. If the cover glass' refractive index is selected to be higher, the total reflection angle becomes smaller. For example, if the cover glass is made of Sapphire which refractive index is about 1.76, the total reflection angle is about 34.62°. The detection light transmission efficiency in the display is also improved. Therefore, this design of using a thin wedge to set the detection angle to be higher than the total reflection angle, and/or to use high refractive index cover glass material to improve the detection efficiency.

In the under-screen optical fingerprint sensor module designs in FIGS. 6A-6C, 7, 8A-8B, 9, and 10A-10B, the sensing area 615 on the top transparent surface is not vertical or perpendicular to the detection axis 625 of the optical fingerprint sensor module so that the image plane of the sensing area is also not vertical or perpendicular to the detection axis 625. Accordingly, the plane of the photodetector array 523 can be tilted relative the detection axis 625 to achieve high quality imaging at the photodetector array 623.

Figure 11:
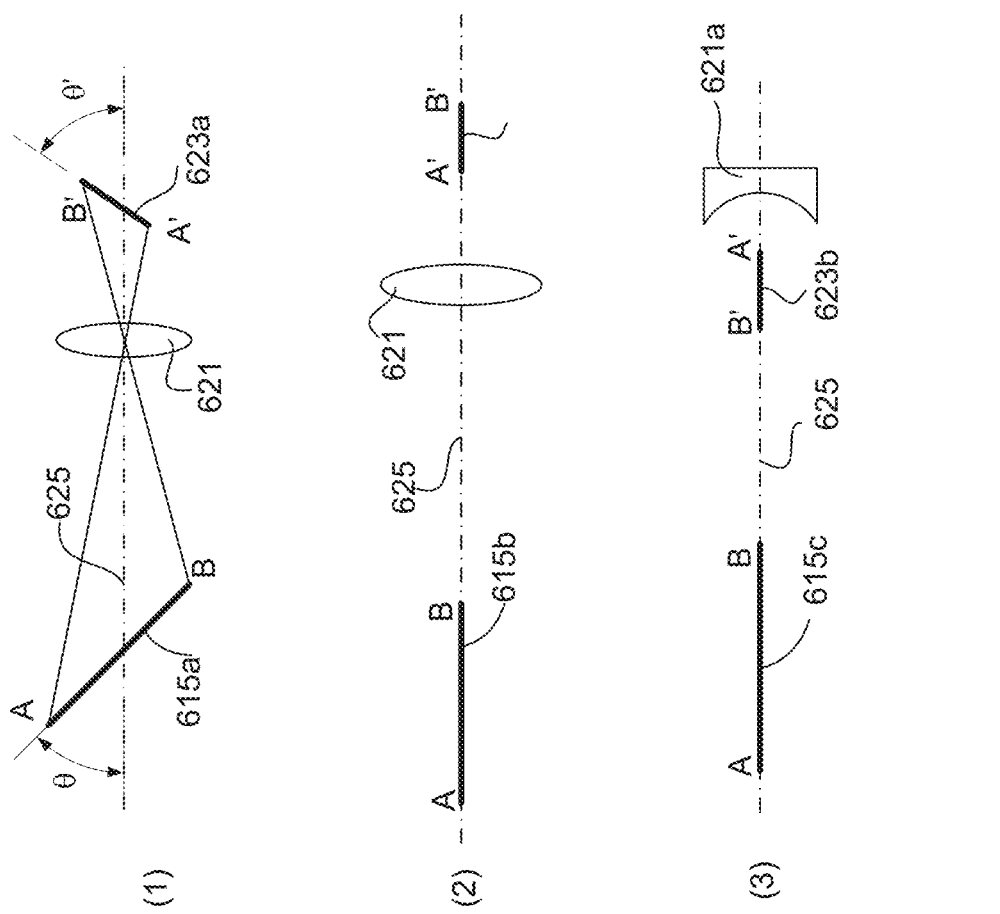
FIG. 11 illustrates imaging of the fingerprint sensing area on the top transparent layer via an imaging module under different tiling conditions where an imaging device images the fingerprint sensing area onto an optical sensor array and the imaging device may be optically transmissive or optically reflective according to some embodiments.

FIG. 11 shows three example configurations for this tilting. FIG. 11 (1) shows the sensing area 615a is tilted and is not perpendicular the detection axis 625. In a specified case shown in (2), the sensing area 615b is aligned to be on the detection axis 625, its image plane will also be located on the detection axis 625. In practice, the lens 621 can be partially cut off so as to simplify the package. In various implementations, the micro lens 621 can also be of transmission type or reflection type. For example, a specified approach is illustrated in (3). The sensing area 615c is imaged by an imaging mirror 621a. A photodiode array 623b is aligned to detect the signals.

In the above designs where the lens 621 is used, the lens 621 can be designed to have an effective aperture that is larger than the aperture of the holes in the LCD display layers that allow transmission of light through the LCD display module for optical fingerprint sensing. This design can reduce the undesired influence of the wiring structures and other scattering objects in the LCD display module.

Figure 12:
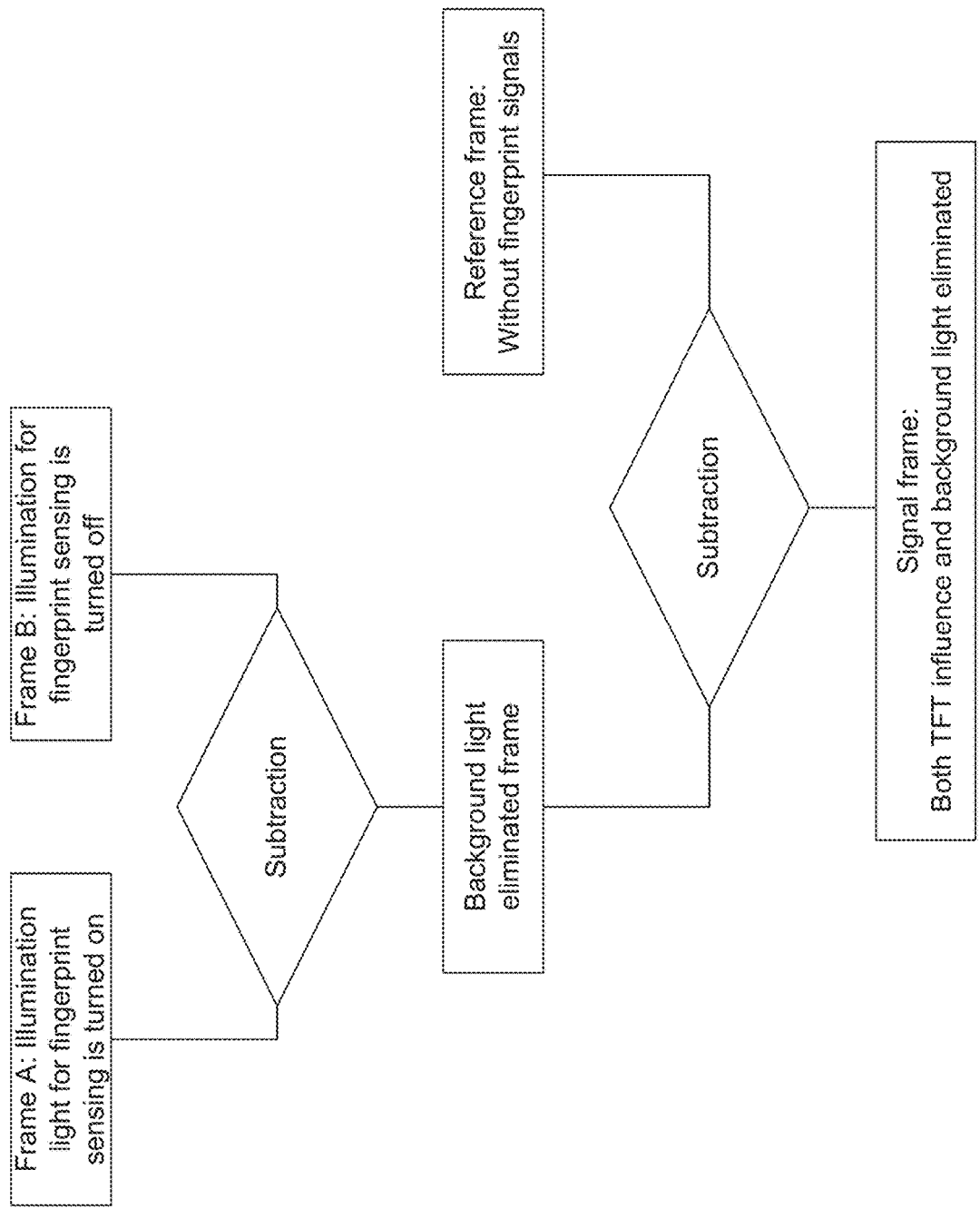
FIG. 12 is a flowchart illustrating an exemplary operation of a fingerprint sensor for reducing or eliminating undesired contributions from the background light in fingerprint sensing according to some embodiments.

FIG. 12 shows an example of an operation of the fingerprint sensor for reducing or eliminating undesired contributions from the background light in fingerprint sensing. The optical sensor array can be used to capture various frames and the captured frames can be used to perform differential and averaging operations among multiple frames to reduce the influence of the background light. For example, in frame A, the illumination light source for optical fingerprint sensing is turned on to illuminate the finger touching area, in frame B the illumination is changed or is turned off. Subtraction of the signals of frame B from the signals of frame A can be used in the image processing to reduce the undesired background light influence.

The undesired background light in the fingerprint sensing may also be reduced by providing proper optical filtering in the light path. One or more optical filters may be used to reject the environment light wavelengths, such as near IR and partial of the red light etc. In some implementation, such optical filter coatings may be made on the surfaces of the optical parts, including the display bottom surface, prism surfaces, sensor surface etc. For example, human fingers absorb most of the energy of the wavelengths under ~580 nm, if one or more optical filters or optical filtering coatings can be designed to reject light in wavelengths from 580 nm to infrared, undesired contributions to the optical detection in fingerprint sensing from the environment light may be greatly reduced.

Figure 13:
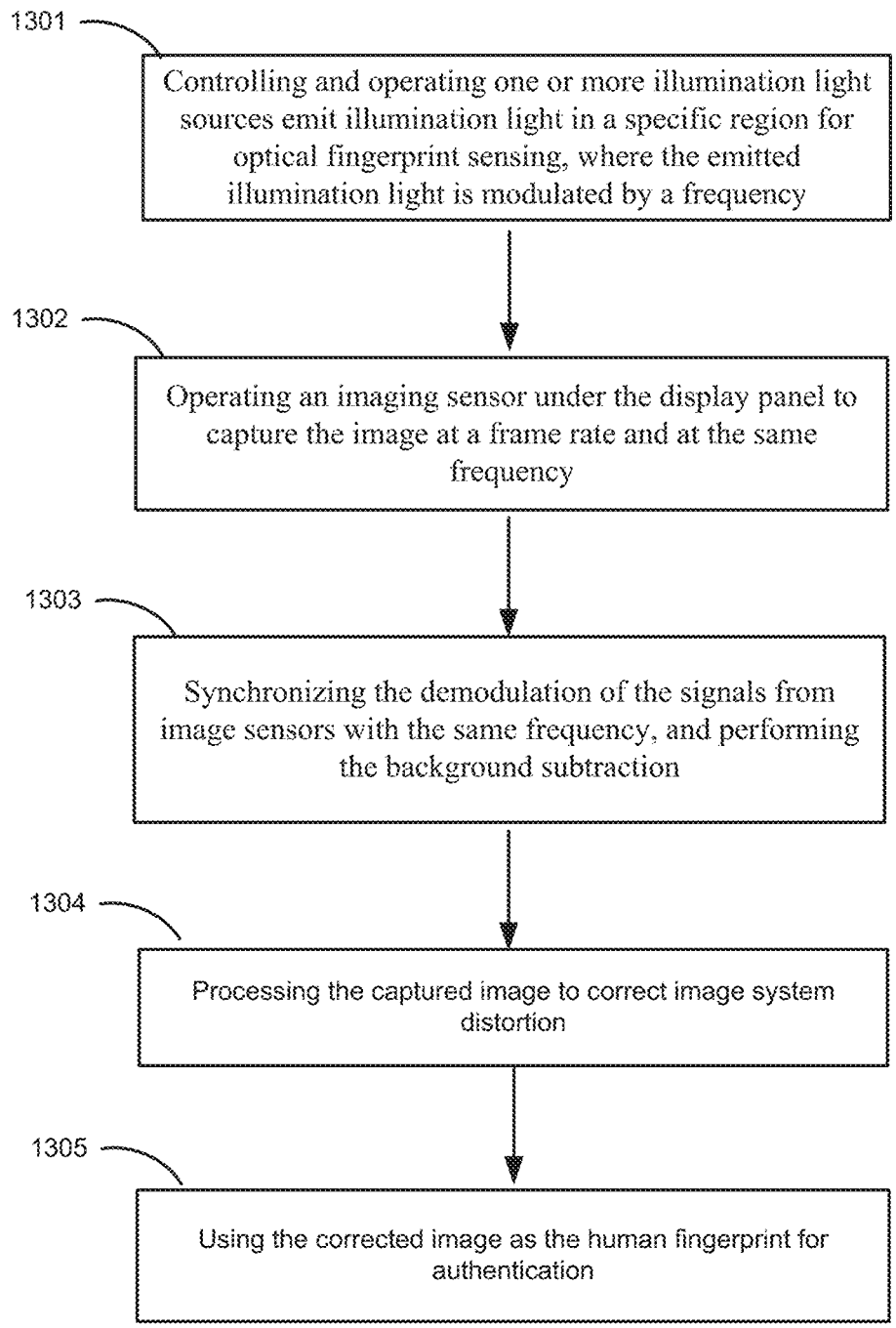
FIG. 13 is a flowchart illustrating an exemplary process for operating an under-screen optical fingerprint sensor module for capturing a fingerprint pattern according to some embodiments.

FIG. 13 shows an example of an operation process for correcting the image distortion in the optical fingerprint sensor module. At step 1301, the one or more illumination light sources are controlled and operated to emit light in a specific region, and the light emission of such pixels is modulated by a frequency F. Ate step 1302, an imaging sensor under the display panel is operated to capture the image at frame rate at same frequency F. In the optical fingerprint sensing operation, a finger is placed on top of the display panel cover substrate and the presence of the finger modulates the light reflection intensity of the display panel cover substrate top surface. The imaging sensor under the display captures the fingerprint modulated reflection light pattern. At step 1303, the demodulation of the signals from image sensors is synchronized with the frequency F, and the background subtraction is performed. The resultant image has a reduced background light effect and includes images from pixel emitting lights. At step 1304, the capture image is processed and calibrated to correct image system distortions. At step 1305, the corrected image is used as a human fingerprint image for user authentication.

The same optical sensors used for capturing the fingerprint of a user can be used also to capture the scattered light from the illuminated finger as shown by the back scattered light 191 in FIG. 5A. The detector signals from the back scattered light 191 in FIG. 5A in a region of interest can be integrated to produce an intensity signal. The intensity variation of this intensity signal is evaluated to determine other parameters beyond the fingerprint pattern, e.g., the heart rate of the user or inner topological tissues of a finger associated with the external fingerprint pattern.

The above fingerprint sensor may be hacked by malicious individuals who can obtain the authorized user's fingerprint, and copy the stolen fingerprint pattern on a carrier object that resembles a human finger. Such unauthorized fingerprint patterns may be used on the fingerprint sensor to unlock the targeted device. Hence, a fingerprint pattern, although a unique biometric identifier, may not be by itself a completely reliable or secure identification. The under-screen optical fingerprint sensor module can also be used to as an optical anti-spoofing sensor for sensing whether an input object with fingerprint patterns is a finger from a living person and for determining whether a fingerprint input is a fingerprint spoofing attack. This optical anti-spoofing sensing function can be provided without using a separate optical sensor. The optical anti-spoofing can provide high-speed responses without compromising the overall response speed of the fingerprint sensing operation.

Figure 14:
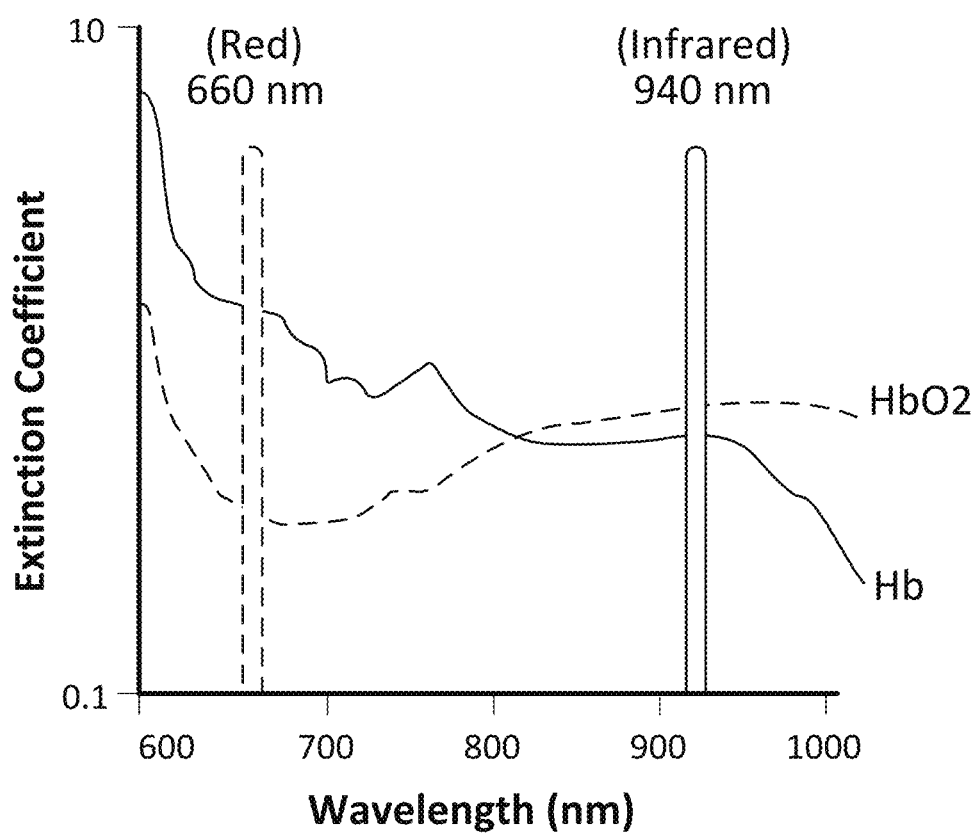
FIGS. 14-16 illustrates exemplary operation processes for determining whether an object in contact with the LCD display screen is part of a finger of a live person by illuminating the finger with light in two different light colors according to some embodiments.

FIG. 14 shows exemplary optical extinction coefficients of materials being monitored in blood where the optical absorptions are different between the visible spectral range e.g., red light at 660 nm and the infrared range, e.g., IR light at 940 nm. By using probe light to illuminate a finger at a first visible wavelength (Color A) and a second different wavelength such as an infrared (IR) wavelength (Color B), the differences in the optical absorption of the input object can be captured determine whether the touched object is a finger from a live person. The one or more illumination light sources for providing the illumination for optical sensing can be used to emit light of different colors to emit probe or illumination light at least two different optical wavelengths to use the different optical absorption behaviors of the blood for live finger detection. When a person' heart beats, the pulse pressure pumps the blood to flow in the arteries, so the extinction ratio of the materials being monitored in the blood changes with the pulse. The received signal carries the pulse signals. These properties of the blood can be used to detect whether the monitored material is a live-fingerprint or a fake fingerprint.

Figure 15:
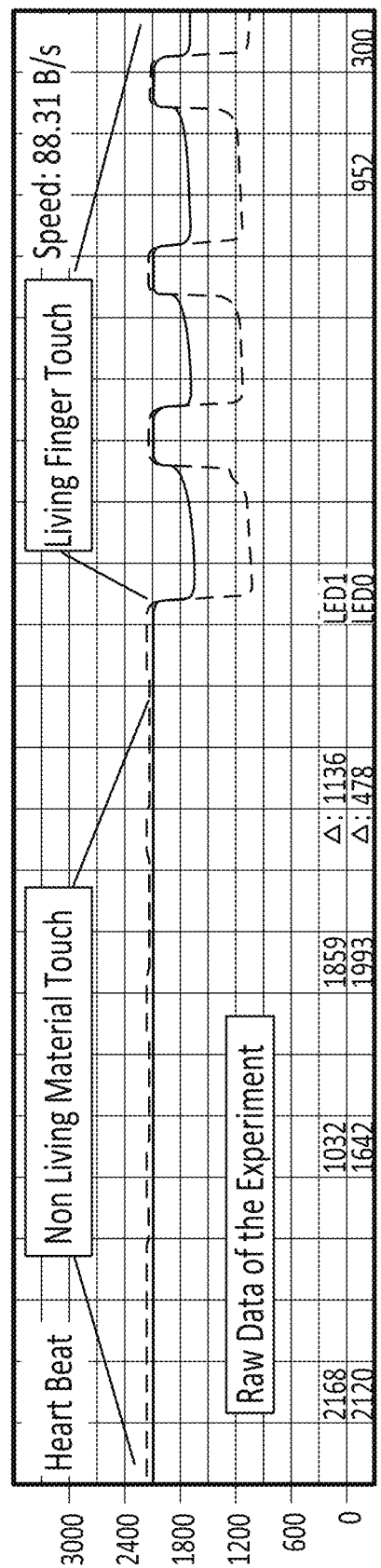

FIG. 15 shows a comparison between optical signal behaviors in the reflected light from a nonliving material (e.g., a fake finger or a spoof device with a fabricated fingerprint pattern) and a live finger. The optical fingerprint sensor can also operate as a heartbeat sensor to monitor a living organism. When two or more wavelengths of the probe light are detected, the extinction ratio difference can be used to quickly determine whether the monitored material is a living organism, such as live fingerprint. In the example shown in FIG. 15, probe light at different wavelengths were used, one at a visible wavelength and another at an IR wavelength as illustrated in FIG. 14.

When a nonliving material touches the top cover glass above the fingerprint sensor module, the received signal reveals strength levels that are correlated to the surface pattern of the nonliving material and the received signal does not contain signal components associated with a finger of a living person. However, when a finger of a living person touches the top cover glass, the received signal reveals signal characteristics associated with a living person, including obviously different strength levels because the extinction ratios are different for different wavelengths. This method does not take long time to determine whether the touching material is a part of a living person. In FIG. 15, the pulse-shaped signal reflects multiple touches instead of blood pulse. Similar multiple touches with a nonliving material does not show the difference caused by a living finger.

This optical sensing of different optical absorption behaviors of the blood at different optical wavelengths can be performed in a short period for live finger detection and can be faster than optical detection of a person's heart beat using the same optical sensor.

In LCD displays, the LCD backlighting illumination light is white light and thus contains light at both the visible and IR spectral ranges for performing the above live finger detection at the optical fingerprint sensor module. The LCD color filters in the LCD display module can be used to allow the optical fingerprint sensor module to obtain measurements in FIGS. 14 and 15. In addition, the designated light sources 436 for producing the illumination light for optical sensing can be operated to emit probe light at the selected visible wavelength and IR wavelength at different times and the reflected probe light at the two different wavelengths is captured by the optical detector array 623 to determine whether touched object is a live finger based on the above operations shown in FIGS. 14 and 15. Notably, although the reflected probe light at the selected visible wavelength and IR wavelength at different times may reflect different optical absorption properties of the blood, the fingerprint image is always captured by both the probe light the selected visible wavelength and the probe light at the IR wavelength at different times. Therefore, the fingerprint sensing can be made at both the visible wavelength and IR wavelength.

Figure 16:
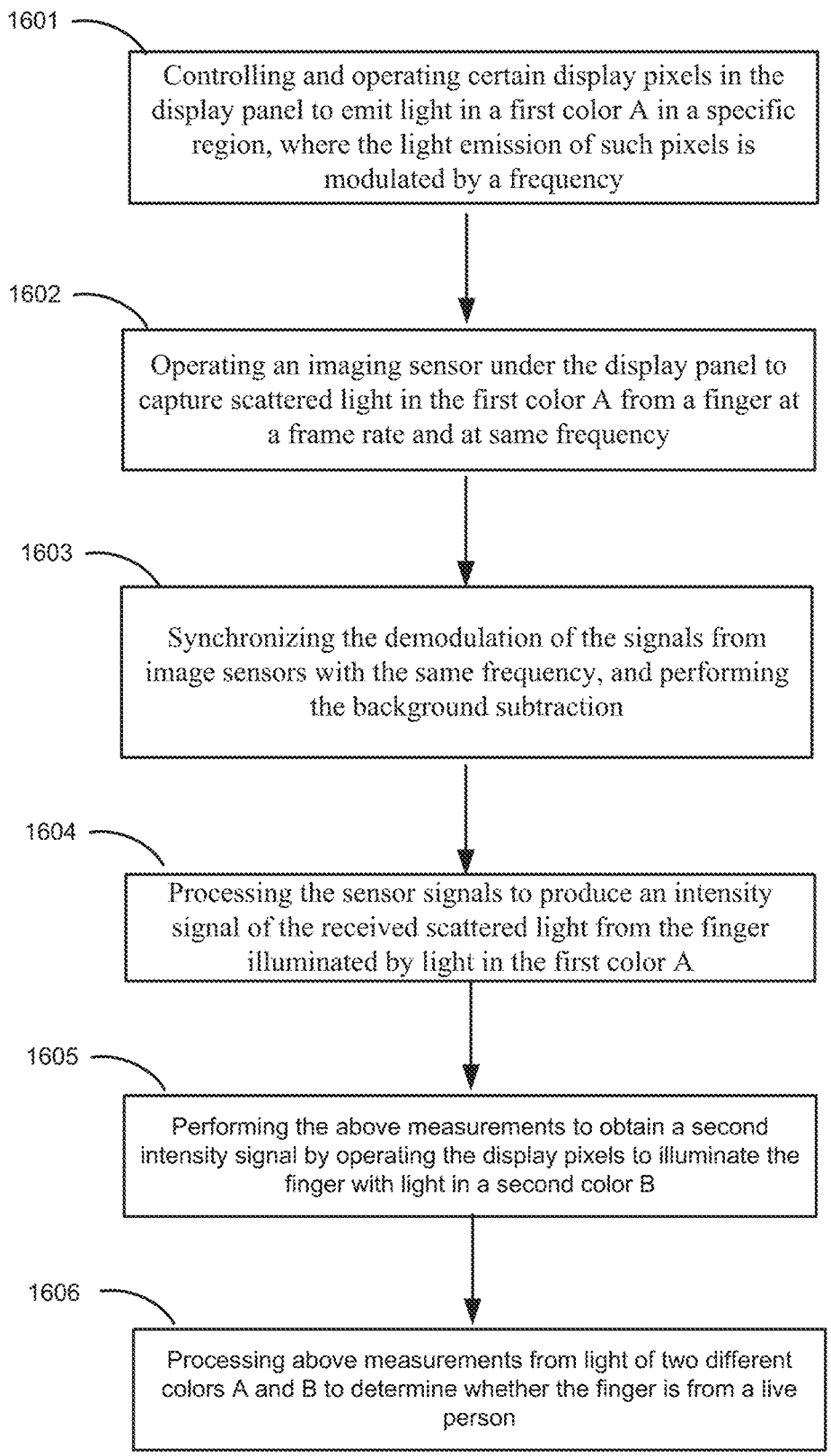

FIG. 16 shows an example of an operation process for determining whether an object in contact with the LCD display screen is part of a finger of a live person by operating the one or more illumination light sources for optical sensing to illuminate the finger with light in two different light colors.

For yet another example, the disclosed optical sensor technology can be used to detect whether the captured or detected pattern of a fingerprint or palm is from a live person's hand by a "live finger" detection mechanism by other mechanisms other than the above described different optical absorptions of blood at different optical wavelengths. For example, a live person's finger tends to be moving or stretching due to the person's natural movement or motion (either intended or unintended) or pulsing when the blood flows through the person's body in connection with the heartbeat. In one implementation, the optical fingerprint sensor module can detect a change in the returned light from a finger or palm due to the heartbeat/blood flow change and thus to detect whether there is a live heartbeat in the object presented as a finger or palm. The user authentication can be based on the combination of the both the optical sensing of the fingerprint/palm pattern and the positive determination of the presence of a live person to enhance the access control. For yet another example, as a person touches the LCD display screen, a change in the touching force can be reflected in one or more ways, including fingerprint pattern deforming, a change in the contacting area between the finger and the screen surface, fingerprint ridge widening, or a change in the blood flow dynamics. Those and other changes can be measured by optical sensing based on the disclosed optical sensor technology and can be used to calculate the touch force. This touch force sensing can be used to add more functions to the optical fingerprint sensor module beyond the fingerprint sensing.

In the above examples where the fingerprint pattern is captured on the optical sensor array via an imaging module as in FIG. 4B and FIG. 6B, optical distortions tend to degrade the image sensing fidelity. Such optical distortions can be corrected in various ways. For example, a known pattern can be used to generate an optical image at the optical sensor array and the image coordinates in the know pattern can be correlated to the generated optical image with distortions at the optical sensor array for calibrating the imaging sensing signals output by the optical sensor array for fingerprint sensing. The fingerprint sensing module calibrates the output coordinates referencing on the image of the standard pattern.

In light of the disclosure in this patent document, various implementations can be made for the optical fingerprint sensor module as disclosed.

For example, a display panel can be constructed in which each pixel emitting lights, and can be controlled individually; the display panel includes an at least partially transparent substrate; and a cover substrate, which is substantially transparent. An optical fingerprint sensor module is placed under the display panel to sense the images form on the top of the display panel surface. The optical fingerprint sensor module can be used to sense the images form from light emitting from display panel pixels. The optical fingerprint sensor module can include a transparent block with refractive index lower than the display panel substrate, and an imaging sensor block with an imaging sensor array and an optical imaging lens. In some implementations, the low refractive index block has refractive index in the range of 1.35 to 1.46 or 1 to 1.35.

For another example, a method can be provided for fingerprint sensing, where light emitting from a display panel is reflected off the cover substrate, a finger placed on top of the cover substrate interacts with the light to modulate the light reflection pattern by the fingerprint. An imaging sensing module under the display panel is used to sense the reflected light pattern image and reconstruct fingerprint image. In one implementation, the emitting light from the display panel is modulated in time domain, and the imaging sensor is synchronized with the modulation of the emitting pixels, where a demodulation process will reject most of the background light (light not from pixels being targeted).

III. Lens-Pinhole Imaging Designs for Under-Display Optical Sensing

In various implementations of the under-screen optical fingerprint sensor module technology for fingerprint sensing disclosed herein, an imagine module having at least one imaging lens can be used to achieve the optical imaging of the illuminated touched portion of a finger onto the optical sensor array in the under-screen optical fingerprint sensor module. The lensing effect of the imaging module is in part for controlling the spatial spreading of the returned light that may spatially scramble returned light from different locations on the touched portion of the finger at the optical sensor array so that the spatial information on the returned light corresponding to the fingerprint pattern on a finger can be preserved by the imaging lens with a desired spatial imaging resolution when the imaging lens directs the returned light to reach the optical sensor array. The spatial imaging resolution of an imaging module having a single imaging lens or an assembly of two or more imaging lenses is proportional to the numerical aperture of the imaging module. Accordingly, a high-resolution imaging lens requires a large numerical aperture and thus a lens with a large diameter. This aspect of a lens-based imaging module inevitably requires a bulking lens system to produce a high-resolution imaging system. In addition, a given imaging lens has a limited field of view which increases as the focal length decreases and decreases as the focal length increases.

In many fingerprint sensing applications such as optical fingerprint sensors implemented under a display screen in a mobile device, it is desirable to have a compact imaging system with a high spatial imaging resolution and a large field of view. In view of the trade-offs in various imaging features of a lens-based imaging system discussed above, a compact optical imaging system for optical fingerprint sensing is provided below by combining a lens and a pinhole as a lens-pinhole imaging system where the les is used to form a lens-based imaging system to achieve a high spatial imaging resolution via the lens and a reduced size in the captured image at the optical detector array to reduce the size the optical detector array via the same lens and the pinhole is placed in front of the lens to produce a large field of view in optical imaging by effectuating a pinhole camera without requiring a lens of a large diameter. A conventional pinhole camera can include a small aperture for optical imaging and can produce a large field of view while suffering a limited image brightness due to the small aperture and a low spatial imaging resolution. A combination of an imaging lens and a pinhole camera, when properly designed, can benefit from the high spatial imaging resolution of the imaging lens and the large field of view of the pinhole camera.

Figure 17:
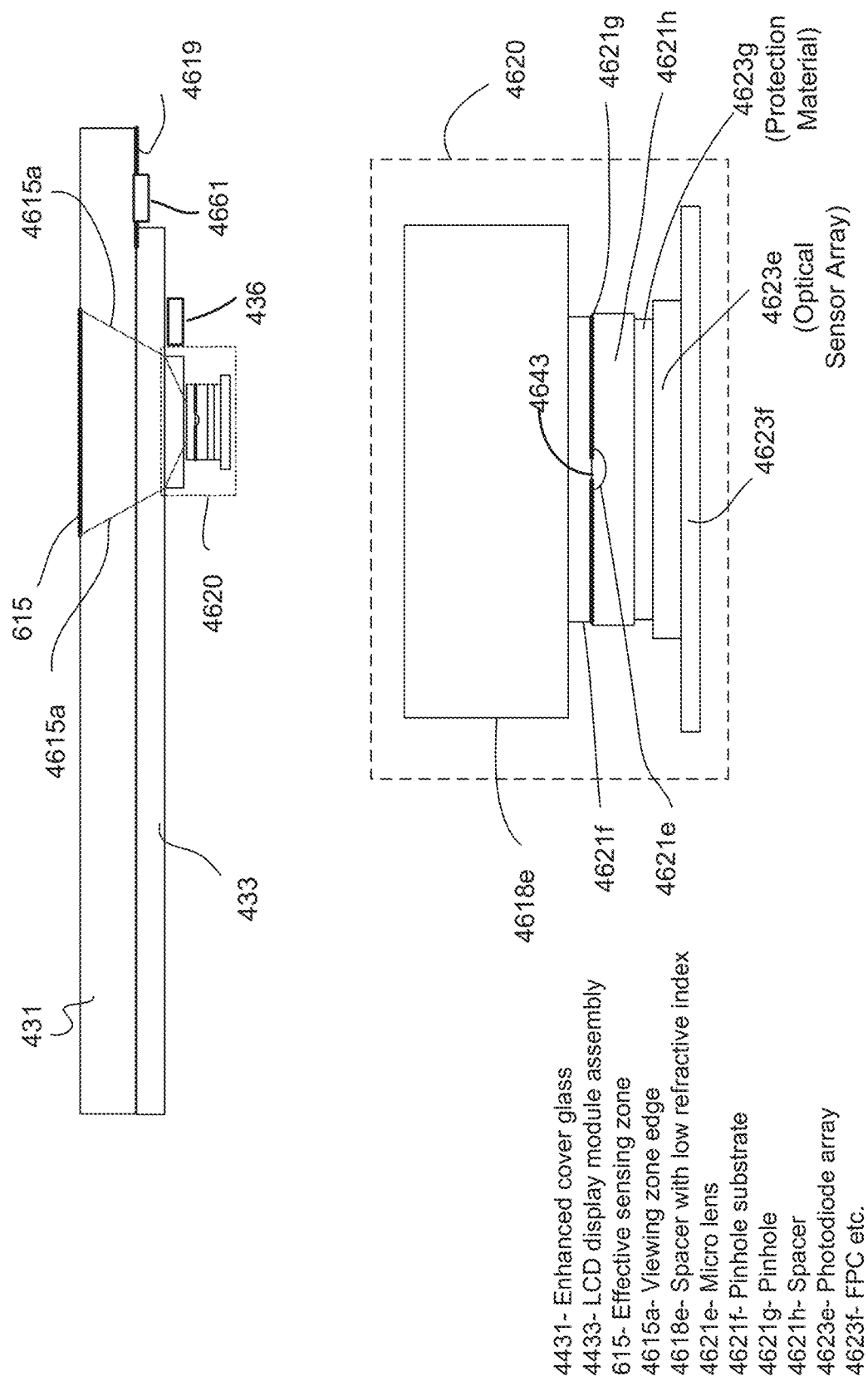

FIG. 17 shows one example of an optical fingerprint sensor module 4620 placed under an LCD display screen where a pinhole and a lens are used to form the optical imaging system for the optical fingerprint sensor module 4620. One or more illumination light sources 436 are provided at a location under the LCD display module 433 to produce illumination light to pass through the LCD display module 433 and the top transparent layer 431 which includes a sensing zone 615 on the top surface of the transparent layer 431. One or more illumination light sources 4661 are provided under the top transparent layer 431 provided to produce illumination light to sensing zone 615 on the top surface of the transparent layer 431. The one or more illumination light sources 436 may be located in or next to the optical fingerprint sensor module 4620 to provide, in addition to providing illumination for fingerprint sensing, a breathing light indicator to indicate that the optical fingerprint sensing is in progress or the optical fingerprint sensor module 4620 is turned on or activated.

In the illustrated example in FIG. 17, the optical sensing module 4620 is a compact module by using a micro lens 4621e with a small diameter that can be about the same size of the pinhole so slightly larger than the pinhole. The micro lens 4621e is engaged to a pinhole structure 4621g that is optically opaque and may be a layer of a blackened or metal material formed on a surface of a pinhole substrate 4621f of an optically transparent material with an opening as the pinhole 4643. The micro lens 4621e is placed on the lower side of the pinhole substrate 4621f. In operation, the optical layers above the pinhole 4643 in the pinhole structure 4621g are structured to produce a large optical field of view in collecting the returned light from the LCD display panel and to transmit the collected light towards the optical sensor array 4623e. The optical detectors in the optical sensor array 4623e respond to the received optical pattern to produce detector signals and a detector circuitry module 4623f is coupled to the optical sensor array 4623e to receive and process the detectors signals. The detector circuitry module 4623f may include, in some implementations, a flexible printed circuit (PFC). The micro lens 4621e receives the transmitted light from the pinhole and to focus the received light onto the optical sensor array 4623e for optical imaging at an enhanced spatial imaging resolution at the optical sensor array 4623e when compared to a lower spatial imaging resolution of the pinhole in projecting light onto the optical sensor array 623e without the micro lens 4621e. In this design, the low resolution of the pinhole is compensated by using the micro lens 4621e and the limited field of view of the micro lens 4621e is compensated by the large field of view of the assembly of the low-index layer 4618e, a high-index layer 4621f and the pinhole 4643.

In the illustrated example of using the pinhole-lens assembly for optical imaging in FIG. 17, the object plane of the pinhole-lens assembly is near the top effective sensing zone 615 on the top surface of the transparent layer 4431 such as a cover glass for the touch sensing LCD display panel and the imaging plane of the pinhole-lens assembly is the receiving surface of the optical detectors of the optical sensor array 4623e. In addition to the pinhole substrate 4621f, an optically transparent spacer 4618e with a refractive index lower than that of the pinhole substrate 4621f is provided between the pinhole substrate 621f and the LCD display panel. This use of a lower index material above the pinhole substrate 4621f is part of the optical design to achieve a large field of view for receiving light from the LCD display panel. In some implementations, the lower-index spacer 4618e may be an air gap. This design provides an optical interface of two different optical materials between lower-index spacer 4618e and the higher-index pinhole substrate 4621f and the optical refraction at this interface converts a large field of view (FOV) (e.g., around 140 degree in some cases) of incident light from the LCD display panel in the lower-index spacer 4618e into a smaller FOV in the higher-index pinhole substrate 4621f Accordingly, the output light rays produced by the pinhole-lens assembly have a relatively small FOV.

This design of reducing the FOV can be advantageous in several aspects. First, the optical input FOV in the lower-index spacer 4618e of the optical fingerprint sensor module 4620 allows the input to have a large FOV. Second, the actual FOV handled at by the pinhole-lens assembly located below the higher-index pinhole substrate 4621f is a reduced FOV with respect to the optical input FOV so that light rays with large incident angles are limited by this reduced FOV. This is beneficial because image distortions caused by light rays at large incident angles at the pinhole-lens assembly are reduced by this reduced FOV. In addition, this reduced FOV at the pinhole-lens assembly reduces the undesired pinhole shading effect that would distort the brightness distribution of the image at the optical sensor array.

Different from a convention pinhole camera with uses a pinhole with a diameter around 40 microns in some pinhole camera designs, the pinhole 4643 formed in the opaque layer 4621g is designed to have a diameter much larger than the typical size of a pinhole in a pinhole camera, e.g., greater than 100 microns, or 200 microns (e.g., 250 microns) in some designs. In this combination of the lens and the pinhole, the use of the high-index material for the pinhole substrate 4612f just above the pinhole 4643 and the use of the lower-index layer 4618e above the pinhole substrate 4612f allows the pinhole 4643 to have a diameter much larger than the typical size of a pinhole in a pinhole camera while still achieving a large FOV. For example, in some implementations, the diameter of the pinhole 4643 may be about the same as or similar to the radius of curvature of the curve surface of the lens 4621e when structured as a half ball lens with a flat surface facing the pinhole 4643 and a partial spherical surface that directs the light from the pinhole 643 towards the photodetector array 4621e.

Additional design features can also be implemented to improve the overall optical performance and the compactness of the optical imaging system based on the pinhole-lens assembly. For example, as illustrated in FIG. 17, additional optical layers can be placed between the lens-pinhole assembly and the photodiode array 4623e. In this example, an optically transparent spacer 4621h and a protection layer 4623g are provided in the light path from the pinhole-lens assembly to the optical sensor array 4623e. In some implementations, the spacer 4621h may be a low-index layer such as an air gap, and the protection layer 4623g may be a layer covering the top of the optical detectors of the optical sensor array 4623e and having a refractive index higher than that of the spacer 4621h. The layers 4621h and 4623g can be structured to reduce or eliminate the imaging distortion at the optical sensor array 4623e. When light is refracted at media interfaces, the nonlinearity in the directions of refracted rays exists and creates image distortions at the optical sensor array 4623e. Such distortions become more pronounced when the incident angles are large. To reduce such distortions, the optical thickness ratio of spacer 4621h and 4623g can be selected in light of the optical structure of the pinhole-lens assembly and the optical objective field of the pinhole-lens assembly (e.g., the optical layers from the top sensing surface of the top glass layer 4431 to the pinhole substrate 4621f).

Optical distortions occur at each interface of different optical materials along the optical path of light from the top of the LCD display panel to the optical sensor array 4623e. One design technique for reducing such optical distortions is to provide optically matching structures on lower side of the pinhole-lens assembly (i.e., the optical layers on the imaging side of the pinhole-lens assembly) to corresponding to optical structures on the upper side of the pinhole-lens assembly (i.e., the optical layers on the object side of the pinhole-lens assembly) so that an optical distortion incurred at one interface along the optical path from the LCD panel to the pinhole-lens assembly in the object side of the pinhole-lens assembly is countered or offset by optical refraction at a matching interface along the optical path from the pinhole-lens assembly to the optical sensor array 4623e in the imaging side of the pinhole-lens assembly. The optical matching layers in the imaging side of the pinhole-lens assembly are designed by taking into account of the optical power of the lens in the pinhole-lens assembly. In a pinhole imaging system with the pinhole 4643 alone without the lens 4621e, optical distortions are present when the media are not matched between the object and the image fields. Such optical distortions may be in form of a barrel distortion when the FOV is large by using a grid pattern placed over the top sensing surface to test the distortions. The barrel distortions caused by the un-matched optical layers between the object and the image fields of the pinhole 4643 is undesirable because they directly impact the accuracy of the fingerprint pattern captured by the optical sensor array 4623e. It is noted that the level of such distortions is usually higher in the central part of the imaging field at the optical sensor array 4623e than the peripheral part.

To mitigate such distortions, material layers below the pinhole 4643 and the lens 4621e in the imaging field can be structured in terms of their refractive indices and thickness values to reverse the distortions introduced by the material layers in the object side. This is achieved by matching the refraction behavior at large incident angles so as to correct the image to be linearly formed on the detector surface. For example, in a pinhole imaging system with an imaging magnification at $1/5$, if there are a glass layer of 2 mm thick and an air gap layer of 1 mm thick above the pinhole 4643, a glass layer of 0.4 mm thick and an air gap of 0.25 mm thick can be provided below the pinhole 4643 and above the optical sensor array 4623e to reduce the optical distortions at the optical sensor array 4623e. This technique can be applied to provide matching layers below the pinhole 4643 for complex material layers above the pinhole 4643.

Figure 18:
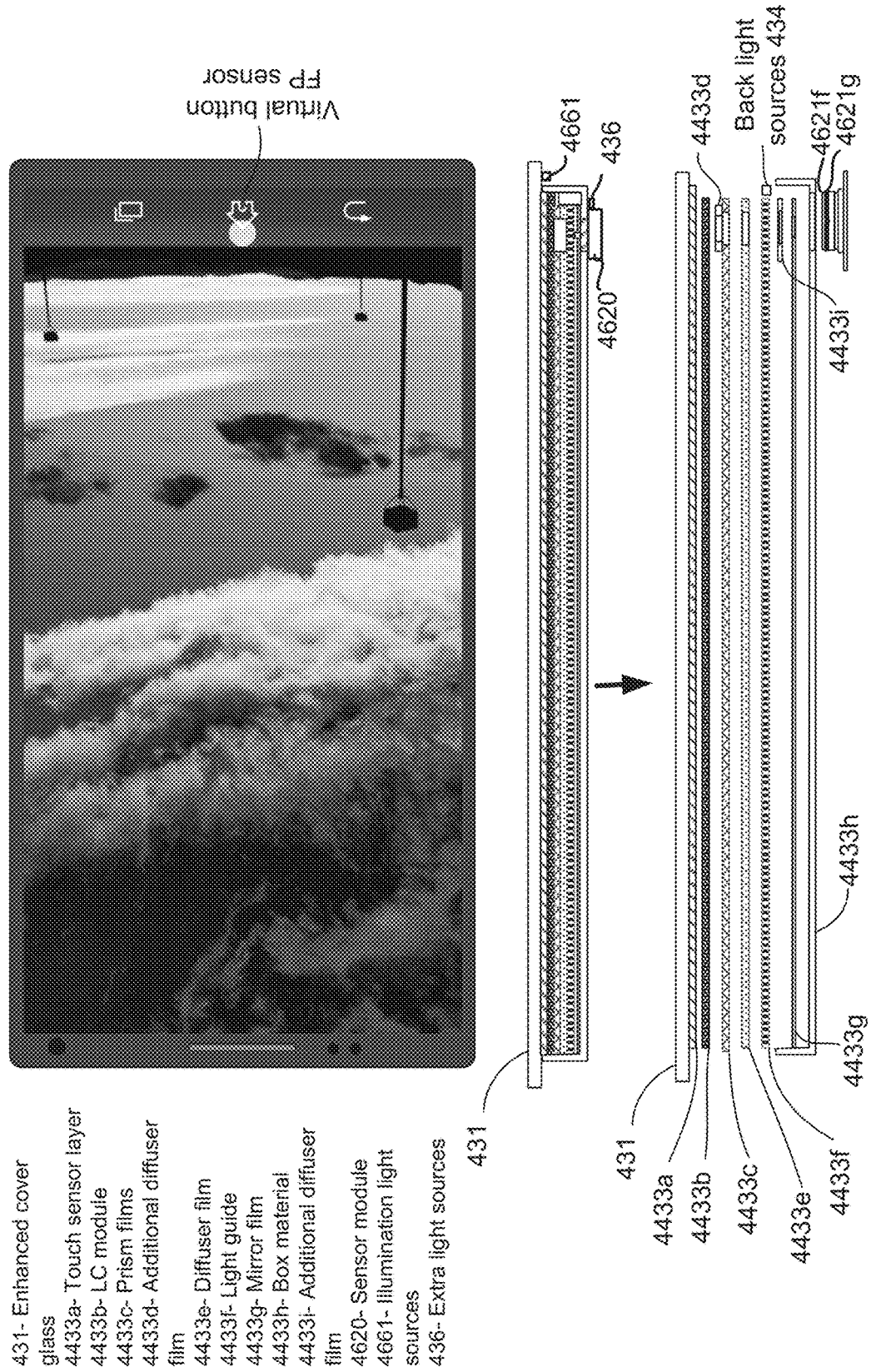

FIG. 18 shows an example of different layers in the LCD display module above the optical fingerprint sensor module. In this embodiment, the sensor module 4620 is integrated under the LCD display module. Illumination light sources 4661 and extra light sources 4664 are also integrated in or close to the sensor module 4620. The virtual button for the optical fingerprint (FP) sensing shown within the LCD display screen near the edge is virtual because it is on an area of the contiguous top surface across the entire display (there is no separate physical button for fingerprint sensing) and is a displayed area that is indicated as the effective sensing zone 615 (FIG. 17) for fingerprint sensing.

In the example in FIG. 18, the materials in the LCD backlighting components of the LCD display module are designed to provide optical transmission paths to allow returned probe light from the top sensing zone to reach the underlying optical fingerprint sensor module below the LCD display module. Light transmitting holes or slits can be formed in such materials. To modify the appearance of the display at the optical sensor position to make the optical sensor less visible, a diffuser film 4433d may be integrated with the prisms 4433c above the backlighting waveguide layer 4433f to diffuse the light towards the LCD pixels for uniform illumination, and additional diffuser 4433i may be integrated with the mirror film 4433g that is below the backlighting waveguide layer 4433f and reflects or recycles backlighting light back to the LCD layers to improve the illumination efficiency. In some implementations, the additional diffuser films 4433d and 4433i may be shaped as stripes around edges around the optical fingerprint sensor module to diffuse the light scattered in the light paths so that the light path edges around the optical fingerprint sensor module under the LCD display module are hidden and or less visible.

Figure 19:
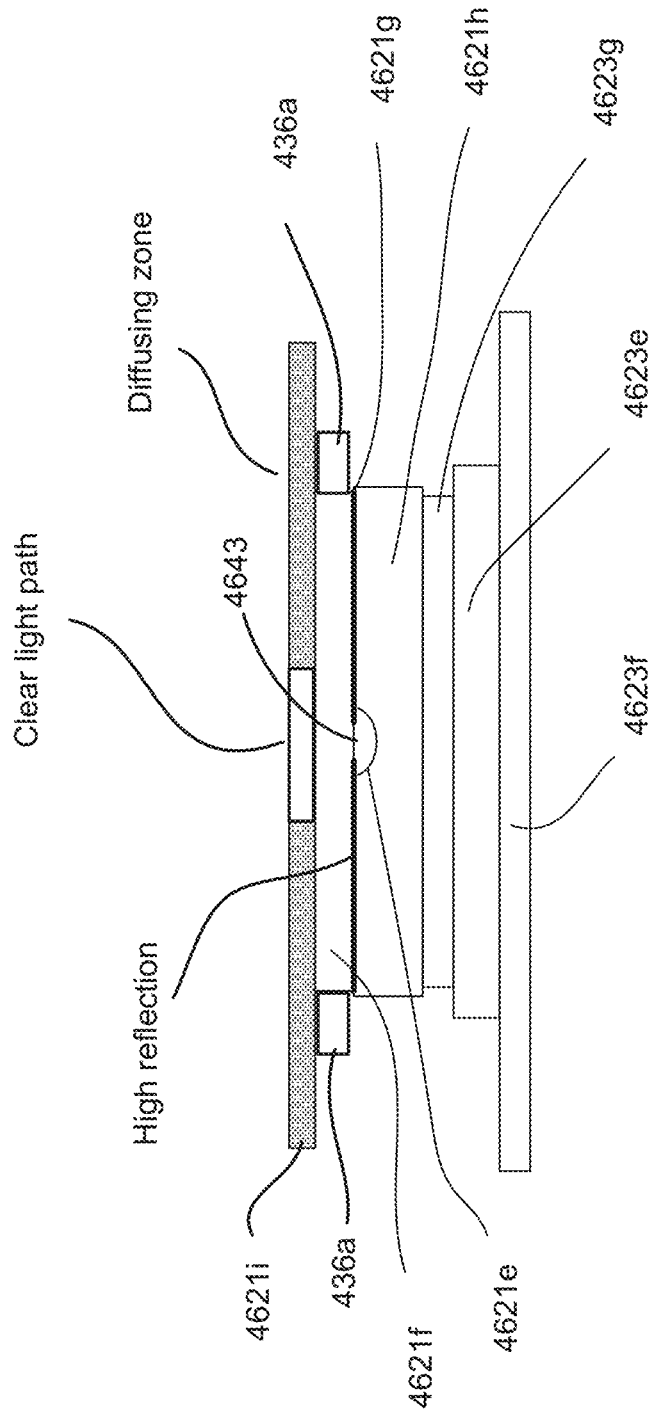

FIG. 19 shows an example implementation of the design in FIG. 17 where the pinhole layer coating 4621g on the bottom surface of the pinhole substrate 4621f is structured to have a high optical reflection at its upper side facing the pinhole substrate 4621f. This feature is used to compensate the regional reflection of the mirror film hole or the optical reflector layer or diffusion layer in the LCD layers above the optical fingerprint sensor module 4620.

In some implementations, an additional diffuser layer 4621i may be applied on top of the pinhole substrate 4621f as shown in FIG. 19 to cause optical diffusion and the central part of the additional diffuser layer 4621i can include a clear light path to receive the returned light from the LCD display module for optical sensing.

Furthermore, FIG. 19 shows an example location of one or more extra light sources 436a installed under the additional diffuser layer 4621i. The light emitted from the extra light sources 436a is scattered by the diffuser 4621i. The extra light sources 436a may emit light of different optical wavelengths, e.g., including wavelengths for finger illumination and other wavelengths for other functions, such as breathing light function etc.

Figure 20:
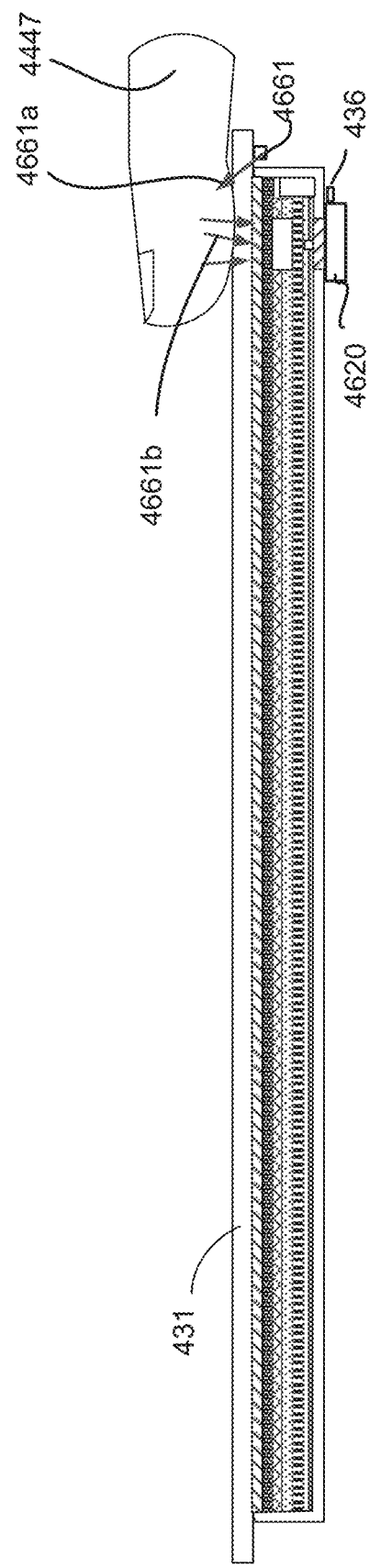

FIG. 20 shows an example where one or more under cover glass light sources 4661 are provided to illuminate the touching finger 4447 for optical sensing. The light produced by one or more under cover glass light sources 4661 is represented by light 4661a and can transmit into the finger tissues or propagate through the corneum of the finger skin. For example, when light 4661a transmits through the finger skin and penetrates into the finger tissues, the light is scattered by the finger tissues. A part of the scattered light comes out as the signal light 4661b carrying the fingerprint information including information on topological inner tissue structures associated with the external fingerprint pattern and is detected by the optical fingerprint sensor module 4620. The signal light 4661b is incident to the sensing zone on the top glass at a large angle can capture and carry the fingerprint information when the skin is wet or dry. Hence, using the one or more under cover glass light sources 4661 can improve the sensor's detection performance and reliability.

The pinhole-lens assembly for optical imaging in the example in FIG. 17 can achieve a higher spatial imaging resolution to capture fine features in the captured images beyond the spatial imaging resolution of the system with the pinhole 4643 alone without the lens 4621e. This higher spatial imaging resolution is a result of having the lens 4621e. FIGS. 21A and 21B illustrates the imaging operation of the pinhole alone and the imaging operation of the pinhole-lens assembly.

Referring to FIG. 21A showing a pinhole imaging system without the lens, the pinhole 4643 diffracts the incident light beam 4661 to produce a diffracted the output light beam 4673 that is divergent due to the diffraction by the pinhole 4643. This divergent light beam 4673 forms an image light spot 4679 at the imaging plane 4667 that reflects the resolution of this imaging system.

FIG. 21B shows a micro lens 4621e is added under the pinhole 4643. As a result of this combining the micro lens 4621e and the pinhole 4643, the curvature of the micro lens 4621e modifies the wave-front of the light beam diffracted by the pinhole 4643 to produce a light spot 4681 at the imaging plane 4667 which is smaller than the light spot 4679 produced by the pinhole 4643 alone without the lens 4621e.

The pinhole-lens assembly can be implemented to provide a compact optical fingerprint sensor module 4620 in the example in FIG. 17. Due to the refraction at the media interfaces, the light propagation angle can be controlled by using different optical materials. For example, as shown in FIG. 22, if the refractive index n1 in the media above the pinhole substrate 4621f is lower than the refractive index n2 of the pinhole substrate 4621f, a light beam 4683 with a large incident angle is bent to a beam 4685 with a smaller angle after entering the pinhole substrate 4621f. Therefore, an extremely large field of view can be realized for receiving input light at the object side of the pinhole-lens assembly by using a higher index material for the pinhole substrate 4621f. In some implementations, a large FOV (e.g., close to or above 140 degrees) may be achieved by using a high-index material for the pinhole substrate 4621f to create a sufficiently large difference between the refractive indices the pinhole substrate 621f and the layer above the pinhole substrate 4621f.

The above design for achieving a large diffraction bending of light rays at the top surface of the pinhole substrate 4621f can be used to reduce the thickness of the optical fingerprint sensor module by incorporating some low refractive index gaps (such as air gaps) in the light path. In addition, the image uniformity of the image from the pinhole-lens assembly can be improved because the tilting angles of light rays entering the lens underneath the pinhole substrate are reduced with a smaller FOV due to the large refraction on the top of the pinhole substrate 4621e.

In the pinhole-lens assembly, the micro lens is placed underneath the pinhole 4643 and thus the optical aperture of the micro lens is small due to the small opening of the pinhole 4643. As such, the micro lens exhibits lower aberrations because light rays from the pinhole 4643 collected by the micro lens generally are close to the axis of the curved surfaces of the micro lens.

In implementing this pinhole-lens assembly, the center of the pinhole 4643 is placed at or close to the center of the surface of the micro lens 4621e. In the example in FIG. 22, a half ball lens is shown as an example and is engaged onto (e.g., being glued) a pinhole board to achieve this configuration. The flat surface of the half ball lens 4621e faces up to engage to the pinhole 643 and the center of the flat surface of the half ball lens 4621e is at or near the center of the pinhole 4643. Under this design, incident light, at both small or large incident angles to the flat surface of the half ball lens 4621e via the pinhole 4643, would have its light ray direction to coincide with a radial direction of the half ball lens 4621e which is the optical axis of the lens in that direction. This configuration reduces optical aberrations. For light beams 4663 and 4683 with different incident angles at the top of the pinhole substrate 4621f, their light paths are modified after entering the pinhole substrate 4621f to be close to the respective optical axes 4689 and 4691 of the half ball lens surface. Therefore, under this specific design, the image light spots 4681 and 4693 formed by the light beams 4663 and 4683 exhibit low optical aberrations although they have different incident angles.

Figure 23:
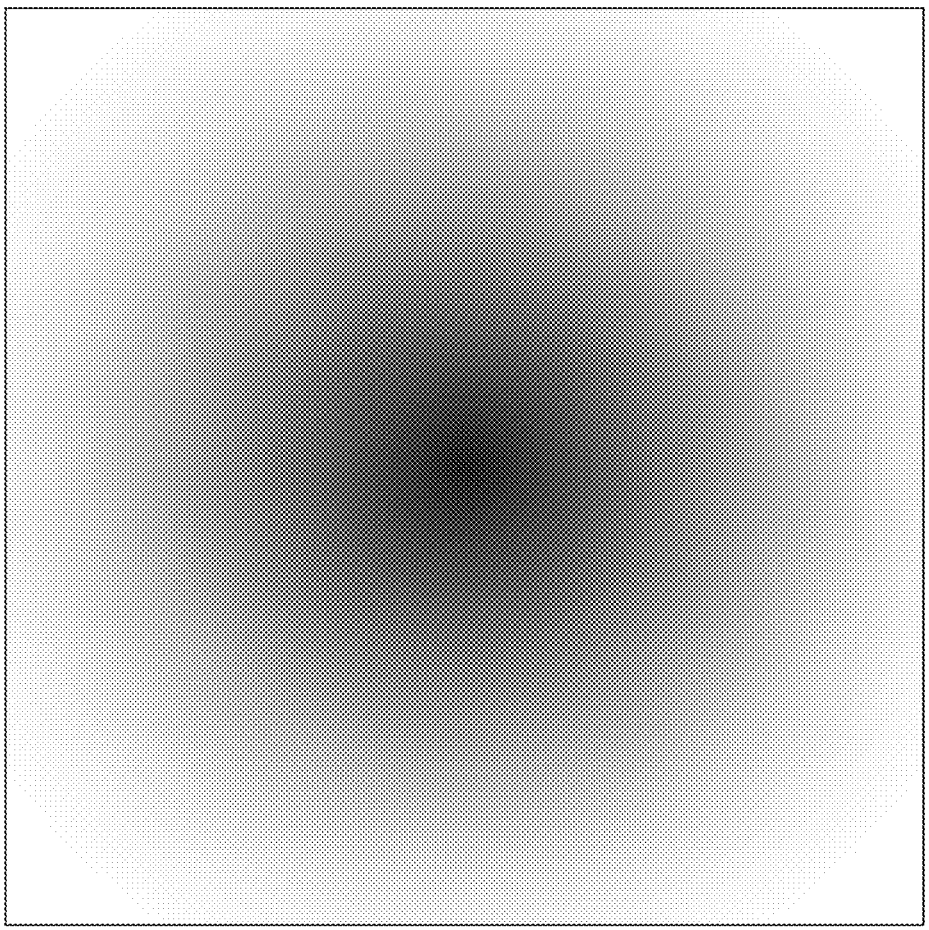

The pinhole-lens assembly is subject to an aperture shading effect which causes the final image at the imaging plane (the optical sensor array 4623e) to appear brighter in the center and darker in the peripheral area with a gradual change in brightness along the radial direction from the center towards the peripheral area. This effect degrades the image captured at the optical sensor array 4623e and can be reduced by using a corrective optical filtering that modifies the spatial brightness distribution. For example, an optical filter with a spatial gradient transmission profile can be inserted in the optical path of the light received by the optical fingerprint sensor module, e.g., a location between the OLED display panel and the optical sensor array. This gradient transmission filter is structured to exhibit a high optical attenuation at or near a center of the pinhole and a decreasing optical attenuation from the center of the pinhole radially outward to counter a spatial variation of an optical intensity distribution of light caused by the pinhole. FIG. 23 shows an example of an optical attenuation profile for such a gradient transmission filter with a radial gradient attenuation that decreases from the center towards the edge.

In implementations, the gradient transmission filter may include one or more coatings may be made on a surface of the light path to correct the image brightness non-uniformity, e.g., the display bottom surface, the module parts surface, or top surface of the optical sensor array. In addition to countering the spatial un-uniformity by the aperture shading effect, the filter may be further configured to correct other types of brightness non-uniformity and may also include features that can reduce other optical distortions and optical aberrations.

The above disclosed optical fingerprint sensor modules that uses a pinhole-lens assembly for optical imaging onto an optical sensor array may also be used to construct optical fingerprint sensor modules located under a top glass cover but is placed next to an LCD display screen that is placed under the same top glass cover. Such optical fingerprint sensor modules can be placed next to an LCD display screen under the same top glass cover to allow for a common and contiguous top surface above the LCD display and the optical fingerprint sensor module and several examples are provided in the subsection VIII entitled "Optical Fingerprint Sensors on One Side of LCD Displays."

IV. Invisible Under-Display Optical Fingerprint Sensor Designs

Figures 24A, 24B:
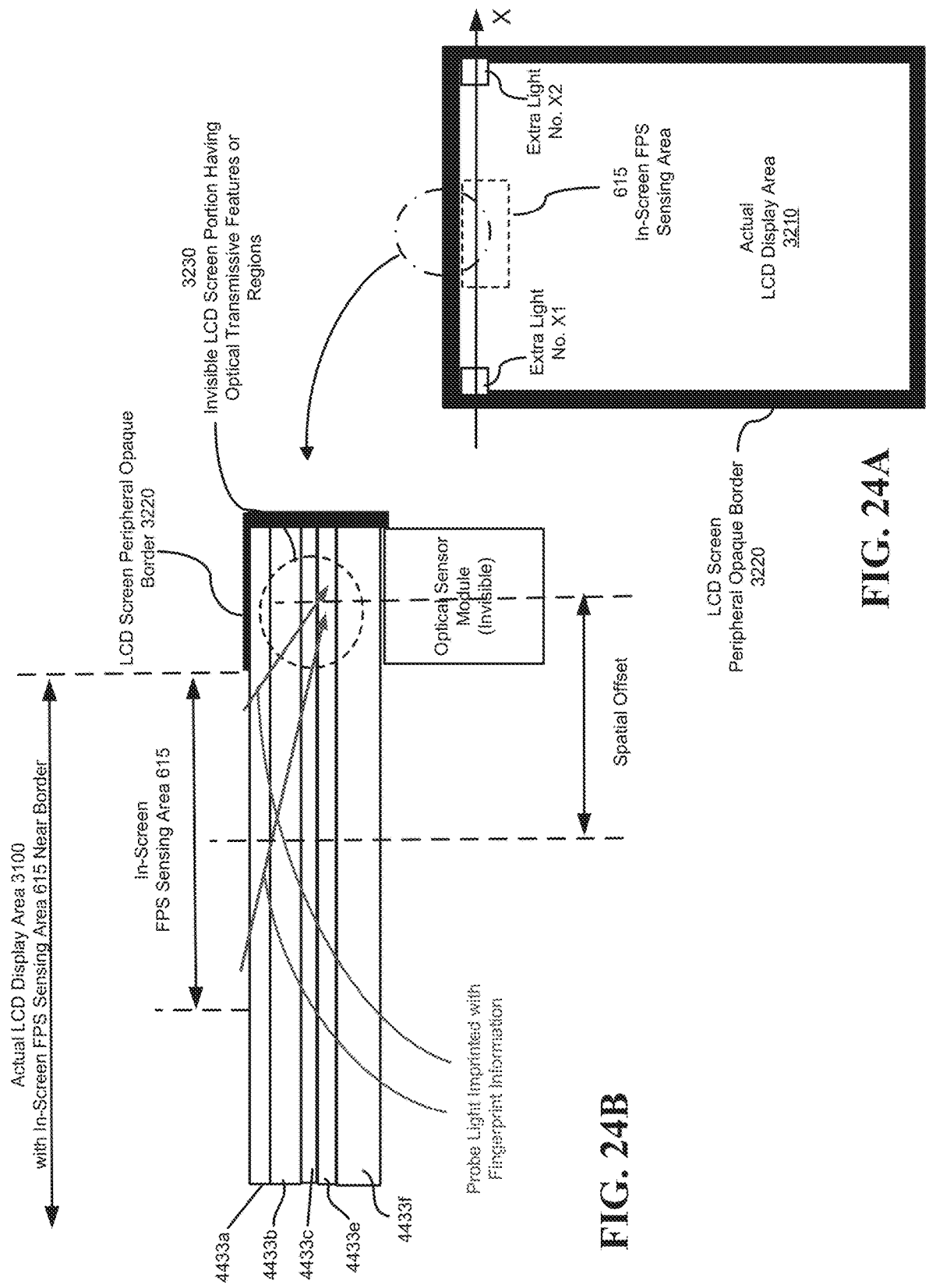

According to some implementations, to make an under-display screen optical fingerprint sensor module "invisible," an optical fingerprint sensor module may be placed under the opaque border of the display screen. In many commercially produced LCD screens, an optically opaque border is present in the peripheral sides of the LCD screen, like a peripheral opaque border frame surrounding the central area of the LCD screen. FIG. 24A illustrates a top view of the LCD display screen where a peripheral opaque border frame 3220 is formed on the four sides of the LCD screen and block the LCD display pixels in the border regions on the four sides of the LCD screen so that only the central LCD display area 3210 exposed by the opening of the peripheral opaque border frame 3220 is visible to a user during the display operation.

Accordingly, as illustrated in FIGS. 24A and 24B, the under-LCD optical fingerprint sensor module can be placed under the LCD screen near or within the area covered by the peripheral opaque border frame 3220 so that the LCD screen portion 3230 under the peripheral opaque border frame 3220 above the optical fingerprint sensor module can be modified to provide one or more desired localized transmissive features or regions in the LCD screen stack for directing probe light carrying the fingerprint information to the optical fingerprint sensor module.

FIG. 24B shows a cross section view of the different layers under the marked circular region in FIG. 24A. The LCD screen portion 3230 with optical transmissive features or regions for directing light to the optical fingerprint sensor module is placed under the peripheral opaque border frame 3220 and thus is largely invisible to the user when viewing the LCD-displayed images because the peripheral opaque border frame 3220 is above and conceals the LCD screen portion 3230 from the view of the user. Notably, different from some other examples of under-LCD optical sensing designs, the center of the in-screen FPS sensing area 615 is spatially offset from the center of the LCD screen portion 3230 with optical transmissive features or regions. Accordingly, the location of the underlying optical fingerprint sensor module is spatially shifted in position off the in-screen FPS sensing area 615 because the underlying optical fingerprint sensor module is placed under the peripheral opaque border frame 3220 rather than being directly underneath the in-screen FPS sensing area 615.

This design of placing the LCD screen portion 3230 with optical transmissive features or regions either partially or entirely under the peripheral opaque border frame 3220 for directing probe light into the under-LCD optical fingerprint sensor module is referred to as an "invisible" optical sensor design. This design can conceal both the localized transmissive features or regions in the LCD screen portion 3230 of the LCD screen stack and the underlying optical fingerprint sensor module from being visible even when one or more extra illumination lights 4663 or 4661 are provided for illuminating the area above the in-screen FPS sensing area 615 where a user is to place a finger for optical fingerprint sensing and other optical sensing operations.

Under this arrangement, the in-screen FPS sensing area 615 can no longer be placed anywhere in the LCD screen but should be in the LCD screen near the location of the LCD screen portion 3230 having localized transmissive features or regions so that a portion of the light from the in-screen FPS sensing area 615 that reaches the LCD screen portion 3230 under the peripheral opaque border frame 3220 can be directed through the LCD screen to reach the underlying optical fingerprint sensor module for optical sensing. In various implementations of this design, the LCD screen portion 3230 having localized transmissive features or regions is designed to provide one or more light receiving paths (at least partially covered by the peripheral opaque border frame 3220) from the in-screen FPS sensing area 615 to the under-LCD optical fingerprint sensor module to improve the optical detection performance while the illumination of the in-screen FPS sensing area 615 can be implemented independent of this special design. For example, the one or more extra illumination lights 4663 or 4661 can be placed at desired locations to direct illumination light to the in-screen FPS sensing area 615 without necessarily going through the LCD screen portion 3230 having localized transmissive features or regions to reach the in-screen FPS sensing area 615.

The above described design of placing the LCD screen portion 3230 having localized transmissive features or regions to be at least partially covered by the peripheral opaque border frame 3220 can be applied to various configurations of the under-LCD optical fingerprint sensor module for implementing the design in FIG. 24. For example, the under-LCD optical fingerprint sensor module using a projector system for collecting light from the in-screen FPS sensing area 615 in FIG. 4B, or an imaging system having a lens located below the LCD screen in an optical path to the optical sensor array to collect the probe light from the in-screen FPS sensing area 615 and to project the collected probe light towards the optical sensor array in FIGS. 6B, 7, 8A, 9 and 10A, or a combination of a pinhole and a lens downstream from the pinhole to receive the transmitted probe light from the pinhole and to focus the received probe light onto the optical sensor array for optical imaging as shown in FIGS. 17 through 23.

Referring back to FIGS. 24A-24B, the LCD screen portion 3230 having localized transmissive features or regions that is partially or entirely covered by the peripheral opaque border frame 3220 can be use various designs to increase the optical transmission of the LCD screen portion 3230 in addition to forming transmission holes or more transmissive regions than the other parts of the LCD screen. FIGS.

25A-25C show one specific example where a peripheral segment of the LCD screen is modified to form the LCD screen portion 3230 by providing improved optical transmission in the modified LCD screen portion 3230 in which the underlying optical fingerprint sensor module 4620 as shown uses a combination of a pinhole and a lens shown in FIG. 17 to collect light for the optical sensor array as an example.

Figure 25A:
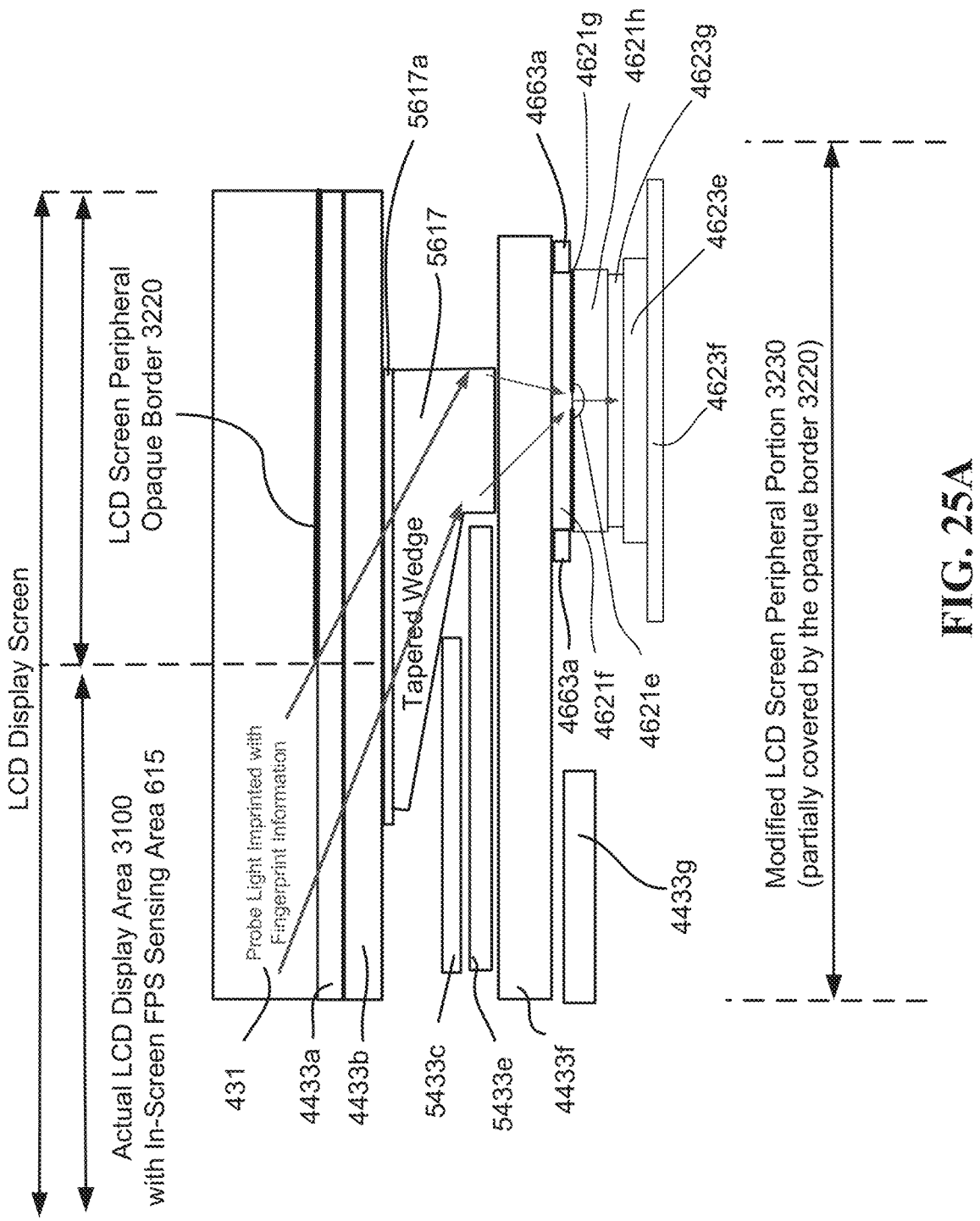

In this design example, as shown in FIGS. 25A and 25B, the under-LCD optical fingerprint sensor module uses a pinhole 4643 and a micro lens 4621e together to form an optical system for collecting light from the FPS sensing area 615 on the top transparent layer 431 and for directing the collected light onto the optical sensor array 4623e in the optical fingerprint sensor module 4620 to achieve a large field of view and a high imaging resolution at the same time. See FIGS. 17 through 23 and associated description for more details. The spacer 4621h may be a low-index material layer such as an air gap, and the protection layer 4623g may be a band pass filter. FIG. 25B shows that one or more under cover glass extra illumination light sources 4661 are provided to illuminate the finger to be detected and to generate probe light in the optical path from the in-screen FPS sensing area 615 to the LCD screen portion 3230 to the optical fingerprint sensor module. Extra light sources 4663 may be placed adjacent to or just above the optical fingerprint sensor module 4620 to provide local illumination for finger illumination. These light sources can also function as a breathing light to indicate the operational state of the optical fingerprint sensor module. As further explained in later sections, other light sources, such as environmental light sources, can also be used as probe light sources for optical sensing.

Figure 25C:
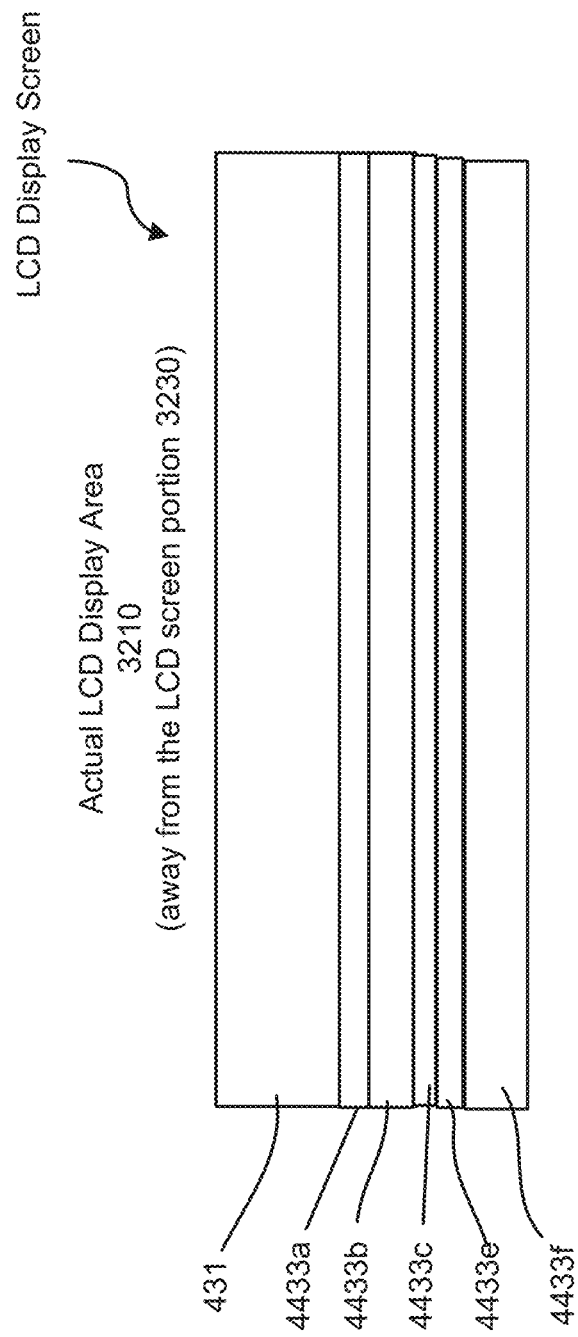

FIGS. 25A-25C show that a peripheral segment of the LCD screen is modified to form the LCD screen portion 3230 by peeling off a small segment of the LCD prism and diffusion films 4433c and 4433e and the other layers underneath the LCD prism and diffusion films 4433c and 4433e. The peripheral segments of the LCD prism and diffusion films 4433c and 4433e are removed to create a void for optical transmission to form modified LCD prism and diffusion films 5433c and 5433e as shown in FIG. 25A. This void is used to insert an optical coupler 5617 below the LCD layers 433b and above the backlighting waveguide layer 4433f. This optical coupler 5617 can be implemented as a wedged optical coupler with a tapered wedge section to extend into the space between the peeled and modified LCD prism and diffusion films 5433c and 4433e and this tapered wedge section can reach into the LCD screen region 3100 that is not covered by the peripheral opaque border frame 3220 as a light path for better collection of light from the in-screen FPS sensing area 615. Accordingly, the optical coupler 5617 includes a top coupler part that receives the light from the in-screen FPS sensing area 615 and routes the received light from the in-screen FPS sensing area 615 along a slanted optical path to the region underneath the peripheral opaque border frame 3220 where the concealed optical fingerprint sensor module 4620 is located to collect the received light from the in-screen FPS sensing area 615 for optical sensing. This feature of the optical coupler 5617 only impacts a small area of the LCD screen near the peripheral opaque border frame 3220 so that the impact to the display quality is not pronounced. A thin spacer 5617a is formed between the bottom surface of the LCD layers 4433b and the top surface of the optical coupler 5617 and may be, e.g., a soft optically clear or transparent adhesive layer. As such, probe light from the in-screen FPS sensing area 615 passes through the thin spacer 5617a and is collected and directed by the optical coupler 5617 into the backlighting waveguide layer 4433f.

In other implementations, the peripheral segment of the LCD screen is detached or peeled off a small segment of the LCD prism and diffusion films 4433c and 4433e and the other layers underneath the LCD prism and diffusion films 4433c and 4433e to create a void for optical transmission to insert the optical fingerprint sensor module. For example, the backlighting module of the LCD display panel structure includes a peripheral region within an area that is at least partially covered by the peripheral border and is detached from other parts of the LCD display panel structure to provide a location at which the optical fingerprint sensor module is located under the peripheral opaque border.

Another modification to the peeled LCD peripheral segment is to remove a small peripheral segment of the optical reflector film layer 4433g as a modified optical reflector film layer 5433g to expose the bottom surface of the backlighting waveguide layer 4433f for placing the optical fingerprint sensor module 4620. The top surface of the optical fingerprint sensor module 4620 in this example is the pinhole substrate 4621f which is placed against the bottom surface of the backlighting waveguide layer 4433f to receive the light directed by the optical coupler 5617. In this example, the optical path from the in-screen FPS sensing area 615 through the top transparent layer 431, through the touch sensing layer 4433a, the LCD layers 4433b, the spacer 5617a, the optical coupler 5617, and the backlighting waveguide layer 4433f into the optical fingerprint sensor module 4620 contains no air gaps. In other implementations, an air gap may be present in the above optical path.

FIG. 25B shows the general geometry of the LCD screen portion 3230 based on the above modification of the peripheral segment of the LCD screen where two types of extra illumination light sources 4661 and 4663 are placed below the top transparent layer 431 and above the backlighting waveguide layer 4433f.

FIG. 25C shows that, other than the peripheral segment of the LCD screen portion 3230, other parts of the LCD screen are not modified and are shown in their originally fabricated positions.

Figure 26:
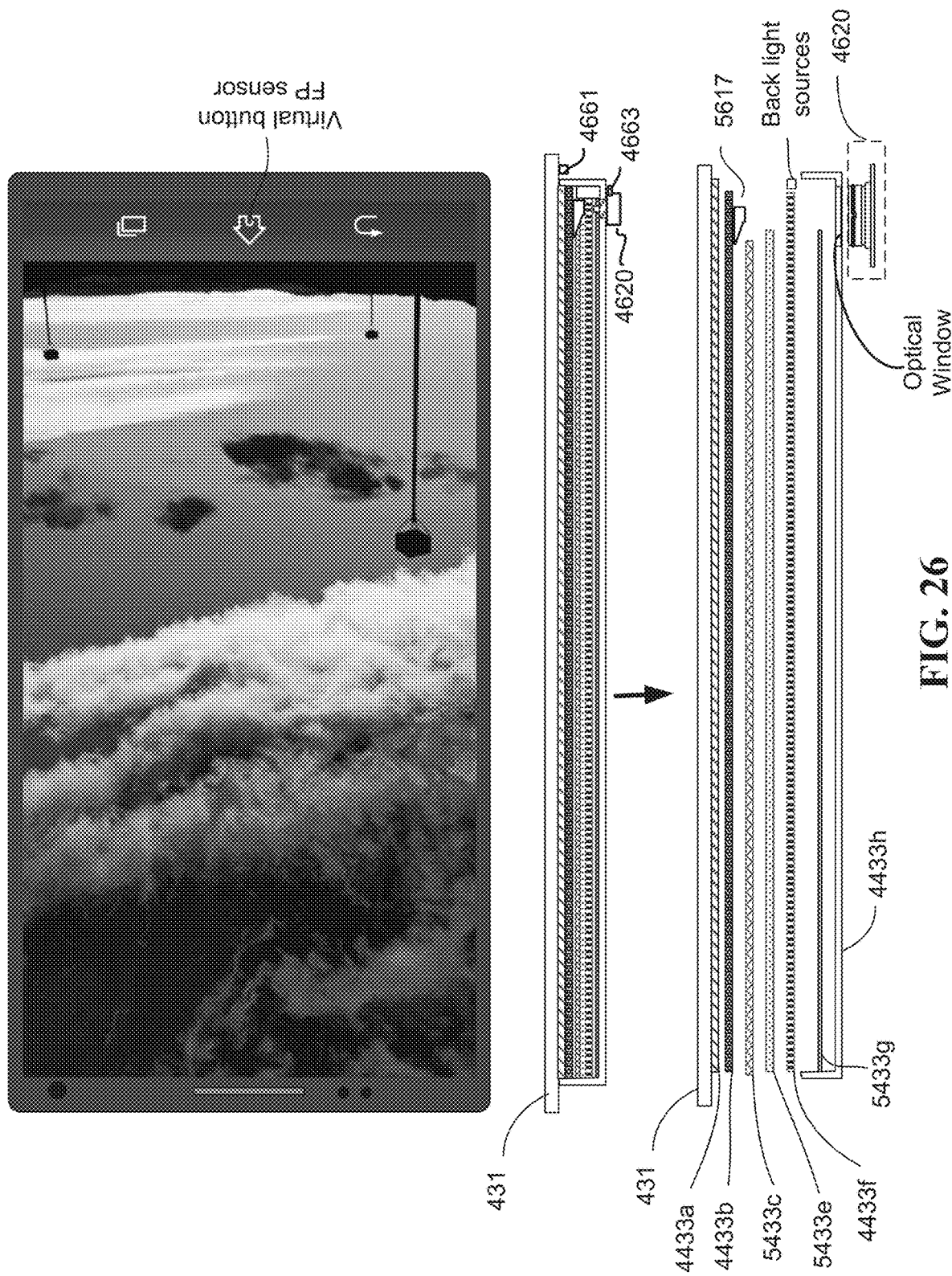

FIG. 26 shows an example of an implementation of the design in FIGS. 25A-25C where the optical fingerprint sensor module 4620 is integrated under the LCD assembly at a position close to the backlighting light sources 434 at one end of the LCD screen structure. The light path for the optical fingerprint sensor module 4620 is out of the LCD display's working zone (e.g., the actual LCD display area 3100) so that the optical fingerprint sensor module 4620 is hidden under the LCD opaque border from the viewer and is substantially invisible. In this example, a LCD housing 4433h below the modified LCD reflector film layer 5433g is located above the optical fingerprint sensor module 4620 and has an optical transparent window at the optical fingerprint sensor module 4620 to allow the collected light to enter the optical fingerprint sensor module 4620.

In summary, the above invisible optical fingerprint sensor module design for an electronic device capable of detecting a fingerprint by optical sensing (e.g., smartphones, tablets, and others) is based on a LCD screen that provides touch sensing operations and includes a LCD display panel structure to display images and a peripheral opaque border surrounding a central area of the LCD display panel structure and covering a narrow peripheral border of the LCD display panel structure. The LCD display panel structure includes a backlighting module to produce backlight for illuminating the LCD layers to display images in the central area of the LCD display panel structure within the peripheral opaque border. One or more optical sensing illumination probe light sources are provided to produce probe light to illuminate a sensing area of the top transparent layer for optical sensing. An under-LCD optical fingerprint sensor module is located below the LCD screen and positioned underneath the peripheral opaque border to be spatially offset from central area of the LCD display panel structure to receive returned probe light that passes through the LCD screen for optical sensing. The LCD display panel structure includes one or more extra transmission holes or regions within an area that is at least partially covered by the peripheral border and is positioned above the optical fingerprint sensor module to allow probe light to pass through the LCD display panel structure to reach the optical fingerprint sensor module for optical sensing.

The one or more extra transmission holes or regions within the area that is at least partially covered by the peripheral border may include, in some implementations, an optical coupler to transmit the light. In some designs, this optical coupler may be placed below the LCD layer and above the LCD backlighting waveguide layer while the optical fingerprint sensor module is placed under the LCD backlighting waveguide layer at a location where a portion of the LCD optical reflector film is removed or has an opening or void. As shown by the example in FIG. 25A or 25B, one implementation of such an optical coupler is a tapered wedge that directs probe light, which is imprinted with fingerprint information, to a region above the optical fingerprint sensor module located under the LCD screen peripheral opaque border 3220 so that such probe light can be coupled into the optical fingerprint sensor module in a way generally illustrated in FIG. 25A or 25B where the probe light enters the optical sensor array of the optical fingerprint sensor module from the top of the optical fingerprint sensor module, either through the pinhole-lens assembly to the optical sensor array or directly onto the optical sensor array.

Figure 27:
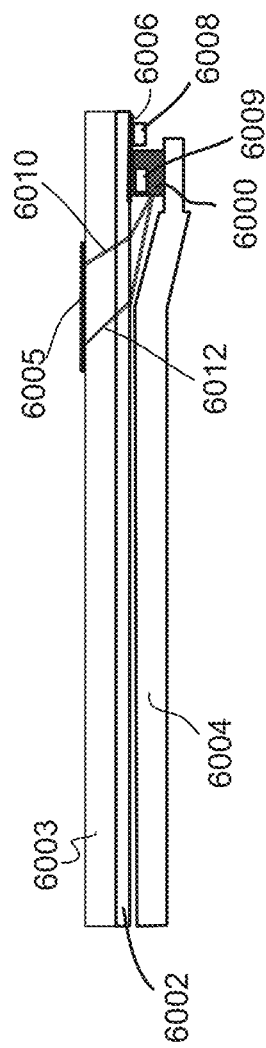
FIG. 27 illustrates an exemplary implementation of integrating an optical fingerprint sensor module with a display screen according to some embodiments.
Figure 28:
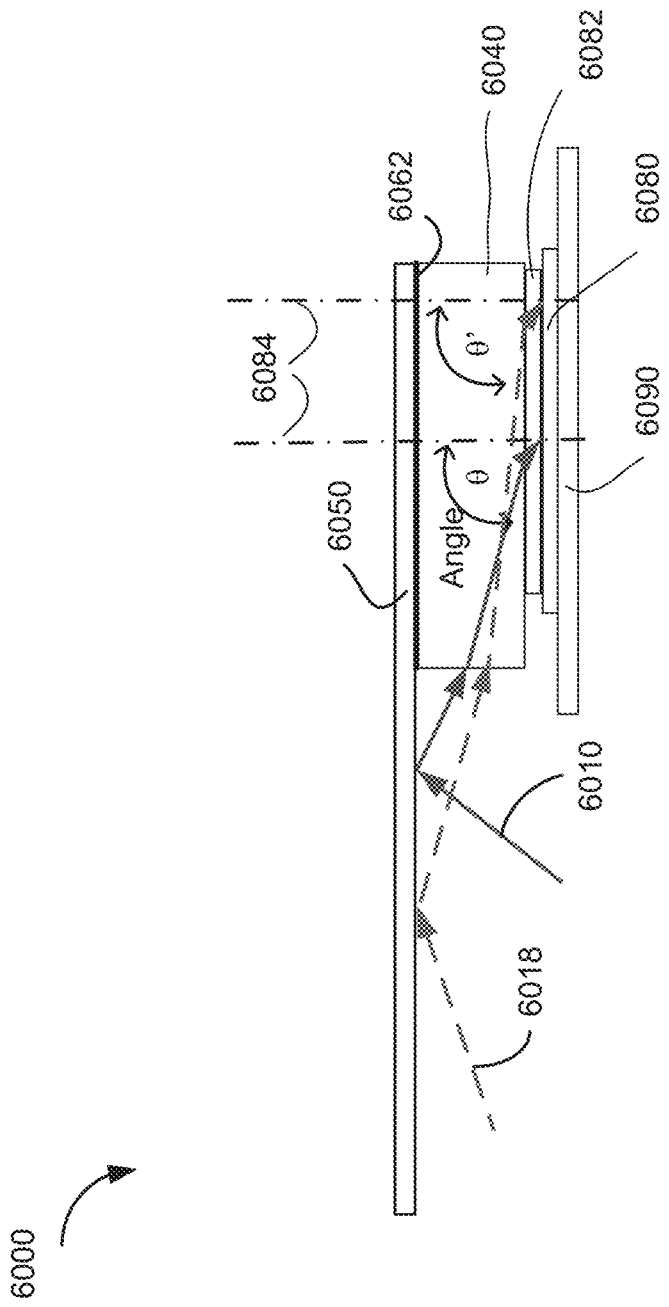
FIG. 28 shows an exemplary optical fingerprint sensor module that may be integrated with a display screen, as illustrated in FIG. 27, according some embodiments.

V. Optical Fingerprint Sensor Module Including a Lens-Pinhole Imaging System with an Optical Axis being not Perpendicular to the Display Screen Surface In some other implementations, the optical coupler 5671 illustrated in FIGS. 25A-25B may be omitted. Instead, the signal light may be directly coupled into the optical fingerprint sensor module, thus simplifying the structure for integrating the optical fingerprint sensor module to the LCD screen structure. FIGS. 27 and 28 illustrate an exemplary implementation of such a design for integrating an optical fingerprint sensor module without an optical coupler.

Referring to FIG. 27, an LCD display may include an LCD module 6002, a transparent cover 6003 (e.g., a glass cover) disposed over the LCD module 6002, and an LCD backlighting layers 6004 disposed under the LCD module 6002 for providing illumination for the LCD display. The LCD backlighting layers 6004 may include layers such as LCD prism 5433c and diffusion films 5433e as illustrated in FIG. 25A. The LCD display may include an opaque zone 6006 on a periphery (i.e., the border) of the LCD display.

In this implementation, a portion of the LCD backlighting layers 6004 adjacent the opaque zone 6006 may be lifted slightly or be detached from the LCD module 6002 to create a space for placing an optical fingerprint sensor module 6000 under the opaque zone 6006 of the LCD module 6002. The LCD display may include a fingerprint sensing zone 6005. Signal light 6010 and 6012 from a finger placed adjacent the fingerprint sensing zone 6005 (e.g., scattered, reflected, or transmitted by the finger) may be transmitted through the LCD module 6002, and may be received by the optical fingerprint sensor module 6000 at relatively large incidence angles. Thus, this design implementation may not require the optical coupler 5617 used in the implementation illustrated in FIGS. 25A and 25B.

In some smartphone designs, this direct integration of the optical fingerprint sensor module 6000 with the LCD display can operate to capture fingerprint images by using signal light 6010 and 6012 at relatively large incidence angles with respect to a direction perpendicular to the LCD screen surface in a range between 30 degrees and 90 degrees, e.g., 60 degrees to 85 degrees, or 70 degrees to 85 degrees, according to various embodiments.

FIG. 28 shows an exemplary structure of an optical fingerprint sensor module 6000 according some embodiments. The optical fingerprint sensor module 6000 may include a FPC board 6090, and a photodiode array 6080 disposed on and coupled to the FPC board 6090. The photodiode array 6080 may be configured to convert signal light incident thereon into electrical signals. The FPC board 6090 may include electronic circuitries for processing the electrical signals generated by the photodiode array 6080 to produce images of fingerprint patterns carried by the signal light. The photodiode array 6080 may be covered by a protection layer 6082. In some embodiments, the protection layer 6082 may be a bandpass filter or some other types of optical filter. In this configuration, the optical fingerprint sensor module 6000 is flipped upside-down. That is, the FPC board 6090 and the photodiode array 6080 are disposed adjacent the LCD module 6002 shown in FIG. 27.

The optical fingerprint sensor module 6000 may further include an optically transparent spacer 6040 disposed above the protection layer 6080. The spacer 6040 may have a relative low index of refraction. In some embodiments, the spacer 6040 may be an air gap. The protection layer 6080 may have an index of refraction that is higher than that of the spacer 6040 according to some embodiments.

The optical fingerprint sensor module 6000 may further include a mirror 6050 disposed above the spacer 6040 and extending beyond the spacer 6040. As illustrated in FIG. 28, signal light 6010 scattered inside a finger may be reflected by the mirror 6050, and be received by the photodiode array 6080. In addition, signal light 6018 reflected at the interface between a top surface of the LCD display and a finger touching the fingerprint sensing zone 6005 of the LCD display may be reflected by the mirror 6050, and be received by the photodiode array 6080. In some embodiments, the optical fingerprint sensor module 6000 may further include a light absorbing material 6062 disposed between the mirror 6052 and the spacer 6040. The light absorbing material 6062 may be configured to absorb stray light so as to reduce or eliminate background light.

In this implementation, the captured image at the photodiode array 6080 may be spatially distorted due to the grazing incidence angles θ and θ' of the signal light 6010 and 6018 with respect to the normal 6084 of the surface of the photodiode array 6080. Such spatial distortion may be measured. Based on the measured spatial distortion information, the generated detector signals from the photodiode array 6080 can be processed to correct the spatial distortion when reconstructing a final image.

In some embodiments, the spacer 6040 and the protection layer 6082 may be configured to reduce the image distortion at the photodiode array 6080. When light is refracted at interfaces between two media, nonlinearity in the directions of refracted rays may exist, which may create image distortions at the photodiode array 6080. Such distortions may be more pronounced when the incident angles are large. To reduce such distortions, the ratio of the optical thickness of the spacer 6040 and that of the protection layer 6080 may be selected in light of the optical objective field.

As illustrated in FIG. 27, two additional illumination light sources 6008 and 6009 may be provided to provide illumination to a finger in touch with or adjacent the fingerprint sensing area 6005 in order to generate signal light 6010 and 6012 for optical sensing by the optical fingerprint sensor module 6000. The illumination light source 6008 may be placed at a position laterally displaced from the optical fingerprint sensor module 6000, to provide illumination light that may enter a finger to create scattered light 6010 and 6012 inside the finger. The scatter light 6010 and 6012 may be transmitted through the LCD module 6002 and be detected by the optical fingerprint sensor module 6000. The illumination light sources may include light-emitting diodes (LEDs), vertical-cavity surface-emitting lasers (VCSELs), or laser diodes (LDs). Especially for illumination with VCSELs and LDs, the efficiency can be higher because the VCSEL or LD emitted light's divergence angle is small so that the light is easier to be directed to fingertip. In addition, background light may also enter the finger and create scattered light, which may be transmitted through the LCD module 6002 to be combined with the signal light 6010 and 6012 generated by the illumination of the one or more extra illumination light sources 6008, and may be collected and detected by the optical fingerprint sensor module 6000. One advantage for using such signal light 6010 and 6012 may be that, as the signal light 6010 and 6012 is transmitted through or scattered by the inner issues of the finger, such signal light 6010 and 6012 tends to carry fingerprint information regardless of the finger skin conditions (e.g., whether the skin is wet, dirty or dry) and may not be impacted by the interface conditions between the finger and the top sensing surface.

Referring again to FIG. 27, the illumination light source 6009 may be placed at a position inside or close to the optical fingerprint sensor module 6000 to provide illumination to a finger that is first transmitted through the LCD module 6002 and the cover 6003 to interact with a finger touching the top surface in the fingerprint sensing zone 6005 and create back scattered light or reflected light (not shown in FIG. 27). Such signal light may be impacted by the skin conditions (e.g., the skin is wet, dirty or dry), and may also be impacted by the interface conditions between the finger and the top sensing surface.

Figure 29:
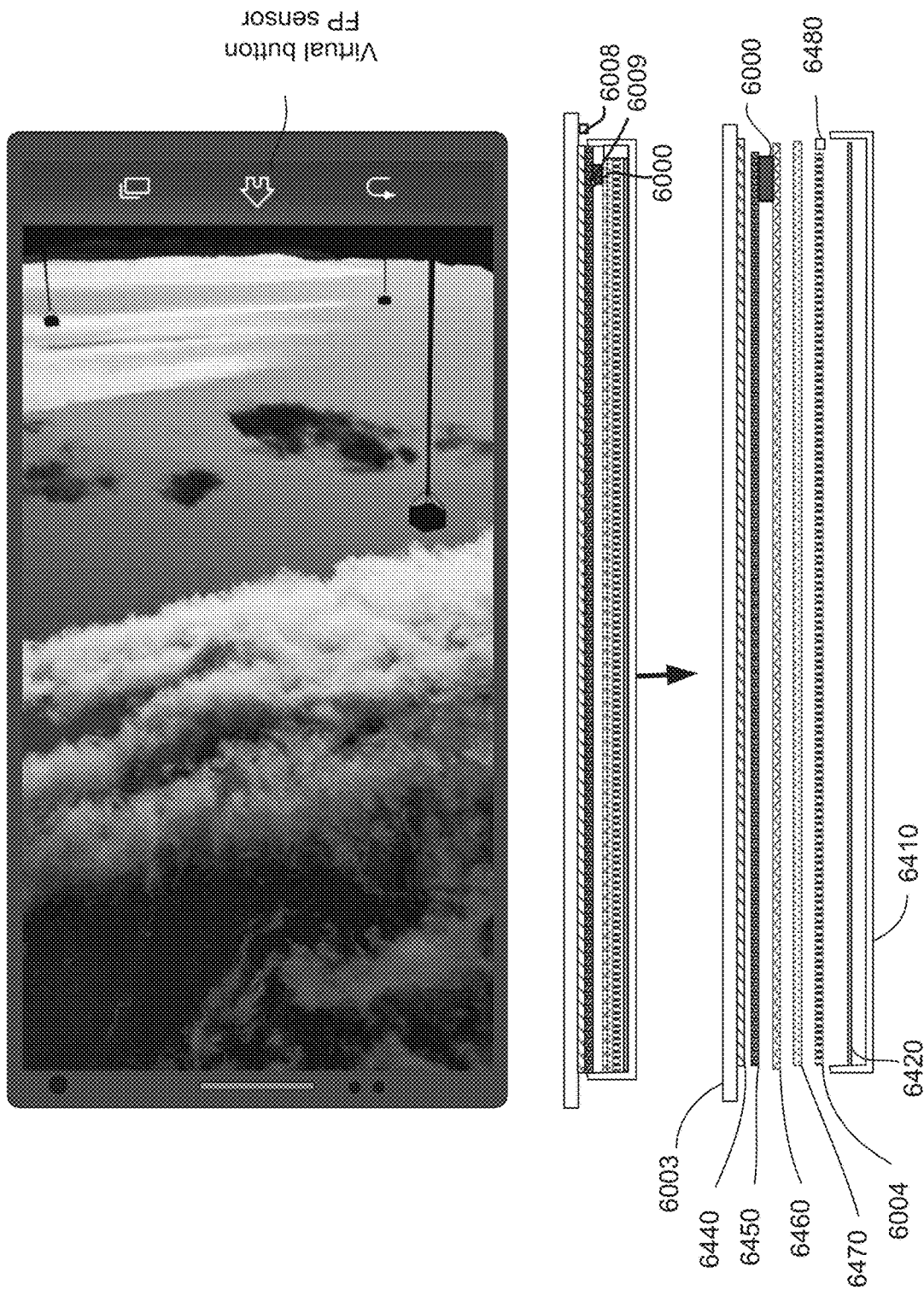
FIG. 29 shows an exemplary structure of a display screen integrated with an optical fingerprint sensor module, as illustrated in FIGS. 27 and 28, according to some embodiments.

FIG. 29 shows an exemplary implementation of the design illustrated in FIGS. 27 and 61 where the optical fingerprint sensor module 6000 is integrated under the LCD assembly at a position close to one or more backlighting light sources 6480 at one end of the LCD screen structure. The LCD screen structure may include a top transparent layer 6003 and a touch sensing layer 6440. The LCD screen structure may further include LCD layers 6450, an LCD prism layer 6460, and diffusion films 6470. The combination of the LCD layers 6450, the LCD prism layer 6460, and the diffusion films 6470 may be referred to as the LCD module 6002. The LCD screen structure may further include the backlighting layers 6004, an LCD reflector film layer 6420, and an LCD housing 6410.

The optical fingerprint sensor module 6000 is hidden under the LCD opaque border 6006 from the viewer and is substantially invisible, as illustrated in FIG. 27. In this example, the LCD housing 6410 and the LCD reflector film layer 6420 are positioned below the optical fingerprint sensor module 6000. The optical fingerprint sensor module 6000 can be structured to be thin for better integration to the LCD structure, e.g., around 1 millimeter or so in some implementations.

Figure 30:
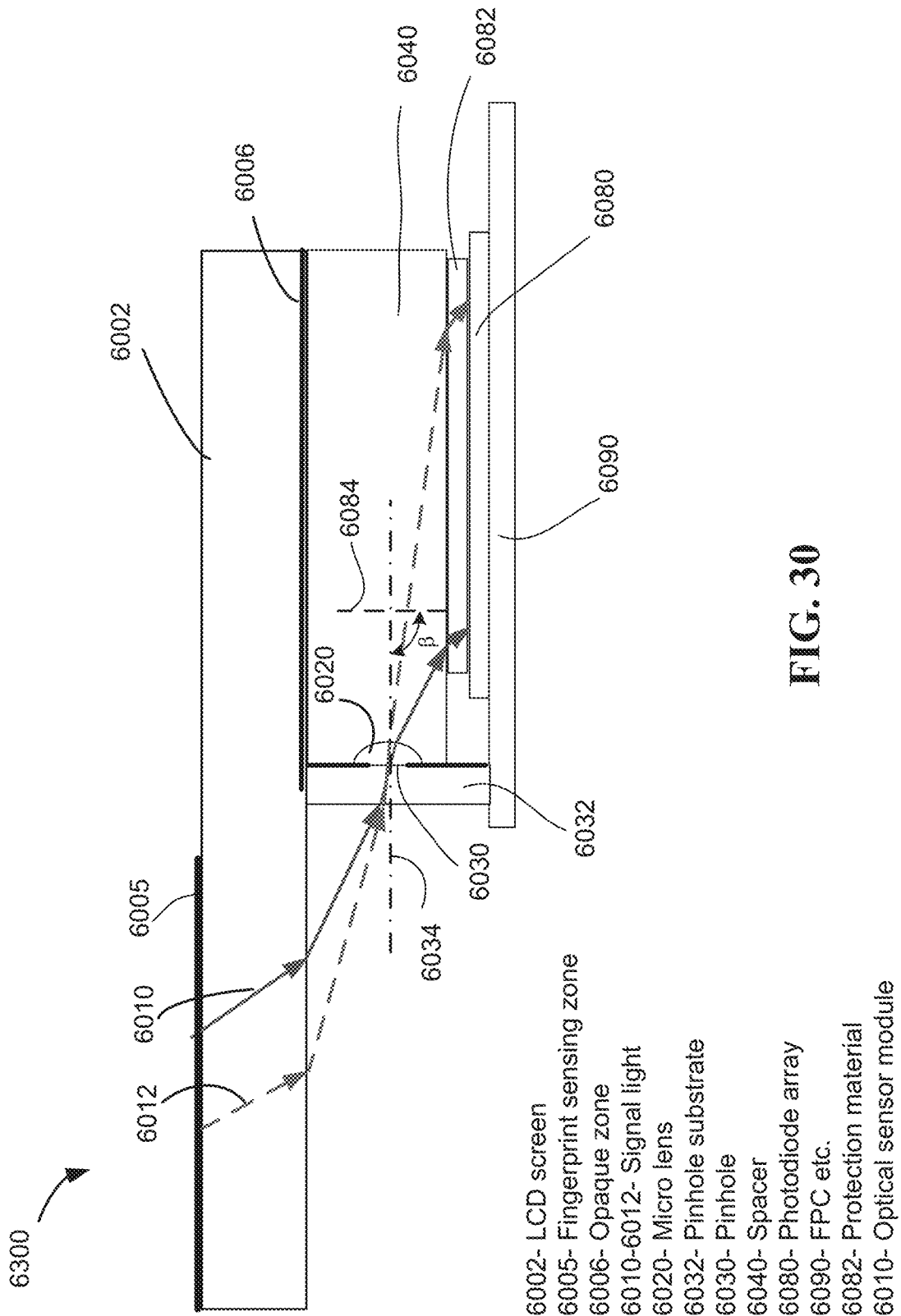
FIG. 30 illustrates an optical fingerprint sensor module according to some embodiments.
Figure 31:
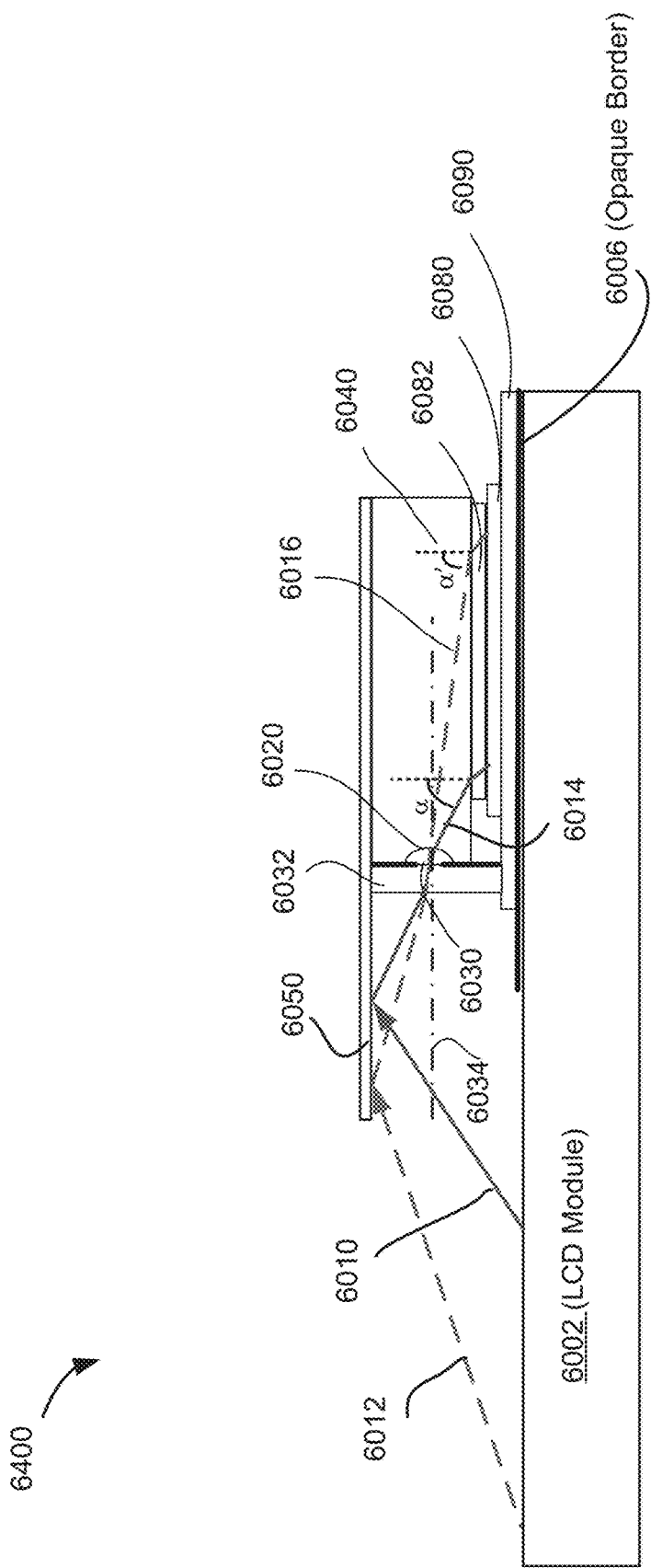
FIG. 31 illustrates an optical fingerprint sensor module according to some embodiments.
Figure 32:
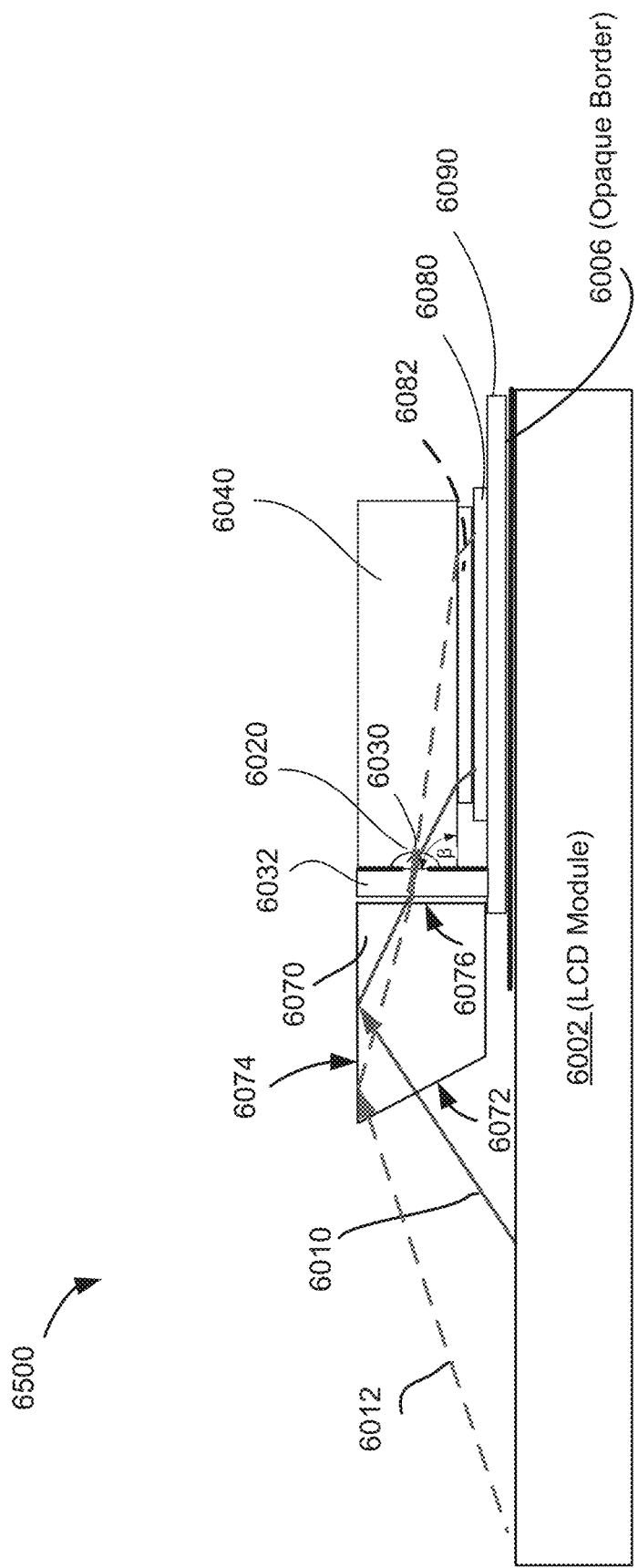
FIG. 32 illustrates an optical fingerprint sensor module according to some embodiments.

According to some embodiments, the spatial distortion caused by the grazing incidence of the signal light 6010 and 6012 at the photodiode array 6080 may be reduced by including a lens-pinhole assembly as shown in the examples illustrated in FIGS. 30-32.

As discussed above with references to FIGS. 17 through 26, a compact optical imaging system for optical fingerprint sensing may be provided by combining a lens and a pinhole as a lens-pinhole imaging system. The lens is used to form a lens-based imaging system to achieve a high spatial image resolution, as well as a reduced size in the captured image at the photodiode array 6080 to reduce the size of the photodiode array. The pinhole may be placed in front of the lens to produce a large field of view (FOV) in optical imaging by effectuating a pinhole camera. In the examples illustrated in FIGS. 17 through 26, the lens-pinhole imaging system is implemented to have the optical axis of the lens-pinhole imaging system to be approximately perpendicular to the LCD screen surface and the photodiode array surface (i.e., the optical axis of the lens-pinhole imaging system is approximately parallel to the normal of the photodiode array surface). For example, in the invisible under-LCD optical fingerprint sensor module illustrated in FIGS. 25A and 25B, which includes an optical wedge coupler 5617, the optical axis of the lens-pinhole imaging system is approximately perpendicular to the LCD screen surface and the photodiode array surface. FIGS. 30-32 illustrate exemplary implementations of a different approach to the lens-pinhole imaging system in which the optical axis of the lens-pinhole imaging system is nearly parallel to the LCD screen surface and the photodiode array surface.

FIG. 30 illustrates an optical fingerprint sensor module 6300 according to some embodiments. The optical fingerprint sensor module 6300 may include a FPC board 6090, and a photodiode array 6080 disposed on and coupled to the FPC board 6090. The photodiode array 6080 may be covered by a protection layer 6082. In some embodiments, the protection layer 6082 may be a bandpass filter or some other types of optical filter.

The optical fingerprint sensor module 6300 further includes a lens-pinhole assembly. The lens-pinhole assembly includes a pinhole substrate 6032, a pinhole 6030 formed on the pinhole substrate 6032, and a micro lens 6020 disposed behind the pinhole 6030. The lens-pinhole assembly is positioned such that the optical axis 6034 of the lens 6020 is off-normal with respect to the surface of the photodiode array 6080. The optical axis of a lens may be defined as a line passing through the center of curvature of the lens and parallel to the axis of symmetry. The angle β between the optical axis 6034 of the lens 6020 and the normal of the surface of the photodiode array 7080 may be optimized to increase the effective aperture. In some embodiments, the angle β may range from about 45 degrees to about 135 degrees, or from about 80 degrees to about 95 degrees. In some embodiments, the angle β may be about 90 degrees. In such cases, the optical axis 6034 of the lens-pinhole assembly may be nearly parallel to the surface of the photodiode array 6080 (i.e., the angle β is nearly 90 degrees). In some embodiments, optical bandpass filter coatings may be formed on the pinhole substrate 6032 or on the surfaces of other components.

The optical fingerprint sensor module 6300 may be positioned under the opaque border 6006 of the LCD module 6002. An optically transparent spacer 6040 may be positioned between the LCD module 6002 and the protection layer 6082. The spacer 6040 may have a relatively low index of refraction. In some embodiments, the spacer 6040 comprises an air gap. The protection layer 6082 may have an index of refraction that is higher than that of the spacer 6040.

The spacer 6040 and the protection layer 6082 may be configured to reduce the imaging distortions at the surface of the photodiode array 6080. When light is refracted at interfaces between two media, nonlinearity in the directions of refracted rays may exist, which may create image distortions at the photodiode array 6080. Such distortions may be more pronounced when the incidence angles are large. To reduce such distortions, the ratio of the optical thickness of the spacer 6040 and that of the protection layer 6080 can be selected in light of the optical structure of the pinhole-lens assembly and the optical objective field of the pinhole-lens assembly.

The lens-pinhole assembly is positioned on the left hand side of the optical fingerprint sensor module 6300 to collect incident signal light 6010 and 6012 at large incidence angles due to the placement of the optical fingerprint sensor module 6300 under the opaque border 6006 of the LCD module 6002. The pinhole 6030 first receives the incident signal light 6010 and 6012, and the micro lens 6020 then images the signal light that passes the pinhole 6030 onto the surface of the photodiode array 6080. The spatial distortions due to the large incidence angles of the signal light 6010 and 6012 may be reduced by using the lens-pinhole imaging system. For example, the micro lens 6020 may be shaped to reduce or counter the distorted spatial distribution of the incident signal light 6010 and 6012. The residual spatial distortion may be measured for the given the lens-pinhole assembly, so that signal processing may be applied to reduce or remove the residual distortion in reconstructing an image of a fingerprint pattern.

FIG. 31 illustrates an optical fingerprint sensor module 6400 according to some other embodiments. Similar to the optical fingerprint sensor module 6300, the optical fingerprint sensor module 6400 may include a FPC board 6090, a photodiode array 6080 disposed on and coupled to the FPC board 6090, a protection layer 6082 disposed over the photodiode array 6080, and a lens-pinhole assembly that includes a pinhole 6030 and a micro lens 6030. In some embodiments, the protection layer 6082 may be a bandpass filter or other some other types of optical filter.

In this configuration, the optical fingerprint sensor module 6400 is flipped upside-down as compared to the optical fingerprint sensor module 6300 illustrated in FIG. 30. That is, the FPC board 6090 and the photodiode array 6080 are disposed adjacent the LCD module 6002 (they are shown as directly above the LCD module 6002 because the figure is flipped upside-down).

Additionally, the optical fingerprint sensor module 6400 may include a mirror 6050 disposed above the spacer 6040 and the lens-pinhole assembly. The mirror 6050 extends beyond the front of the pinhole substrate 6032 to form a ledge. The signal light 6010 and 6012 transmitted through the LCD module 6002 may be incident on the ledge portion of the mirror 6050 and be reflected by the mirror 6050. The reflected signal light may in turn be imaged by the lens-pinhole assembly onto the surface of the photodiode array 6080. Because the light paths of the signal light 6010 and 6012 are folded by the mirror 6050, the optical fingerprint sensor module 6400 may be made relatively thin, as compared to the optical fingerprint sensor module 6300 illustrated in FIG. 30.

FIG. 32 illustrates an optical fingerprint sensor module 6500 according to some other embodiments. The optical fingerprint sensor module 6500 is similar to the optical fingerprint sensor module 6400, illustrated in FIG. 31, in that it is also flipped upside-down. Here, instead of using a mirror 6050, the optical fingerprint sensor module 6500 may include a micro prism 6070 disposed in front of the lens-pinhole assembly. The incident signal light 6010 and 6012 may be transmitted through a first surface 6072 of the micro prism 6070 and be reflected at a second surface 6074 of the micro prism 6070. The reflected signal light may then be transmitted through a third surface 6076 of the micro prism 6070, to be received by the lens-pinhole assembly. Because the light paths of the signal light 6010 and 6012 are folded by the micro prism 6070, the optical fingerprint sensor module 6500 may be made relatively thin, similar to the optical fingerprint sensor module 6400 illustrated in FIG. 31.

In some embodiments, the micro prism 6070 may comprise a material selected to have an index of refraction such that the signal light 6010 and 6012 incident on the second surface 6074 of the micro prism 6070 may undergo total internal reflection (TIR). In some other embodiments, the second surface 6074 of the micro prism may be coated with a high reflective material, such as a metal, so that the second surface 6074 may function as a mirror. In some embodiments, the orientation of the first surface 6072 of the micro prism may be configured such that the signal light 6010 and 6012 is incident on the first surface 6072 close to normal incidence. Additionally, the first surface 6072 may be coated with an anti-reflection coating so as to reduce attenuation of the intensity of the signal light 6010 and 6012 by reflection. Similarly, the third surface 6076 may also be coated with an anti-reflection coating to reduce reflection.

Figure 33:
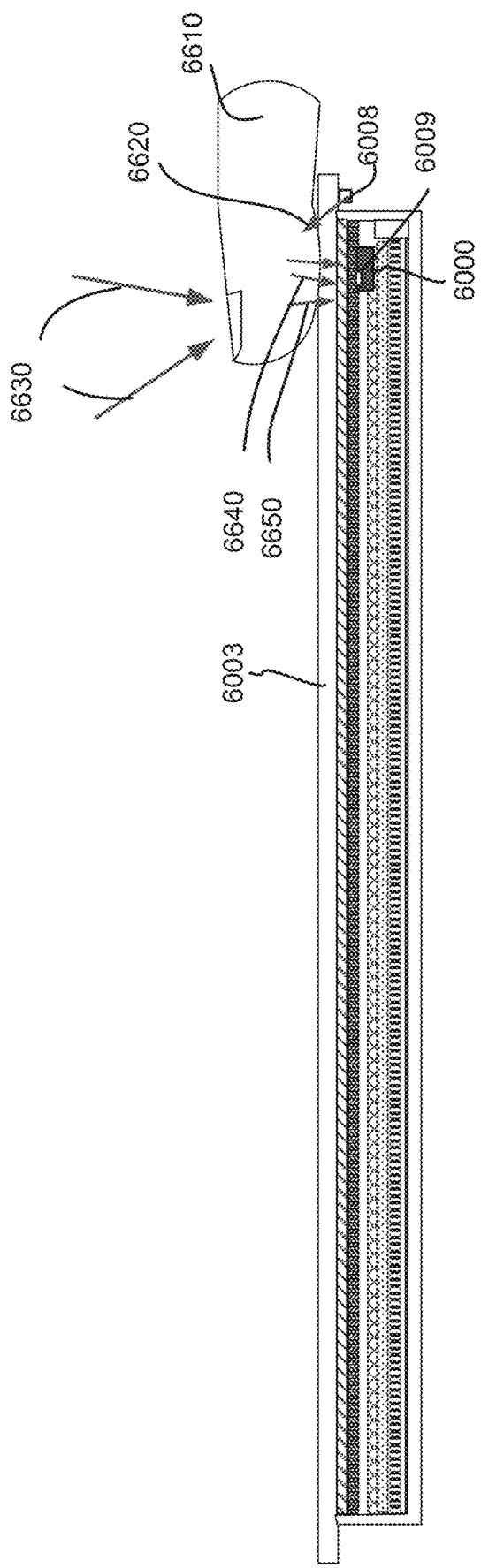
FIG. 33 illustrates different light signals that may be present in a device that implements the under-display screen optical fingerprint sensing design as illustrated in FIGS. 27-32.

FIG. 33 shows different light signals that may be present in a device that implements the invisible under-LCD optical sensing design disclosed in connection with the examples illustrated in FIGS. 27-32. In the illustrated example in FIG. 33, one or more extra light sources 6008 may be placed at one side of the LCD module near the fingerprint sensing area 6005 (as shown in FIG. 27) on the top of the top transparent layer 6003, to produce illumination light for optical sensing. For example, an illumination light beam 6620 may pass through the top transparent layer 6003 to illuminate a touching finger 6610 at the fingerprint sensing area 6005 (as illustrated in FIG. 27). A portion of the light from the illumination light beam 6620 may enter the finger 6610 and be scattered by the finger tissues. A portion of the scattered light (e.g., 6640) may be transmitted through the finger 6610 and incident on the top transparent layer 6003 in the fingerprint sensing area 6005, and may be transmitted through the top transparent layer 6003 to be collected by the optical fingerprint sensor module 6000. As described above, the portion of the scattered light 6640 that comes out of the finger to be transmitted through the top transparent layer 6003 may carry the fingerprint information, and thus may be detected to extract the user fingerprint information.

FIG. 33 further shows one or more illumination light sources 6009 that are located adjacent to the optical fingerprint sensor module 6000 and are under the LCD module. The light from such an illumination light source 6009 may be directed to the top transparent layer 6003 by passing through the LCD module. Referring back to FIGS. 5A-5C, the light from the illumination light source 6009 at the fingerprint sensing area 6005 may encounter the finger ridges 61 (e.g., light rays 80, 201) and valleys 63 (e.g., light rays 82, 211 and 212) to cause reflections 181, 205 and 206 from the ridges 61 and reflections 185, 213 and 214 from the valleys 63 from the top surface of the top transparent layer 6003 in contact with the finger 6610. The reflection rays from the different locations have different signal amplitudes and thus are imprinted with the fingerprint pattern as a 2-D fingerprint pattern. In addition, part of each of incident light rays from below the top transparent layer 6003 may enter the finger, e.g., light rays 183 from the light rays 80, light rays 189 from the light rays 82, light rays 203 from light rays 201 and light rays 204 from light rays 202, and may be scattered by internal finger tissues to produce scattered light 191 towards the top transparent layer 6003 which may be received by the optical fingerprint sensor module 6000. Similar to the portion 6640 of the scattered light that comes out of the finger 6610 to be transmitted through the top transparent layer 6003 in FIG. 33, the scattered light 191 caused by the scattering in FIGS. 5A and 5B due to illumination light from the illumination light sources 6009 carries the fingerprint information and thus can be detected to extract the user fingerprint information.

In some applications, the illumination of the one or more extra illumination light sources 6008 may be used without having the illumination of the one or more extra illumination light sources 6009; in other applications, the illumination of the one or more extra illumination light sources 6009 may be used without having the illumination of the one or more extra illumination light sources 6008. In yet other implementations, both extra illumination light sources 6008 and 6009 may be used.

FIG. 33 illustrate additional illumination light sources for illuminating a finger 6610. The incident light 6630 may be present in the environment such as natural sky light, sunlight or other light sources in the environment to illuminate the touching finger 6610. The incident light 6630 may be scattered by the internal tissue within the finger 6610 to result in scattered light as signal light 6650. The signal light 6650 may exit the finger 6610 to carry both the fingerprint pattern information and the additional topographical information from the internal tissue structures below the finger skin. The additional topographical information from the internal tissue structures below the finger skin may be valuable information for fingerprint sensing, and is three-dimensional since the internal tissue structures vary with both the lateral position under the skin and the depth from the skin surface (topographical information). Such additional topographical information from the internal tissue structures of a finger can be used, for example, to improve the imaging reliability under varying finger surface or finger-glass conditions, and to distinguish a natural finger from an artificial object made with similar or identical external fingerprint pattern as the natural finger.

While this disclosure contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

A recitation of "a", "an" or "the" is intended to mean "one or more" unless specifically indicated to the contrary.

Ranges may be expressed herein as from "about" one specified value, and/or to "about" another specified value. The term "about" is used herein to mean approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. When such a range is expressed, another embodiment includes from the one specific value and/or to the other specified value. Similarly, when values are expressed as approximations, by use of the antecedent "about," it will be understood that the specified value forms another embodiment. It will be further understood that the endpoints of each of the ranges are included with the range.

All patents, patent applications, publications, and descriptions mentioned here are incorporated by reference in their entirety for all purposes. None is admitted to be prior art.

What is claimed is:

1. An optical fingerprint sensor module comprising:
    a light source configured to provide illumination light directed toward a finger, a portion of the illumination light being scattered or reflected off of the finger, thereby generating signal light;
    a photodiode array having a surface;
    a member defining a pinhole configured to receive and transmit the signal light;
    a lens positioned adjacent the pinhole and configured to focus the signal light transmitted through the pinhole onto the surface of the photodiode array, wherein an optical axis of the lens forms an angle with respect to a normal of the surface of the photodiode array that is between 45 degrees and 135 degrees, and wherein the photodiode array is configured to convert the signal light incident thereon into electrical signals; and
    electronic circuitries electrically coupled to the photodiode array and configured to process the electrical signals to produce an image of a fingerprint pattern of the finger.

2. The optical fingerprint sensor module of claim 1, wherein the light source comprises a laser diode or a vertical-cavity surface-emitting laser (VCSEL).

3. The optical fingerprint sensor module of claim 1, wherein the angle between the optical axis of the lens and the normal of the surface of the photodiode array is between 80 degrees and 95 degrees.

4. The optical fingerprint sensor module of claim 3, wherein the angle between the optical axis of the lens and the normal of the surface of the photodiode array is about 90 degrees.

5. The optical fingerprint sensor module of claim 1, wherein the optical fingerprint sensor module further comprises an optically transparent spacer disposed above the surface of the photodiode array.

6. The optical fingerprint sensor module of claim 5, wherein the optically transparent spacer comprises an air gap.

7. The optical fingerprint sensor module of claim 5, wherein the optical fingerprint sensor module further comprises a protection layer disposed over the photodiode array and under the optically transparent spacer.

8. The optical fingerprint sensor module of claim 7, wherein the protection layer comprises a bandpass filter.

9. The optical fingerprint sensor module of claim 7, wherein the optically transparent spacer and the protection layer are configured to have a first index of refraction and a second index of refraction, respectively, so as to reduce image distortion at the surface of the photodiode array.

10. The optical fingerprint sensor module of claim 1, wherein the pinhole is aligned with the optical axis of the lens.

11. The optical fingerprint sensor module of claim 1, wherein the member defining the pinhole comprises a pinhole substrate or an aperture plate, and the pinhole is formed on the pinhole substrate or the aperture plate.

12. An optical fingerprint sensor module comprising:
a light source configured to provide illumination light directed toward a finger, a portion of the illumination light being scattered or reflected off of the finger, thereby generating signal light;
a photodiode array having a surface;
a member defining a pinhole;
a mirror disposed in front of the pinhole and configured to receive and reflect the signal light toward the pinhole;
a lens positioned adjacent the pinhole and configured to focus the signal light that passes through the pinhole onto the surface of the photodiode array, wherein an optical axis of the lens forms an angle with respect to a normal of the surface of the photodiode array that is between 45 degrees and 135 degrees, and wherein the photodiode array is configured to convert the signal light incident thereon into electrical signals; and
electronic circuitries electrically coupled to the photodiode array and configured to process the electrical signals to produce an image of a fingerprint pattern of the finger.

13. The optical fingerprint sensor module of claim 12, wherein the light source comprises a laser diode or a vertical-cavity surface-emitting laser (VCSEL).

14. The optical fingerprint sensor module of claim 12, wherein the angle between the optical axis of the lens and the normal of the surface of the photodiode array is about 90 degrees.

15. The optical fingerprint sensor module of claim 12, wherein the optical fingerprint sensor module further comprises an optically transparent spacer disposed above the surface of the photodiode array.

16. The optical fingerprint sensor module of claim 15, wherein the optically transparent spacer comprises an air gap.

17. The optical fingerprint sensor module of claim 15, wherein the optical fingerprint sensor module further comprises a protection layer disposed over the photodiode array and under the optically transparent spacer.

18. The optical fingerprint sensor module of claim 17, wherein the optically transparent spacer and the protection layer are configured to have a first index of refraction and a second index of refraction, respectively, so as to reduce image distortion at the surface of the photodiode array.

19. The optical fingerprint sensor module of claim 12, wherein the pinhole is aligned with the optical axis of the lens.

20. The optical fingerprint sensor module of claim 12, wherein the member defining the pinhole comprises a pinhole substrate or an aperture plate, and the pinhole is formed on the pinhole substrate or the aperture plate.

21. An optical fingerprint sensor module to be disposed under an opaque border of a display screen for detecting a fingerprint pattern of a finger placed adjacent a fingerprint sensing area of the display screen, the optical fingerprint sensor module comprising:
a photodiode array having a surface;
a pinhole configured to receive and transmit signal light scattered or reflected off of the finger and transmitted through the display screen;
a lens positioned adjacent the pinhole and configured to focus the signal light transmitted through the pinhole onto the surface of the photodiode array, wherein an optical axis of the lens forms an angle with respect to a normal of the surface of the photodiode array that is between 45 degrees and 135 degrees; and
electronic circuitries electrically coupled to the photodiode array, wherein the photodiode array is configured to convert the signal light incident thereon into electrical signals, and the electronic circuitries are configured to process the electrical signals to produce an image of the fingerprint pattern of the finger.

22. The optical fingerprint sensor module of claim 21, wherein the pinhole is aligned with the optical axis of the lens.

23. The optical fingerprint sensor module of claim 21, wherein the optical fingerprint sensor module further comprises an optically transparent spacer disposed between the surface of the photodiode array and the display screen.

24. The optical fingerprint sensor module of claim 23, wherein the optically transparent spacer comprises an air gap.

25. The optical fingerprint sensor module of claim 21, further comprising a mirror disposed in front of the pinhole and configured to receive and reflect the signal light toward the pinhole.

26. The optical fingerprint sensor module of claim 25, wherein the mirror comprises a reflector with a reflecting surface for reflecting the signal light transmitted through the display screen.

27. The optical fingerprint sensor module of claim 25, wherein the mirror comprises a micro prism having a first surface, a second surface, and a third surface, wherein the first surface is configured to receive and transmit the signal light transmitted through the display screen, the second surface is configured to reflect the signal light transmitted through the first surface, and the third surface is configured to transmit and refract the signal light reflected by the second surface toward the pinhole.

28. The optical fingerprint sensor module of claim 21, further comprising a laser diode or a vertical-cavity surface-emitting laser (VCSEL) for illuminating the finger and generating the signal light.

29. An electronic device comprising:
a display screen including a fingerprint sensing area and an opaque border;
a light source configured to provide illumination light directed toward a finger placed adjacent the fingerprint sensing area, a portion of the illumination light being scattered or reflected by the finger, thereby generating signal light to be transmitted through the display screen; and an optical fingerprint sensor module positioned below the display screen under the opaque border, the optical fingerprint sensor module comprising:

a photodiode array having a surface;

a pinhole configured to receive and transmit the signal light;

a lens positioned adjacent the pinhole and configured to focus the signal light transmitted through the pinhole onto the surface of the photodiode array, wherein an optical axis of the lens forms an angle with respect to a normal of the surface of the photodiode array that is between 45 degrees and 135 degrees; and electronic circuitries electrically coupled to the photodiode array, wherein the photodiode array is configured to convert the signal light incident thereon into electrical signals, and the electronic circuitries are configured to process the electrical signals to produce an image of a fingerprint pattern of the finger.

30. The electronic device of claim 29, wherein the pinhole is aligned with the optical axis of the lens.

31. The electronic device of claim 29, wherein the light source comprises a laser diode or a vertical-cavity surface-emitting laser (VCSEL).

* * * * *